(12) United States Patent
Kim et al.

(10) Patent No.: US 10,943,782 B2
(45) Date of Patent: Mar. 9, 2021

(54) SEMICONDUCTOR DEVICE AND METHOD OF MANUFACTURING THE SAME

(71) Applicant: Samsung Electronics Co., Ltd., Suwon-si (KR)

(72) Inventors: Hui-jung Kim, Seongnam-si (KR); Kiseok Lee, Hwaseong-si (KR); Keunnam Kim, Yongin-si (KR); Yoosang Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/460,468

(22) Filed: Jul. 2, 2019

(65) Prior Publication Data

US 2020/0027734 A1 Jan. 23, 2020

(30) Foreign Application Priority Data

Jul. 17, 2018 (KR) .................. 10-2018-0083001

(51) Int. Cl.
| | |
|---|---|
| *H01L 21/02* | (2006.01) |
| *H01L 27/24* | (2006.01) |
| *H01L 27/108* | (2006.01) |
| *H01L 27/22* | (2006.01) |
| *H01L 21/306* | (2006.01) |

(52) U.S. Cl.
CPC .. *H01L 21/02672* (2013.01); *H01L 21/02675* (2013.01); *H01L 21/30604* (2013.01); *H01L 27/10873* (2013.01); *H01L 27/228* (2013.01); *H01L 27/2436* (2013.01)

(58) Field of Classification Search
CPC .................. H01L 27/11551–11556; H01L 21/02675–02686; H01L 27/11578–11582
See application file for complete search history.

(56) References Cited

U.S. PATENT DOCUMENTS

| | | | |
|---|---|---|---|
| 9,070,621 B2 | 6/2015 | Sasago et al. | |
| 9,082,783 B2 | 7/2015 | Yamawaki et al. | |
| 9,099,412 B2 | 8/2015 | Leobandung | |
| 2011/0156132 A1* | 6/2011 | Kiyotoshi | ......... H01L 27/11582 257/326 |
| 2012/0049270 A1* | 3/2012 | Hirler | ................. H01L 29/7395 257/328 |
| 2013/0130480 A1 | 5/2013 | Kim et al. | |

(Continued)

FOREIGN PATENT DOCUMENTS

| | | |
|---|---|---|
| JP | 2001-196311 A | 7/2001 |
| JP | 2012-523129 A | 9/2012 |

(Continued)

*Primary Examiner* — Selim U Ahmed
*Assistant Examiner* — Evan G Clinton
(74) *Attorney, Agent, or Firm* — Harness, Dickey & Pierce, P.L.C.

(57) ABSTRACT

Disclosed are semiconductor devices and methods of manufacturing the same. The method comprises alternately stacking a plurality of dielectric layers and a plurality of first semiconductor layers to form a mold structure on a substrate, forming a hole penetrating the mold structure, forming on the substrate a second semiconductor layer filling the hole, and irradiating a laser onto the second semiconductor layer.

18 Claims, 62 Drawing Sheets

(56) References Cited

U.S. PATENT DOCUMENTS

| | | | |
|---|---|---|---|
| 2014/0061849 A1* | 3/2014 | Tanzawa | H01L 27/11578 |
| | | | 257/499 |
| 2014/0065789 A1 | 3/2014 | Sasago et al. | |
| 2016/0351621 A1 | 12/2016 | Kiyotoshi et al. | |
| 2018/0040718 A1 | 2/2018 | Mizumura | |

FOREIGN PATENT DOCUMENTS

| | | |
|---|---|---|
| JP | 2016-219581 A | 12/2016 |
| KR | 100522835 B1 | 10/2005 |

\* cited by examiner

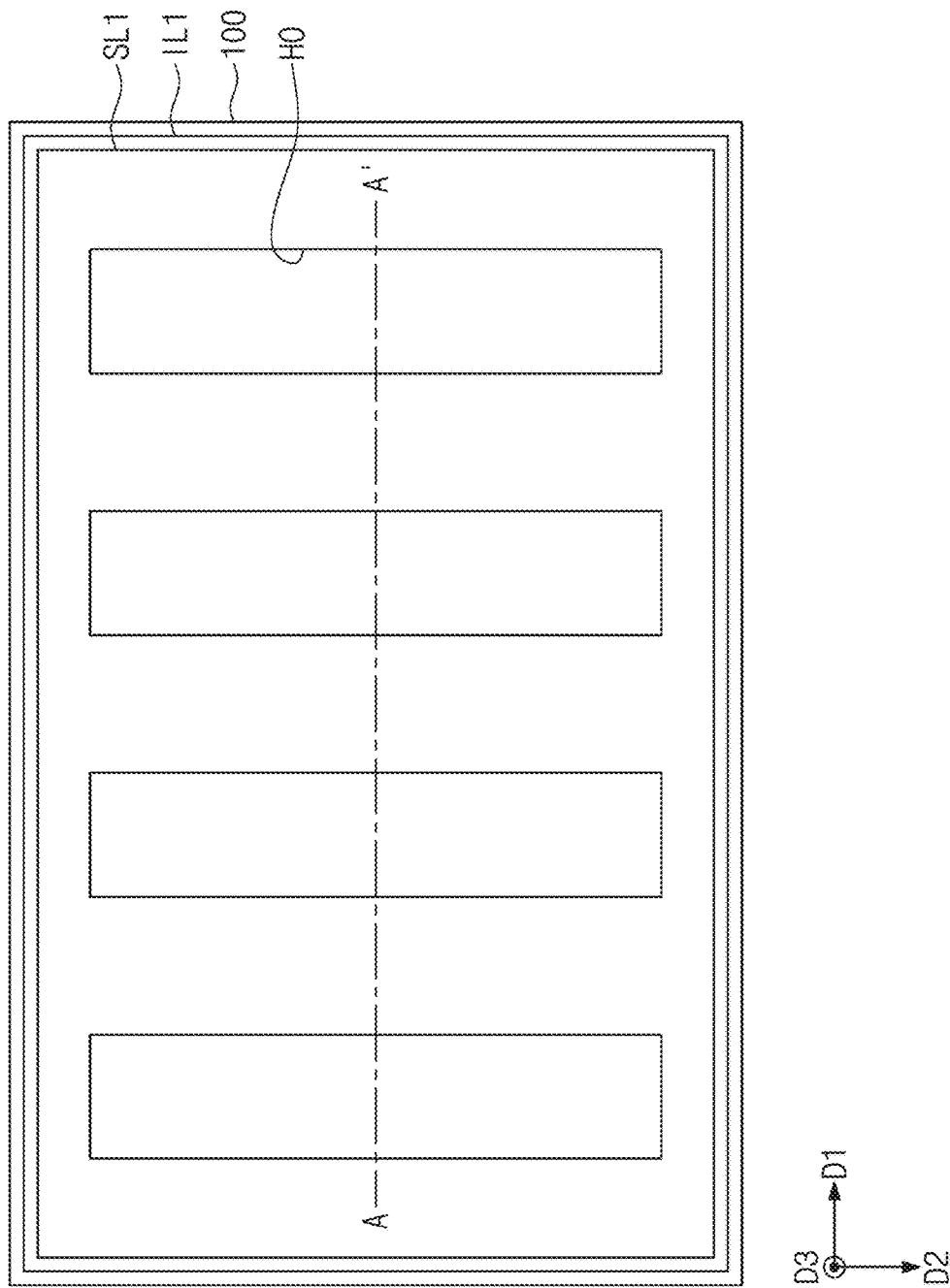

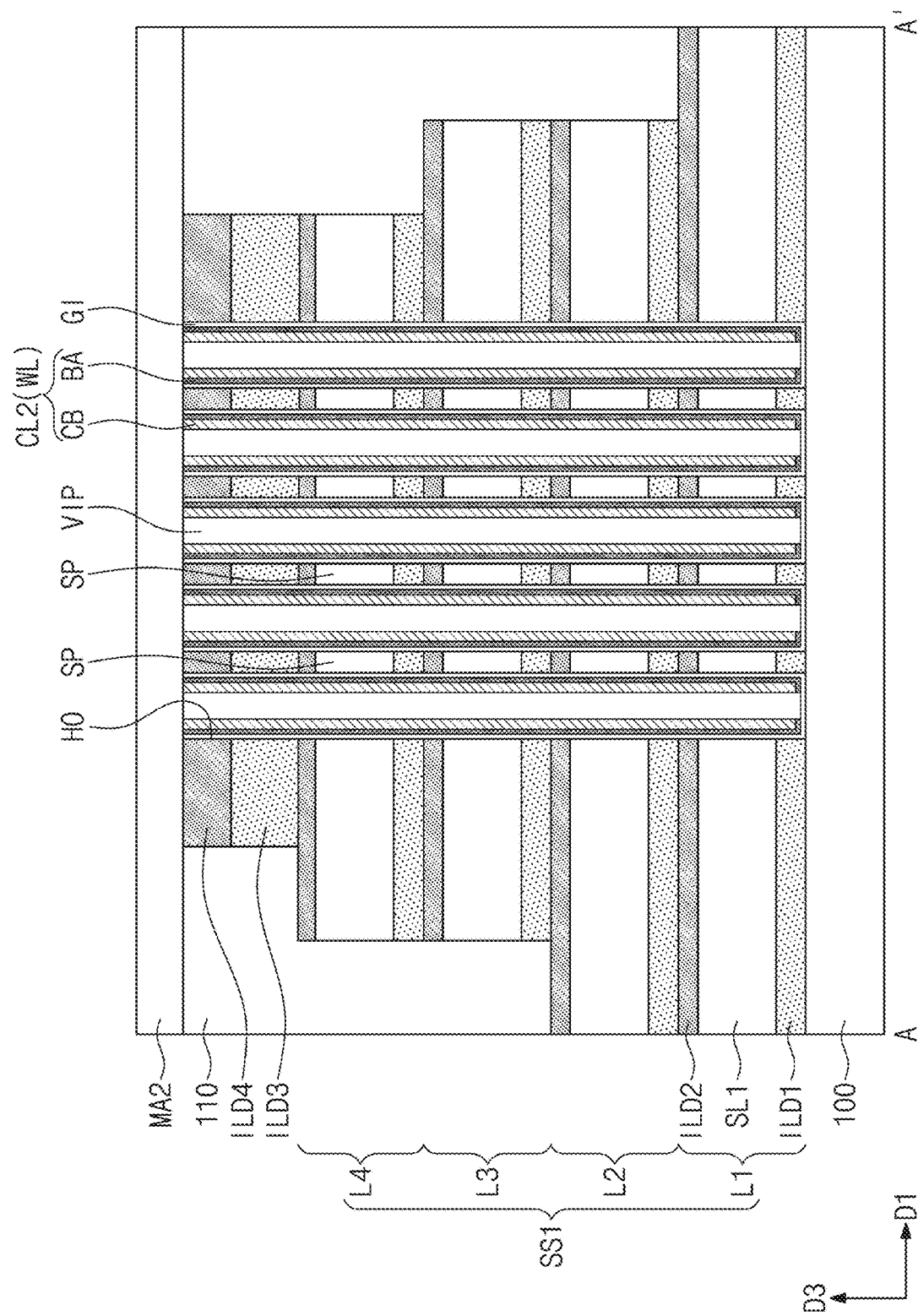

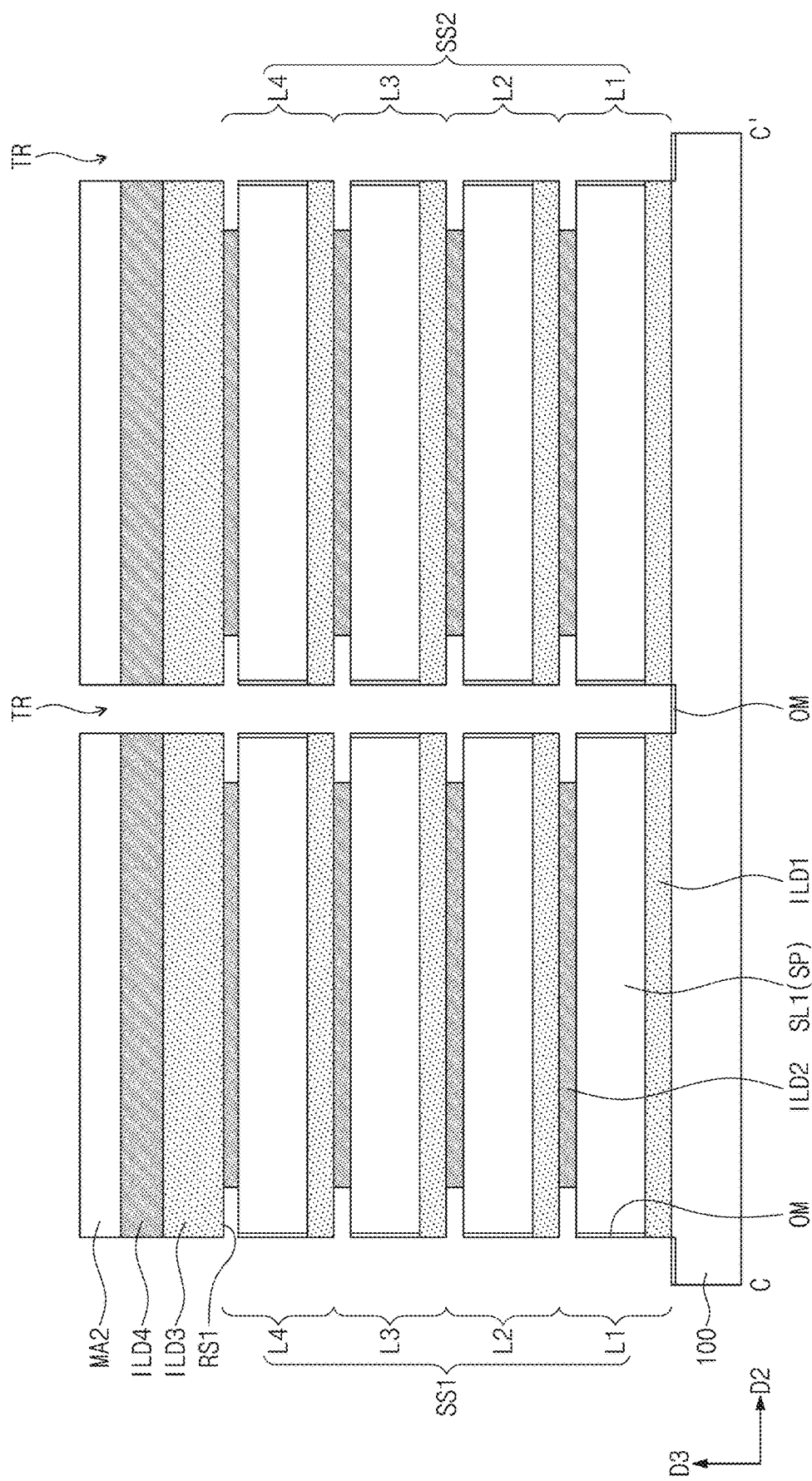

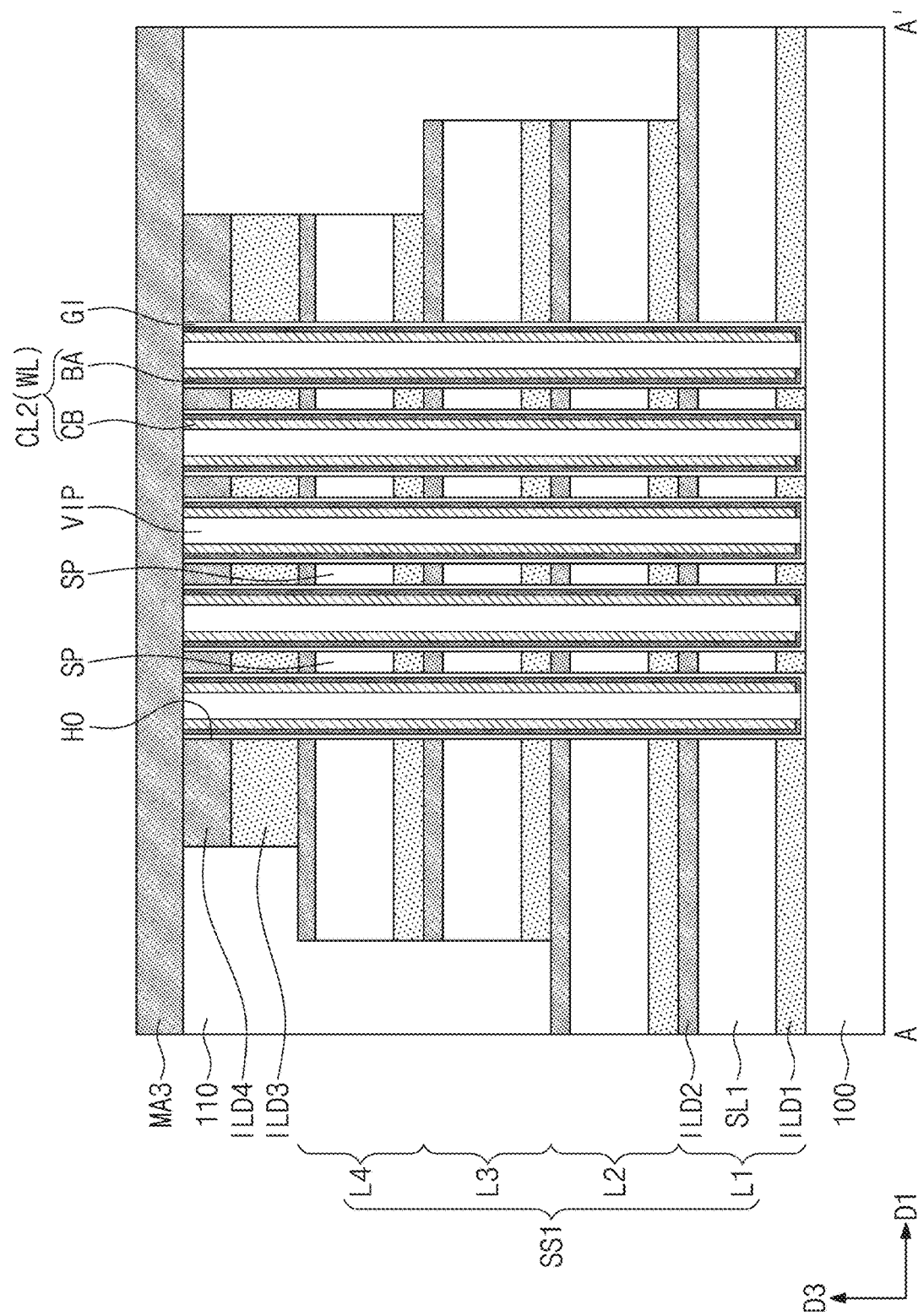

SEMICONDUCTOR DEVICE AND METHOD OF MANUFACTURING THE SAME

CROSS-REFERENCE TO RELATED APPLICATION

This U.S. nonprovisional application claims priority under 35 U.S.C. § 119 to Korean Patent Application No. 10-2018-0083001 filed on Jul. 17, 2018 in the Korean Intellectual Property Office, the entire contents of which are hereby incorporated by reference.

BACKGROUND

The present inventive concepts relate to a semiconductor device and a method of manufacturing the same, and more particularly, to a three-dimensional semiconductor memory device having increased integration and a method of manufacturing the same.

Semiconductor devices have been highly integrated for satisfying higher performance and/or lower manufacture costs of semiconductor devices which are required by customers. Since integration of semiconductor devices is a factor in determining product price, higher integrated semiconductor devices are increasingly in demand. Integration of typical two-dimensional or planar semiconductor devices is primarily determined by the area occupied by a unit memory cell, such that it is influenced by the level of technology for forming fine patterns. However, the expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present inventive concepts provide a three-dimensional semiconductor memory device having increased integration and a method of manufacturing the same.

According to some example embodiments of the present inventive concepts, a method of fabricating a semiconductor device may comprise: alternately stacking a plurality of dielectric layers and a plurality of first semiconductor layers to form a mold structure on a substrate; forming a hole penetrating the mold structure; forming on the substrate a second semiconductor layer filling the hole; and irradiating a laser onto the second semiconductor layer.

According to some example embodiments of the present inventive concepts, a method of fabricating a semiconductor device may comprise: forming on a substrate a mold structure including a dielectric layer and a first semiconductor layer; forming a hole penetrating the mold structure; forming on the substrate a second semiconductor layer filling the hole; and irradiating a laser onto the second semiconductor layer. The step of forming the hole may comprise exposing a top surface of the substrate.

According to some example embodiments of the present inventive concepts, a method of fabricating a semiconductor device may comprise: stacking a plurality of dielectric layers and a plurality of first semiconductor layers to form a mold structure on a substrate; forming a hole penetrating the mold structure, wherein forming the hole may comprise: forming a sidewall of the mold structure, the sidewall being defined by the hole, and forming a semiconductor pattern on each of the first semiconductor layers, the semiconductor pattern extending in a first direction; forming on the substrate a second semiconductor layer filling the hole; irradiating a laser onto the second semiconductor layer; forming a first conductive line on the sidewall of the mold structure; forming on the semiconductor pattern a second conductive line that extends in a second direction intersecting the first direction; and forming a data storage element connected to the semiconductor pattern.

BRIEF DESCRIPTION OF THE DRAWINGS

FIGS. 1A to 4A illustrate plan views showing a method for single crystallization according to some example embodiments of the present inventive concepts.

FIGS. 1B to 4B illustrate cross-sectional views taken along line A-A' of FIGS. 1A to 4A, respectively.

FIGS. 13, 15, 17, 19, 21A, 23A, 25A, 27A, 29A, 31A, and 33A illustrate cross-sectional views taken along line A-A' of FIGS. 12, 14, 16, 18, 20, 22, 24, 26, 28, 30, and 32, respectively.

FIGS. 25C, 27C, 29C, 31C, and 33C illustrate cross-sectional views taken along line C-C' of FIGS. 24, 26, 28, 30, and 32, respectively.

DETAILED DESCRIPTION OF EMBODIMENTS

FIGS. 1A to 4A illustrate plan views showing a method for single crystallization according to some example embodiments of the present inventive concepts. FIGS. 1B to 4B illustrate cross-sectional views taken along line A-A' of FIGS. 1A to 4A, respectively. FIG. 3C illustrates a cross-sectional view taken along line A-A' of FIG. 3A.

Figure 1A:
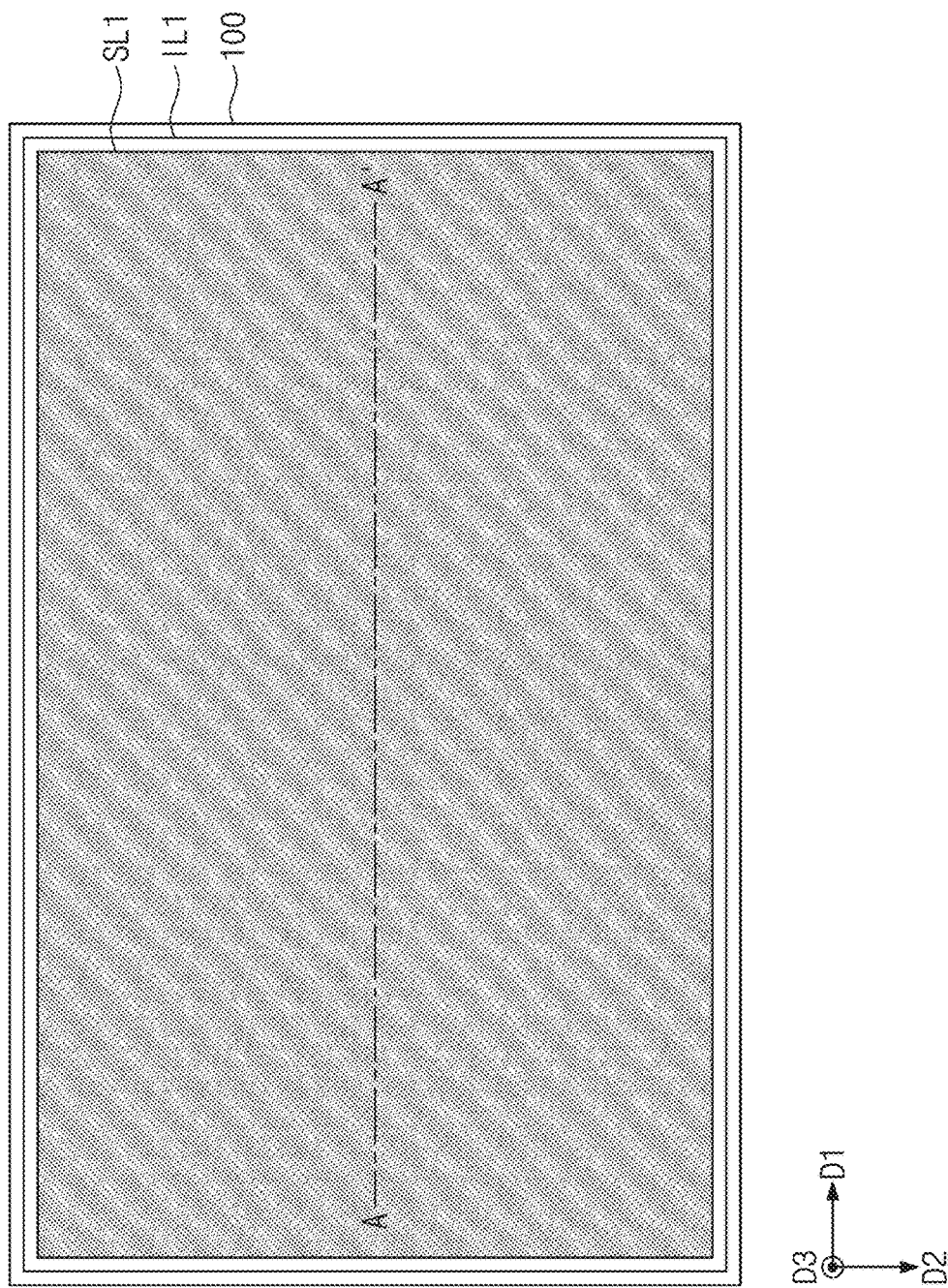
Figure 1B:
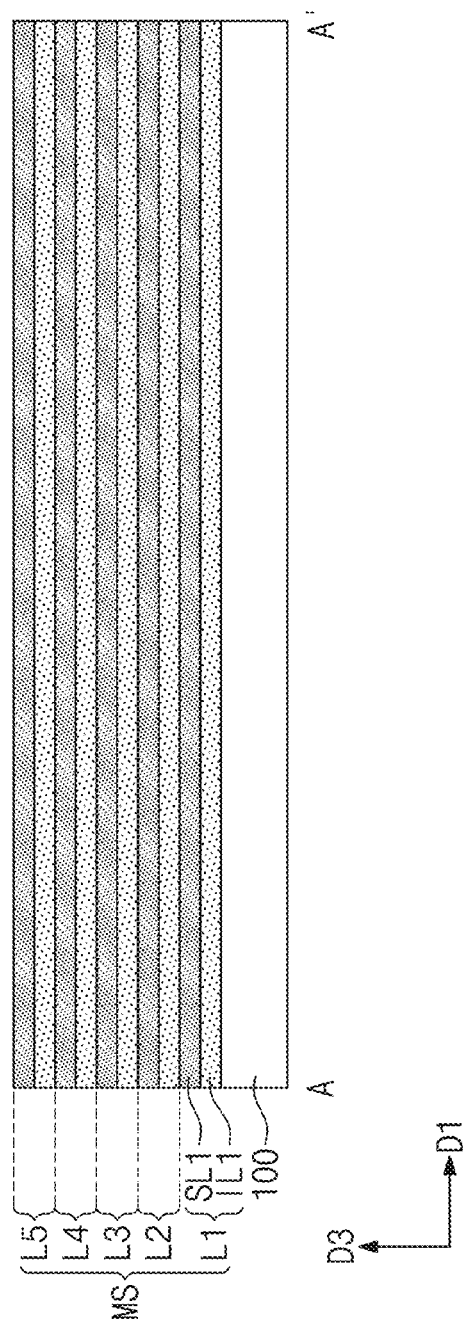

Referring to FIGS. 1A and 1B, a mold structure MS may be formed on a substrate 100. The formation of the mold structure MS may include forming first, second, third, fourth, and fifth layers L1, L2, L3, L4, and L5 that are sequentially stacked. FIG. 1B shows that five layers L1, L2, L3, L4, and L5 are formed, but the number of the layers L1 to L5 may not be limited thereto.

The substrate 100 may include a semiconductor material. The semiconductor material may be a single crystalline semiconductor material. For example, the substrate 100 may include single crystalline silicon, single crystalline germanium, or single crystalline silicon-germanium. Each of the first to fifth layers L1 to L5 may include a first dielectric layer IL1 and a first semiconductor layer SL1. The formation of each of the first to fifth layers L1 to L5 may include forming the first dielectric layer IL1 and forming the first semiconductor layer SL1 on the first dielectric layer IL1. The first dielectric layer IL1 may include one or more of a silicon oxide layer, a silicon nitride layer, a silicon oxynitride layer, a carbon-containing silicon oxide layer, a carbon-containing silicon nitride layer, and a carbon-containing silicon oxynitride layer. The first semiconductor layer SL1 may include a semiconductor material. The semiconductor material may be an amorphous semiconductor material or a polycrystalline semiconductor material. The amorphous semiconductor material may be one of amorphous silicon, amorphous germanium, and amorphous silicon-germanium. The polycrystalline semiconductor material may be one of polycrystalline silicon, polycrystalline germanium, and polycrystalline silicon-germanium. The first semiconductor layer SL1 and the substrate 100 may have the same composition and different crystal structures. For example, when the substrate 100 includes single crystalline silicon, the first semiconductor layer SL1 may include amorphous silicon. For another example, when the substrate 100 includes single crystalline silicon, the first semiconductor layer SL1 may include polycrystalline silicon.

Figure 2A:
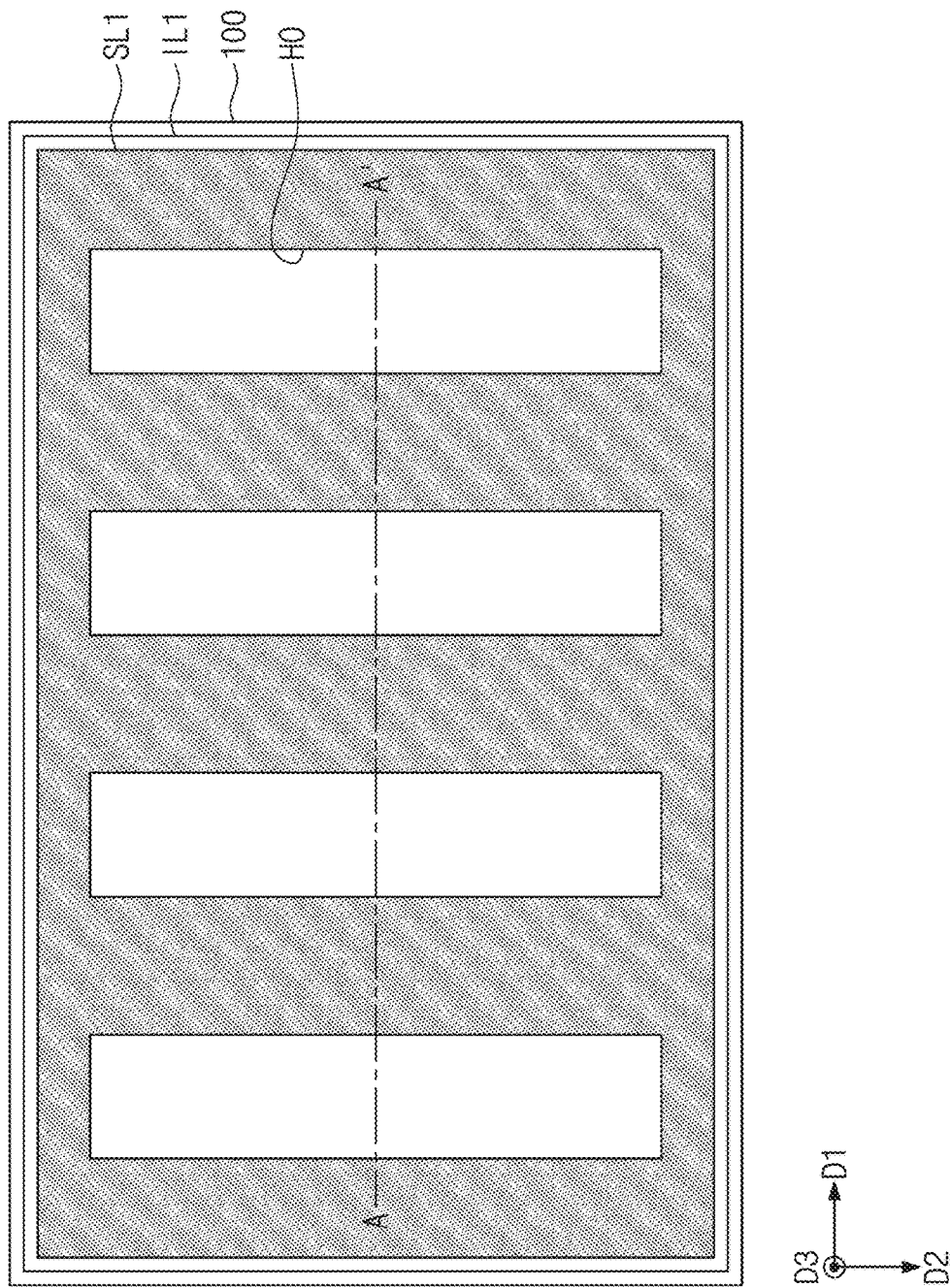
Figure 2B:
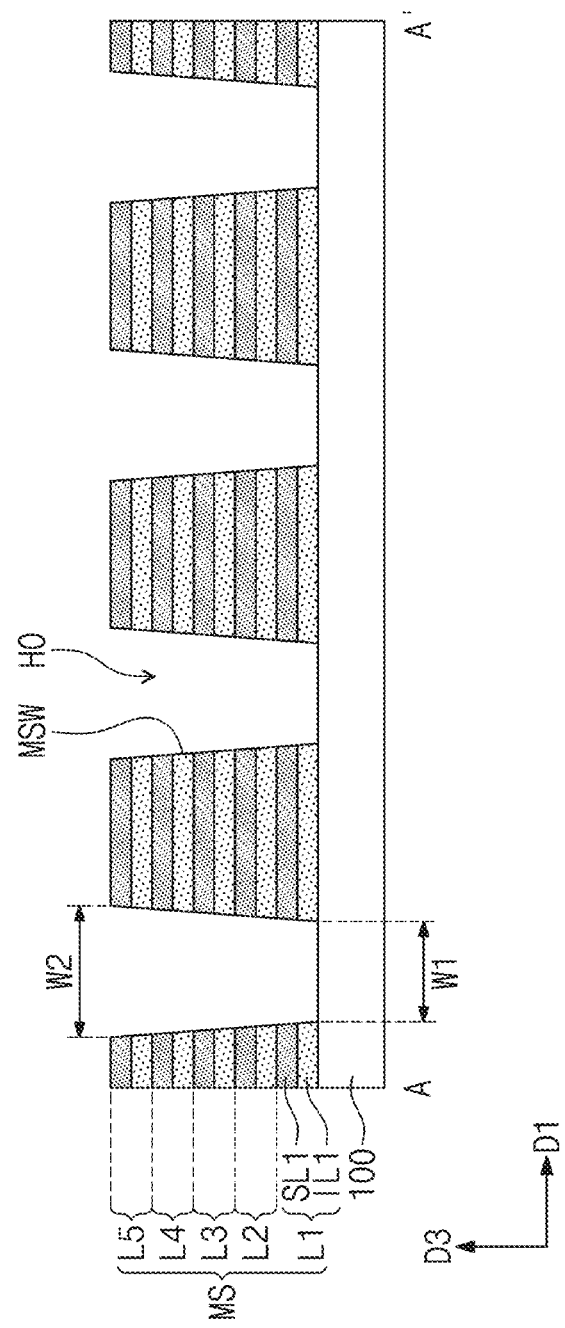

Referring to FIGS. 2A and 2B, the mold structure MS may be patterned to form holes HO that penetrate the first to fifth layers L1 to L5. The holes HO may expose a top surface of the substrate 100. Each of the holes HO may have a linear or bar shape extending in a second direction D2. The holes HO may be arranged spaced apart from each other along a first direction D1. The holes HO may extend in a third direction D3 and penetrate the first to fifth layers L1 to L5. The third direction D3 may be perpendicular to the top surface of the substrate 100. The first and second directions D1 and D2 may be parallel to the top surface of the substrate 100.

The hole HO may have a first width W in the first direction D1 at a level the same as that of the top surface of the substrate 100. The hole HO may have a second width W2 in the first direction D1 at a level the same as that of a top surface of the mold structure MS (e.g., of a top surface of the first semiconductor layer SL1 included in the fifth layer L5). The second width W2 may be greater than the first width W1. In such cases, each of the holes HO may have a width in the first direction D1 that decreases as approaching the substrate 100.

The holes HO may define sidewalls MSW of the mold structure MS. Each of the sidewalls MSW of the mold structure MS may have a slope relative to the top surface of the substrate 100. For example, the sidewalls MSW of the mold structure MS may be at an angle less than 90° with the top surface of the substrate 100.

Figure 3A:
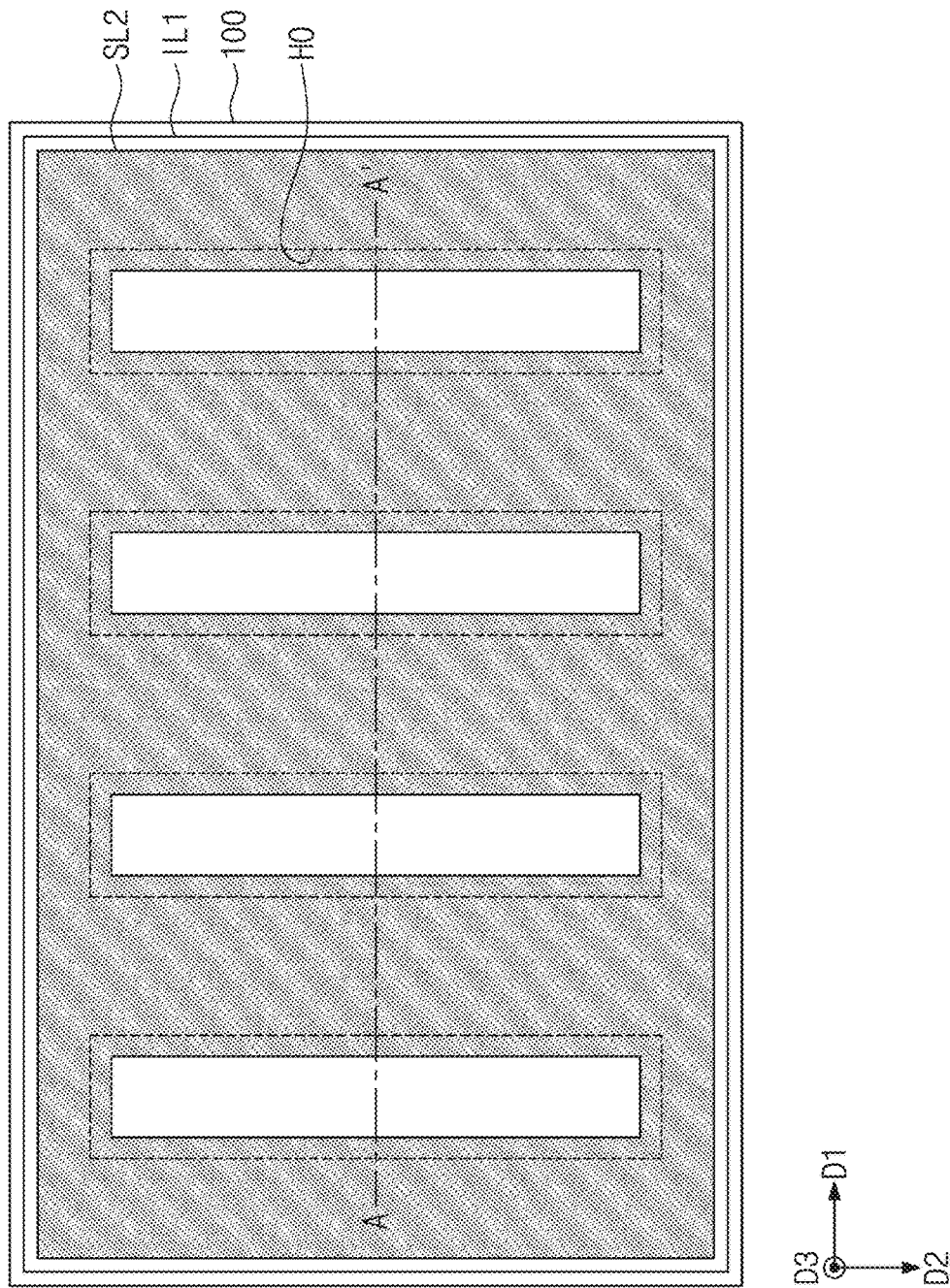
Figure 3B:
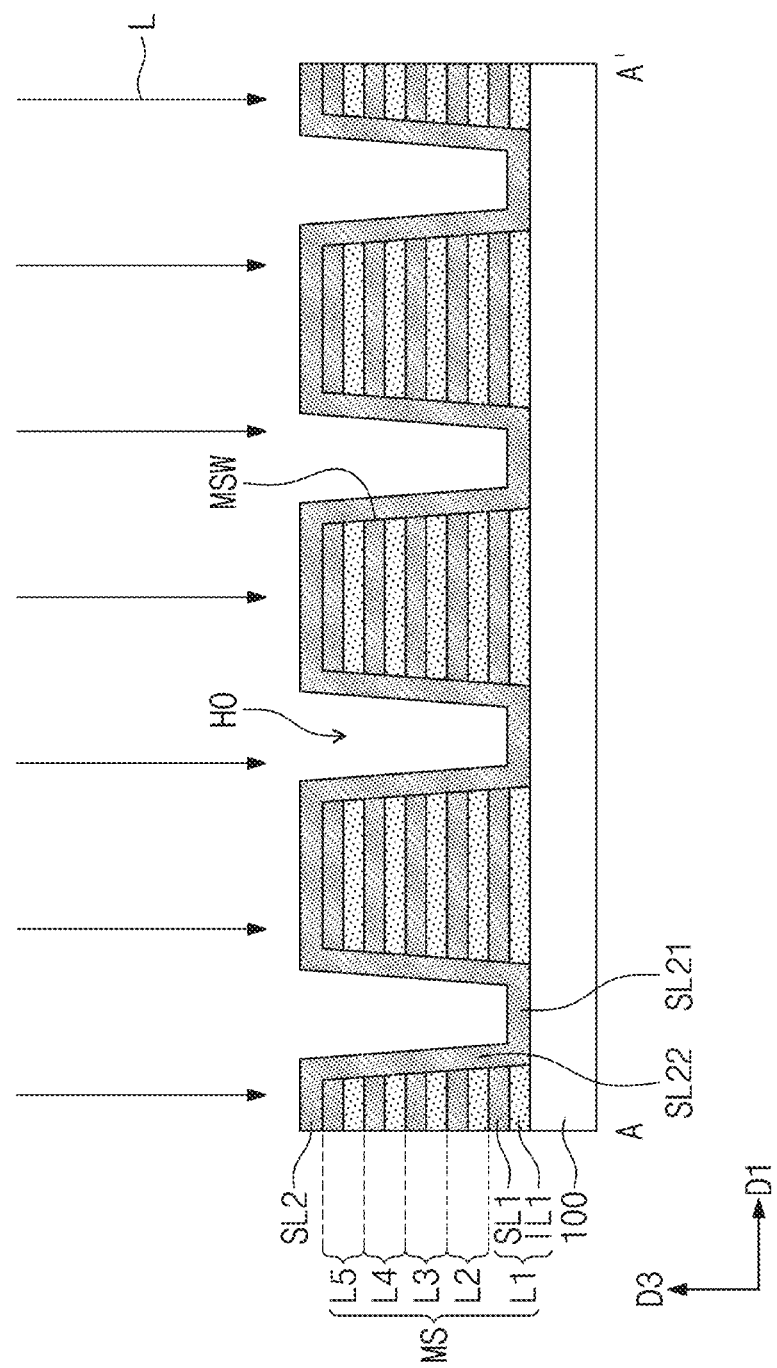

Referring to FIGS. 3A and 3B, a second semiconductor layer SL2 may be conformally formed on an entire surface of the substrate 100. The second semiconductor layer SL2 may partially fill the holes HO. The second semiconductor layer SL2 may cover the top surface of the mold structure MS, the sidewalls MSW of the mold structure MS, and portions of the top surface of the substrate 100 that are exposed to the holes HO. The second semiconductor layer SL2 may cover sidewalls of the first to fifth layers L1 to L5, which sidewalls are defined by the holes HO. The second semiconductor layer SL2 may include a semiconductor material. The semiconductor material may be an amorphous semiconductor material or a polycrystalline semiconductor material. The amorphous semiconductor material may be one of amorphous silicon, amorphous germanium, and amorphous silicon-germanium. The polycrystalline semiconductor material may be one of polycrystalline silicon, polycrystalline germanium, and polycrystalline silicon-germanium. The first and second semiconductor layers SL1 and SL2 may have the same composition and crystal structure. For example, the first and second semiconductor layers SL1 and SL2 may include amorphous silicon. For another example, the first and second semiconductor layers SL1 and SL2 may include polycrystalline silicon. The second semiconductor layer SL2 may include a first segment SL21 on the top surface of the substrate 100 and a second segment SL22 on the sidewalls MSW of the mold structure MS. The second segment SL22 may have a slope relative to the top surface of the substrate 100. For example, the second segment SL22 may extend in a direction intersecting the third direction D3 or extend obliquely relative to the top surface of the substrate 100.

An annealing process may be performed on the first semiconductor layers SL1 and the second semiconductor layer SL2. The annealing of the first semiconductor layers SL1 and the second semiconductor layer SL2 may include irradiating a laser beam L onto the second semiconductor layer SL2. The laser beam L may be an excimer laser with short wavelength, high power, and high efficiency. The laser beam L may be irradiated onto the first and second segments SL21 and SL22 of the second semiconductor layer SL2. The laser beam L may increase temperature of the second semiconductor layer SL2. Because the second segment SL22 has a slope relative to the top surface of the substrate 100, even when the laser beam L is vertically irradiated, the laser beam L may be irradiated onto an overall surface of the second segment SL22. The first segment SL22 may deliver heat to the first semiconductor layers SL1 connected to the second segment SL22, and as a result, the first semiconductor layers SL1 may increase in temperature.

The first semiconductor layers SL1 and the second semiconductor layer SL2 may be single-crystallized due to their temperature increases. The single crystallization of the first semiconductor layers SL1 and the second semiconductor layer SL2 may include that the first segment SL21 of the second semiconductor layer SL2 is single-crystallized along crystallinity of the substrate 100, that the second segment SL22 of the second semiconductor layer SL2 is single-crystallized along crystallinity of the first segment SL21 that has been single-crystallized, and that the first semiconductor layers SL1 are single-crystallized along crystallinity of the second segment SL22 that has been single-crystallized. The single crystallization of the first semiconductor layers SL1 and the second semiconductor layer SL2 may give a single crystalline structure to the substrate 100, the first semiconductor layers SL1, and the second semiconductor layer SL2. For example, when the substrate 100 includes single crystalline silicon, the substrate 100, the first semiconductor layers SL1, and the second semiconductor layer SL2 may be single-crystallized into a single crystalline silicon.

Figure 3C:
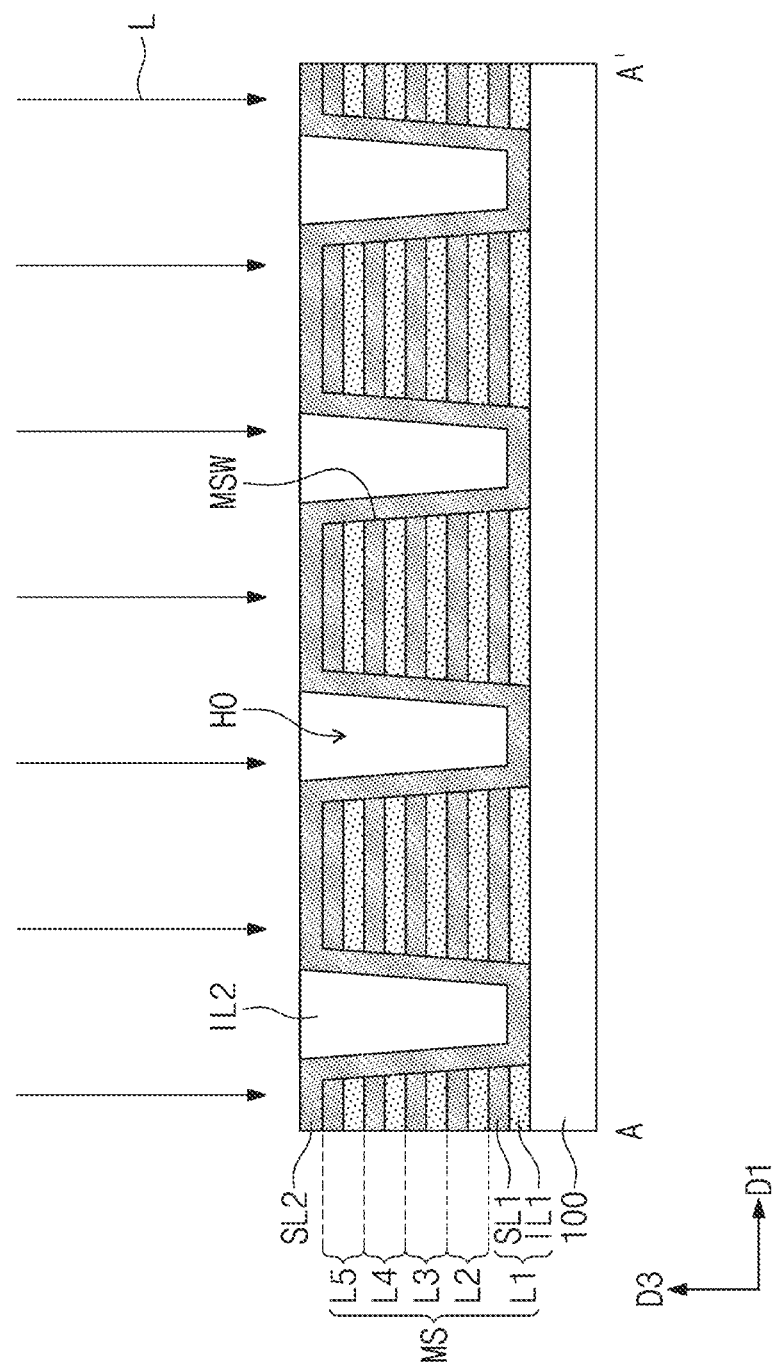
FIG. 3C illustrates a cross-sectional view taken along line A-A' of FIG. 3A.

Referring to FIGS. 3A and 3C, in the embodiment different from that shown in FIG. 3B, after the second semiconductor layer SL2 is conformally formed on the entire surface of the substrate 100, a second dielectric layer IL2 may be formed to completely fill the holes HO. The second dielectric layer IL2 may include a material (e.g., silicon oxide) transparent to the laser beam L.

When the laser beam L is irradiated onto the second semiconductor layer SL2, the second semiconductor layer SL2 may be liquefied due to its temperature increase. When the second semiconductor layer SL2 is liquefied, the second semiconductor layer SL2 may be supported by the second dielectric layer IL2 and thus may maintain its shape.

Figure 4B:
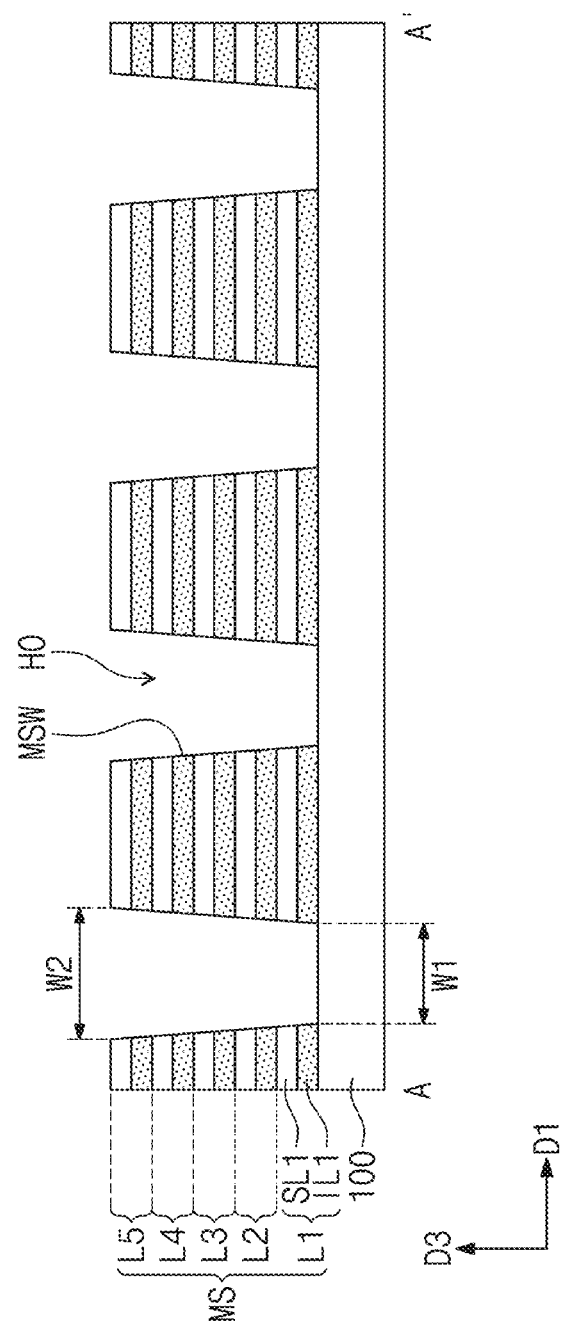

Referring to FIGS. 4A and 4B, a wet etching process may be performed to remove the second semiconductor layer SL2. When the second dielectric layer IL2 is formed as shown in FIG. 3C, the wet etching process may remove the second semiconductor layer SL2 and the second dielectric layer IL2 as well. The removal of the second semiconductor layer SL2 may expose the top surface of the mold structure MS, the sidewalls MSW of the mold structure MS, and the top surface of the substrate 100.

in a method for single crystallization according to some example embodiments of the present inventive concepts, a one-time irradiation of the laser beam L may single-crystallize a plurality of the first semiconductor layers SL1 at the same time.

Figure 5:
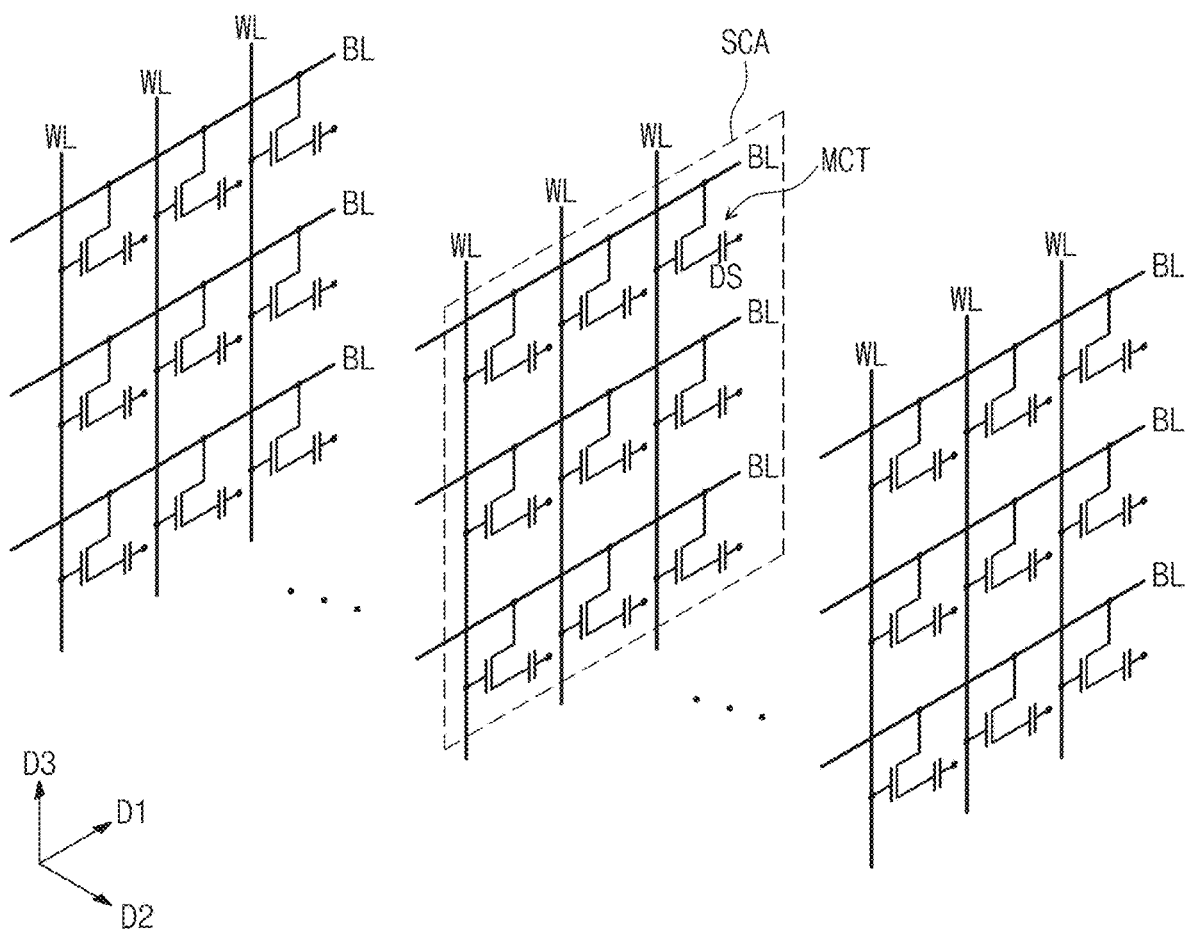
FIG. 5 illustrates a simplified circuit diagram showing a cell array of a three-dimensional semiconductor memory device according to some example embodiments of the present inventive concepts.

FIG. 5 illustrates a simplified circuit diagram showing a cell array of a three-dimensional semiconductor memory device according to some example embodiments of the present inventive concepts.

Referring to FIG. 5, a three-dimensional semiconductor memory device according to some example embodiments of the present inventive concepts may include a cell array that consists of a plurality of sub-cell arrays SCA. The sub-cell arrays SCA may be arranged along a second direction D2.

Each of the sub-cell arrays SCA may include a plurality of bit lines BL, a plurality of word lines WL, and a plurality of memory cell transistors MCT. One memory cell transistor MCT may be disposed between one word line WL and one bit line BL.

The bit lines BL may be conductive patterns (e.g., metal lines) that are spaced apart from and disposed on a substrate. The bit lines BL may extend in a first direction D1. The bit lines BL in one sub-cell array SCA may be spaced apart from each other in a vertical direction (e.g., a third direction D3).

The word lines WL may be conductive patterns (e.g., metal lines) extending in a vertical direction (e.g., the third direction D3) to the substrate. Alternatively, the word lines WL may be conductive patterns that extend at an angle other than perpendicular to a top surface of the substrate. The word lines WL in one sub-cell array SCA may be spaced apart from each other in the first direction D1.

A gate of the memory cell transistor MCT may be connected to the word line WL, and a source of the memory cell transistor MCT may be connected to the bit line BL. Each of the memory cell transistors MCT may include a data storage element DS. For example, the data storage element DS may be a capacitor, and a drain of the memory cell transistor MCT may be connected to the capacitor.

Figure 6:
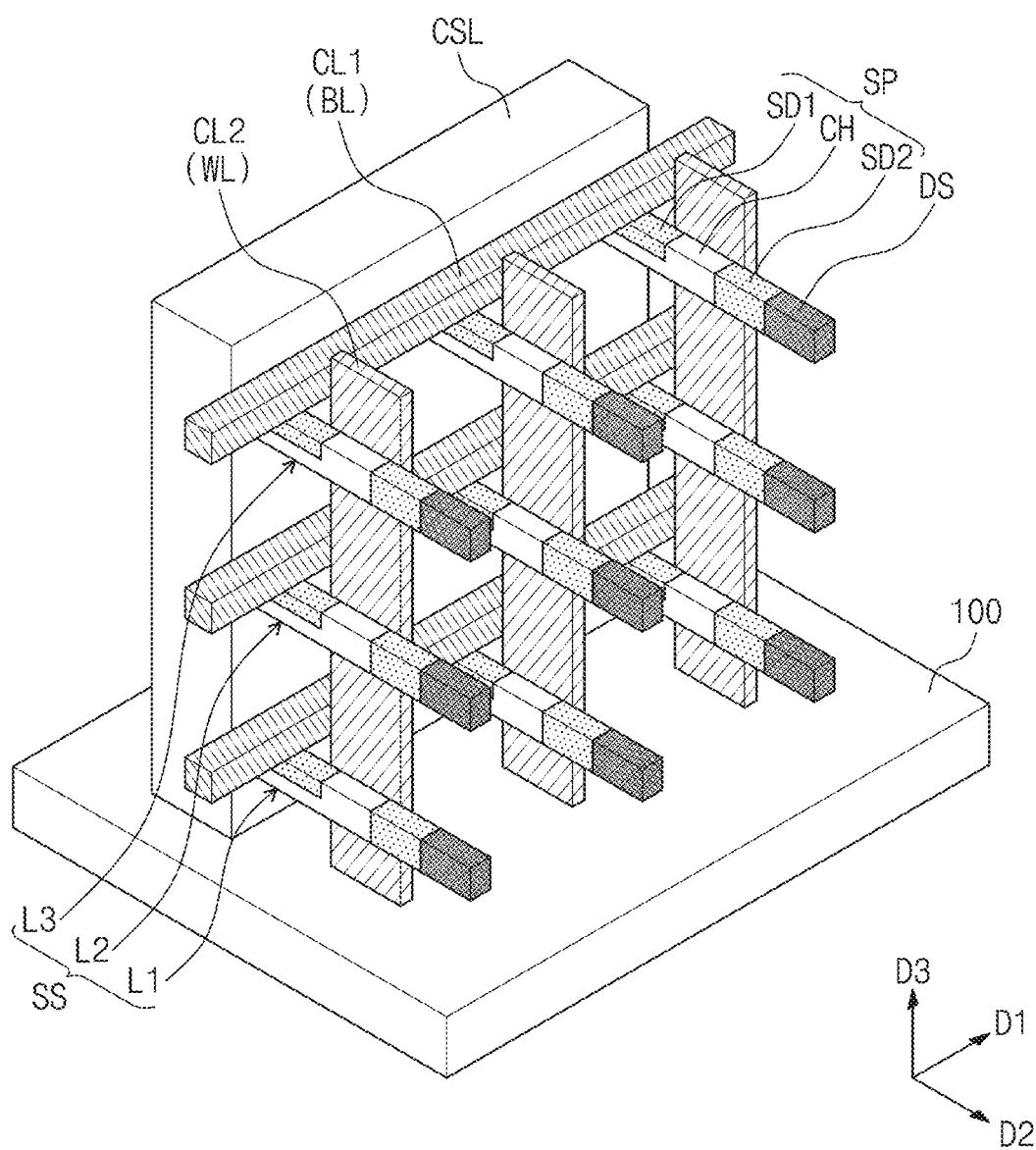
FIG. 6 illustrates a perspective view showing a three-dimensional semiconductor memory device according to some example embodiments of the present inventive concepts.
Figure 7:
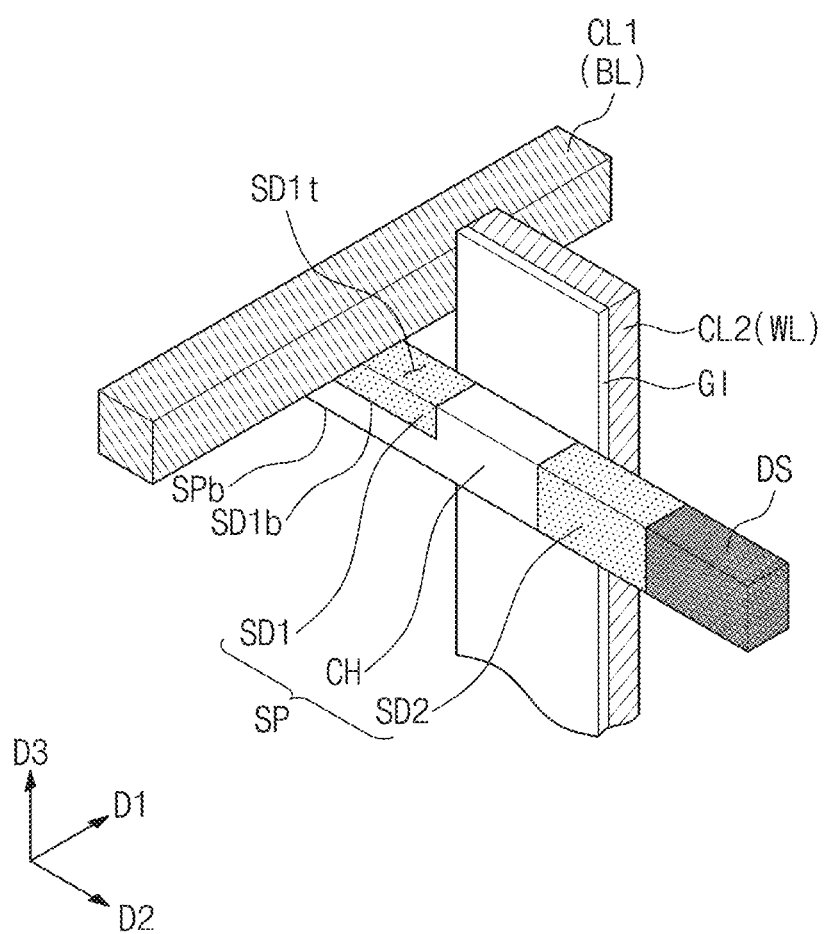
FIG. 7 illustrates an enlarged perspective view showing a unit cell of the three-dimensional semiconductor memory device shown in FIG. 6.

FIG. 6 illustrates a perspective view showing a three-dimensional semiconductor memory device according to some example embodiments of the present inventive concepts. FIG. 7 illustrates an enlarged perspective view showing a unit cell of the three-dimensional semiconductor memory device shown in FIG. 6.

Referring to FIGS. 5, 6, and 7, a substrate 100 may be provided thereon with one of the plurality of sub-cell arrays SCA discussed with reference to FIG. 5. The substrate 100 may be a single crystalline silicon substrate, a single crystalline germanium substrate, or a single crystalline silicon-germanium substrate.

For example, the substrate 100 may be provided thereon with a stack structure SS including first, second, and third layers L1, L2, and L3. The first, second, and third layers L1, L2, and L3 of the stack structure SS may be spaced apart and stacked in a vertical direction (e.g., a third direction D3). Each of the first, second, and third layers L1, L2, and L3 may include a plurality of semiconductor patterns SP, a plurality of data storage elements DS, and a first conductive line CL1.

Each of the semiconductor patterns SP may have a linear, bar, or pillar shape extending in a second direction D2. For example, the semiconductor patterns SP may include single crystalline silicon, single crystalline germanium, or single crystalline silicon-germanium. Each of the semiconductor patterns SP may include a channel region CH, a first impurity region SD1, and a second impurity region SD2. The channel region CH may be interposed between the first and second impurity regions SD1 and SD2. The channel region CH may correspond to a channel of the memory cell transistor MCT discussed with reference to FIG. 5. The first and second impurity regions SD1 and SD2 may correspond to the source and drain of the memory cell transistor MCT discussed with reference to FIG. 5.

The data storage elements DS may be connected to corresponding ends of the semiconductor patterns SP. The data storage elements DS may be connected to corresponding second impurity regions SD2 of the semiconductor patterns SP. The data storage elements DS may be memory elements capable of storing data. Each of the data storage elements DS may be a memory element using one of a capacitor, a magnetic tunnel junction pattern, and a variable resistance member including a phase change material. For example, the data storage element DS may be a capacitor.

Each of the first conductive lines CL1 may have a linear or bar shape extending in a first direction D1. The first conductive lines CL1 may be spaced apart and stacked along the third direction D3. The first conductive lines CL1 may include a conductive material. For example, the conductive material may be one of doped semiconductor (doped silicon, doped germanium, etc.), conductive metal nitride (titanium nitride, tantalum nitride, etc.), metal (tungsten, titanium, tantalum, etc.), and a metal-semiconductor compound (tungsten silicide, cobalt silicide, titanium silicide, etc.). The first conductive lines CL1 may correspond to the bit lines BL discussed with reference to FIG. 5.

Among the first, second, and third layers L1, L2, and L3, the first layer L1 will now be representatively described in detail. The semiconductor patterns SP of the first layer L1 may be arranged spaced apart from each other in the first direction D1. The semiconductor patterns SP of the first layer L1 may be located at the same first level. The first conductive line CL1 of the first layer L1 may be disposed on the semiconductor patterns SP of the first layer L1. The first conductive line CL1 may be disposed on top surfaces of the semiconductor patterns SP. The first conductive line CL1 may be disposed on top surfaces of the first impurity regions SD1 of the semiconductor patterns SP. The first conductive line CL1 may be placed at a second level higher than the first level at which the semiconductor patterns SP are located. For example, the first conductive line CL1 may be directly connected to the first impurity regions SD1. For another example, the first conductive line CL1 may be connected to the first impurity regions SD1 through contacts including metal silicide. The above detailed description of the first layer L1 may also be substantially applicable to the second and third layers L2 and L3.

The substrate 100 may be provided thereon with second conductive lines CL2 penetrating the stack structure SS. Each of the second conductive lines CL2 may have a linear or bar shape extending in the third direction D3. The second conductive lines CL2 may be arranged in the first direction D1. When viewed in plan, each of the second conductive lines CL2 may be provided between a pair of the semiconductor patterns SP adjacent to each other. Each of the second conductive lines CL2 may perpendicularly extend on sidewalls of a plurality of the semiconductor patterns SP vertically stacked. Alternatively, the second conductive lines CL2 may extend at an angle other than perpendicular to a top surface of the substrate 100.

For example, one of the second conductive lines CL2 may be adjacent to a first one of the semiconductor patterns SP of the first layer L1, a first one of the semiconductor patterns SP of the second layer L2, and a first one of the semiconductor patterns SP of the third layer L3. Another of the second conductive lines CL2 may be adjacent to a second one of the semiconductor patterns SP of the first layer L1, a second one of the semiconductor patterns SP of the second layer L2, and a second one of the semiconductor patterns SP of the third layer L3.

The second conductive lines CL2 may include a conductive material, which conductive material may be one of doped semiconductor, conductive metal nitride, metal, and a metal-semiconductor compound. The second conductive lines CL2 may correspond to the word lines WL discussed with reference to FIG. 5.

The substrate 100 may be provided thereon with a common source line CSL that extends in the first direction D1 along one lateral surface of the stack structure SS. The common source line CSL may be coupled to other ends of the semiconductor patterns SP. The common source line CSL may be connected to a body of each of the memory cell transistors MCT discussed with reference to FIG. 5. The common source line CSL may include a conductive material, which conductive material may be one of doped semiconductor, conductive metal nitride, metal, and a metal-semiconductor compound.

Although not shown, a dielectric material may fill empty spaces of the stack structure SS. For example, the dielectric material may include one or more of a silicon oxide layer, a silicon nitride layer, and a silicon oxynitride layer.

One of the memory cell transistors of FIG. 6 will now be discussed below in detail with reference back to FIG. 7. The first and second impurity regions SD1 and SD2 may be impurity-doped portions of the semiconductor pattern SP. The first and second impurity regions SD1 and SD2 may have n-type or p-type conductivity. The first impurity region SD1 may be formed on an upper portion of the semiconductor pattern SP. The first impurity region SD1 may have a bottom surface SD1b higher than a bottom surface SPb of the semiconductor pattern SP. The semiconductor pattern SP may have a lower portion, which lower portion is below the first impurity region SD1, connected to the common source line CSL discussed above with reference to FIG. 6. The first conductive line CL1 may be disposed on a top surface SD1t of the first impurity region SD1, and electrically connected to the first impurity region SD1.

The second conductive line CL2 may be adjacent to the channel region CH of the semiconductor pattern SP. The second conductive line CL2 may be provided on a sidewall of the channel region CH, while extending in the third direction D3. A gate dielectric layer GI may be interposed between the second conductive line CL2 and the channel region CH. The gate dielectric layer GI may include a high-k dielectric layer, a silicon oxide layer, a silicon nitride layer, a silicon oxynitride layer, or a combination thereof. For example, the high-k dielectric layer may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Figure 8:
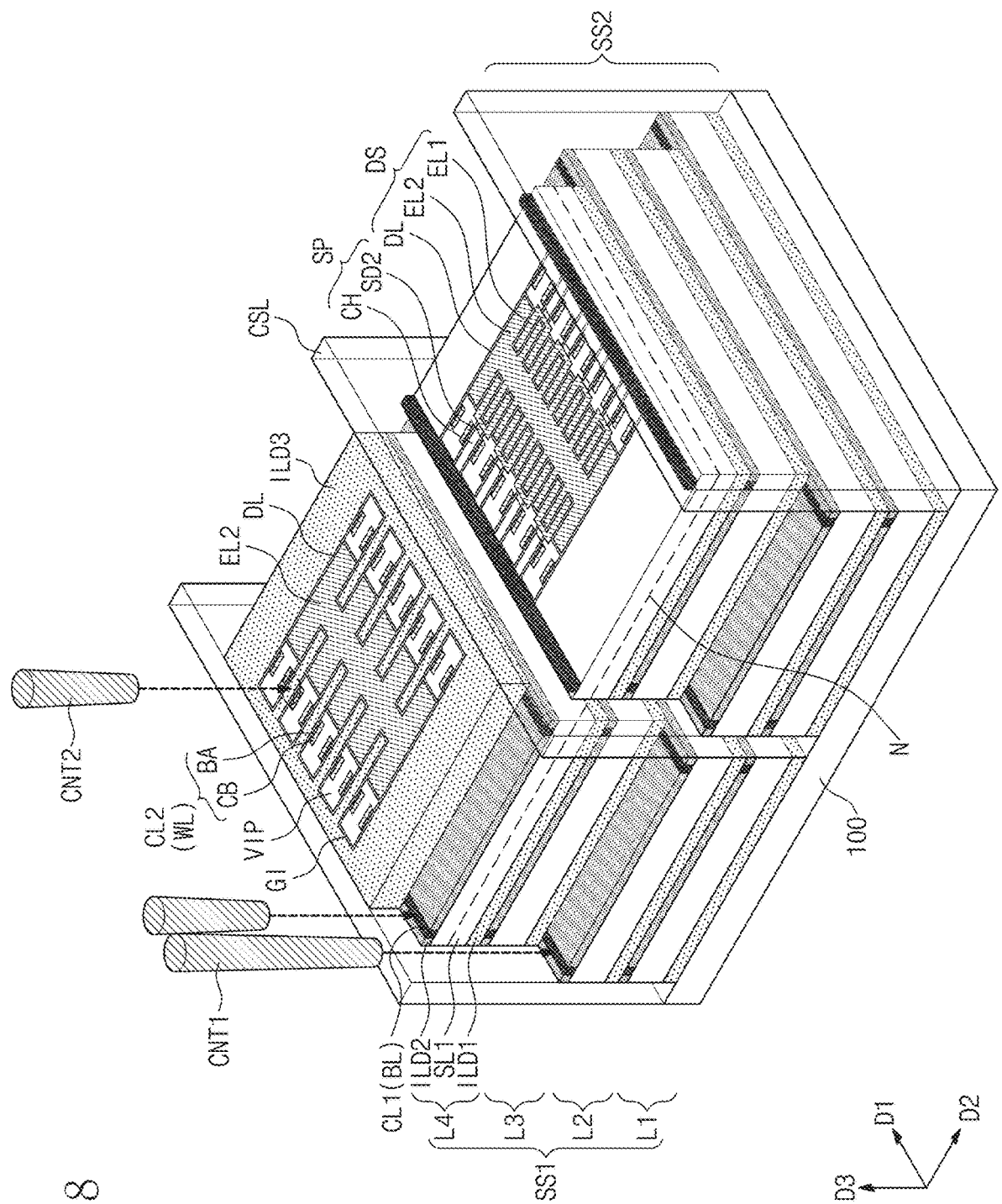
FIG. 8 illustrates a perspective view showing a three-dimensional semiconductor memory device according to some example embodiments of the present inventive concepts.
Figure 9:
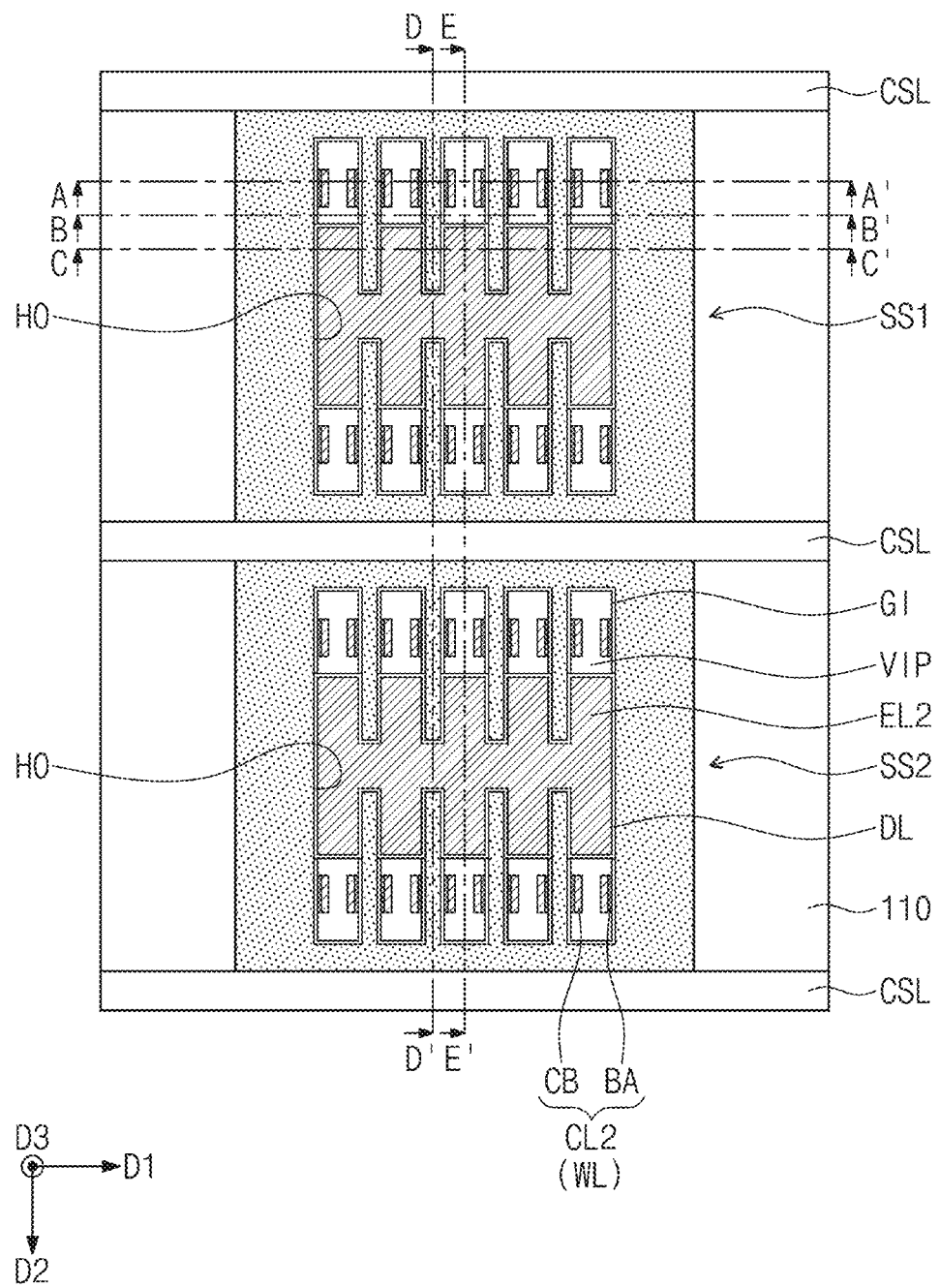
FIG. 9 illustrates a plan view showing the three-dimensional semiconductor memory device shown in FIG. 8.
Figure 10A:
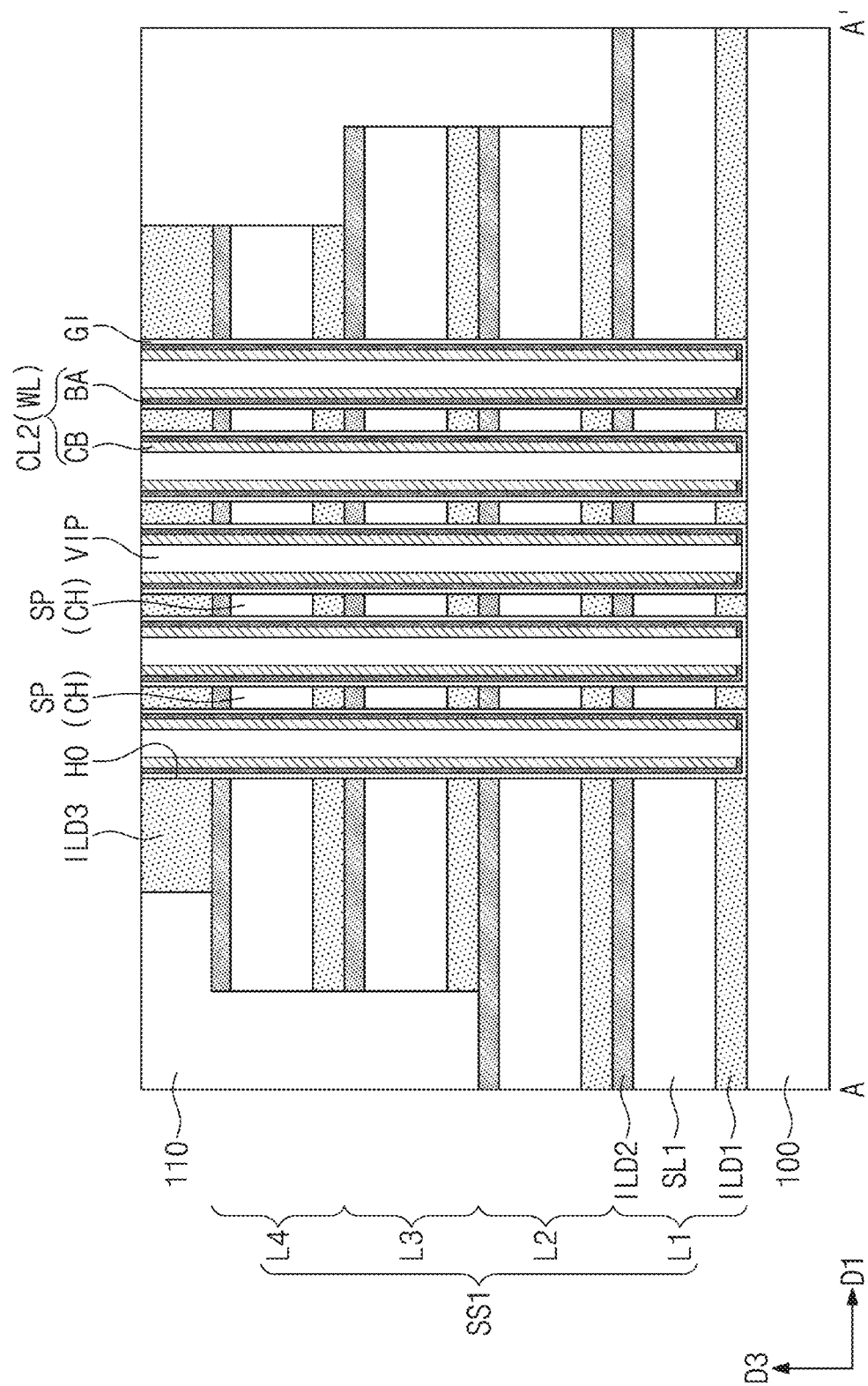
FIGS. 10A, 10B, 10C, 10D, and 10E illustrate cross-sectional views respectively taken along lines A-A', B-B', C-C', D-D', and E-E' of FIG. 9.
Figure 10B:
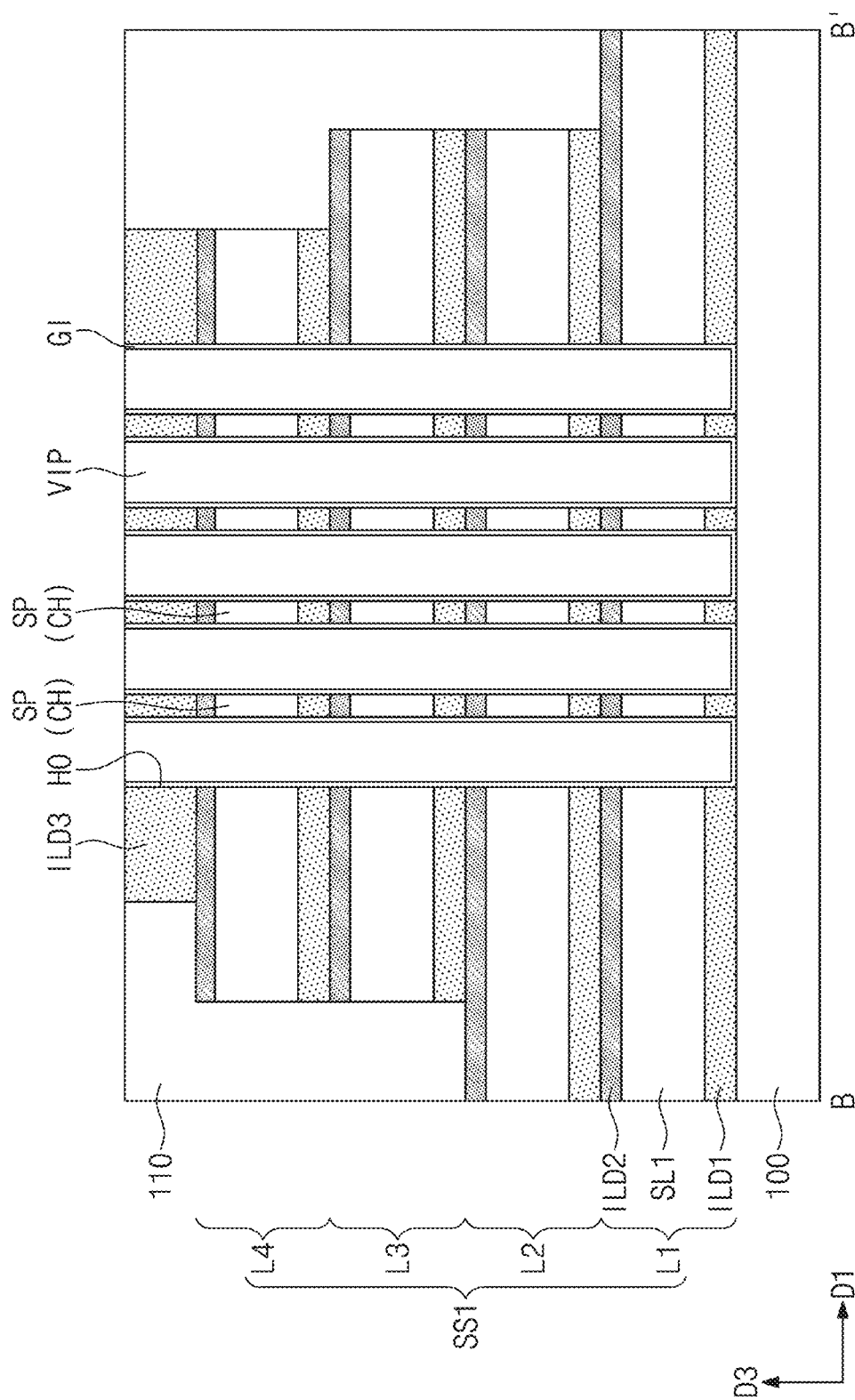
Figure 10C:
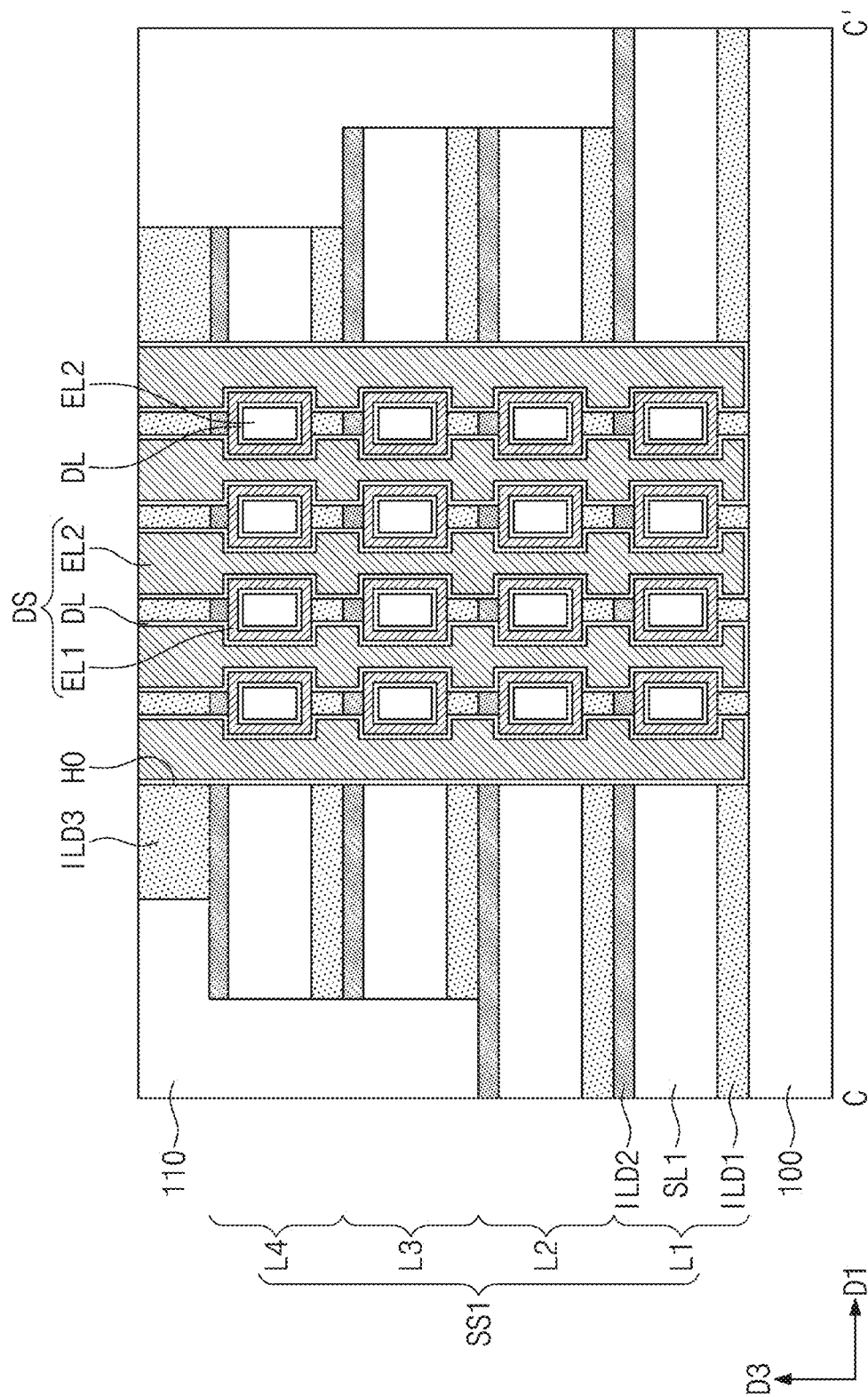
Figure 10D:
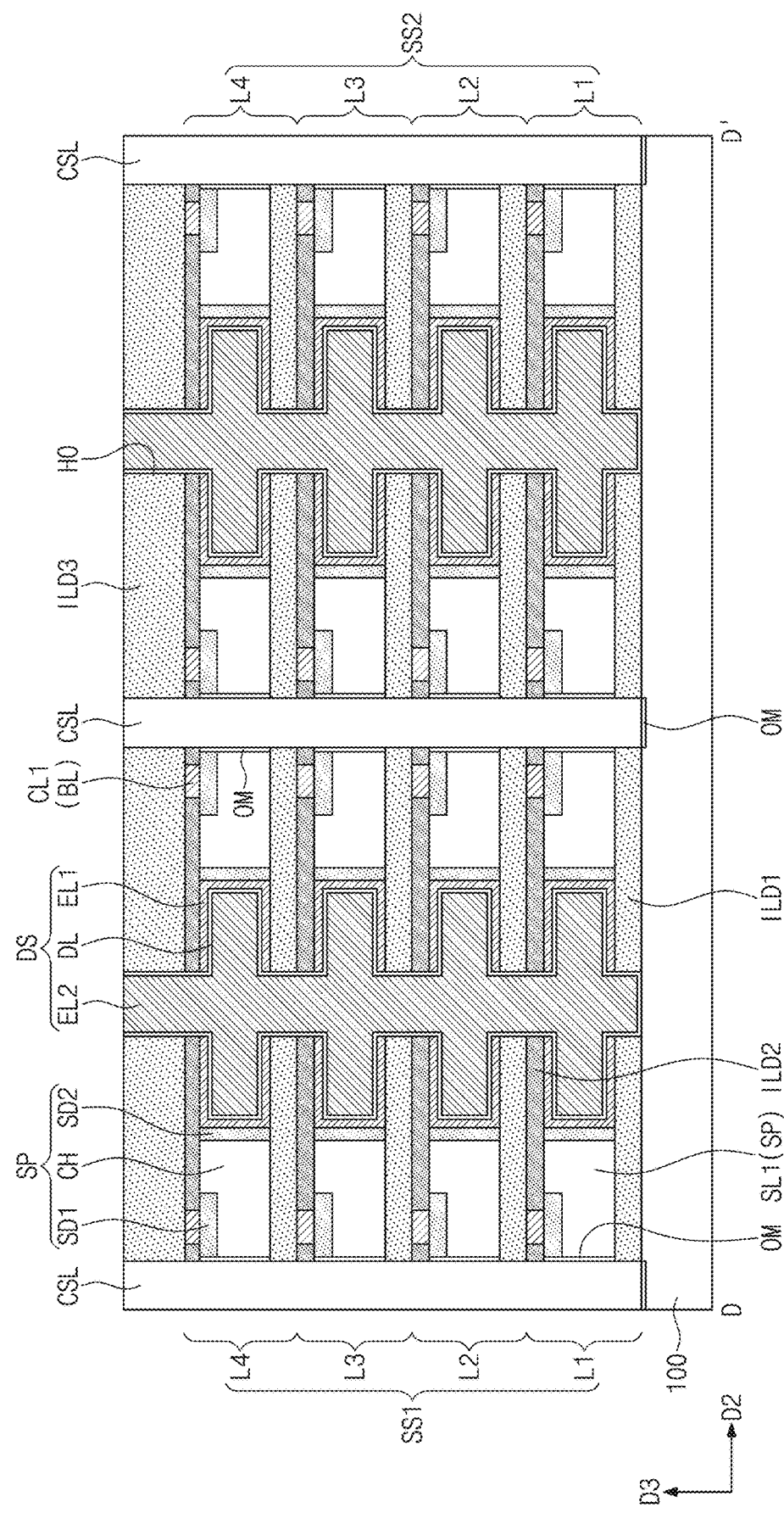
Figure 10E:
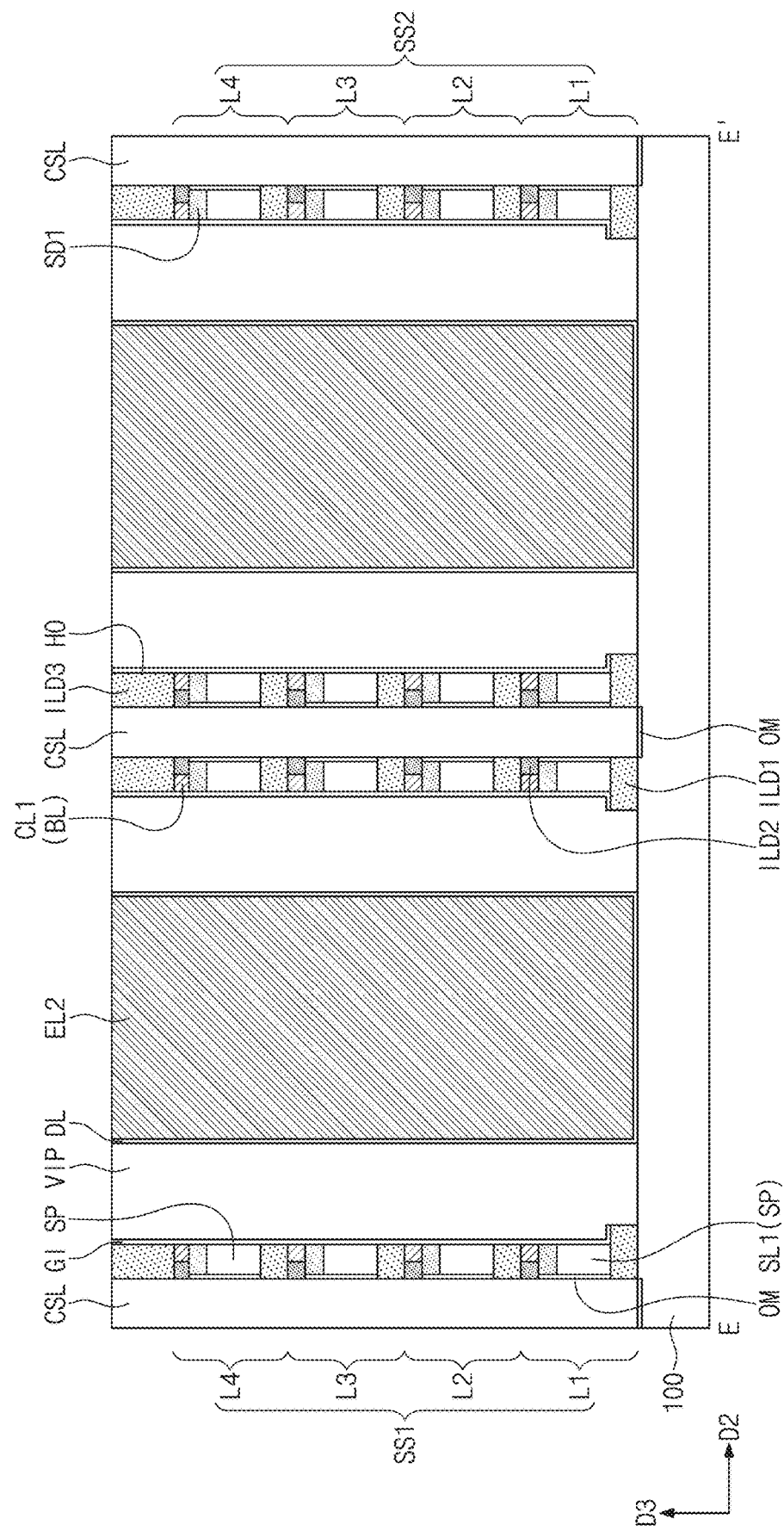
Figure 11:
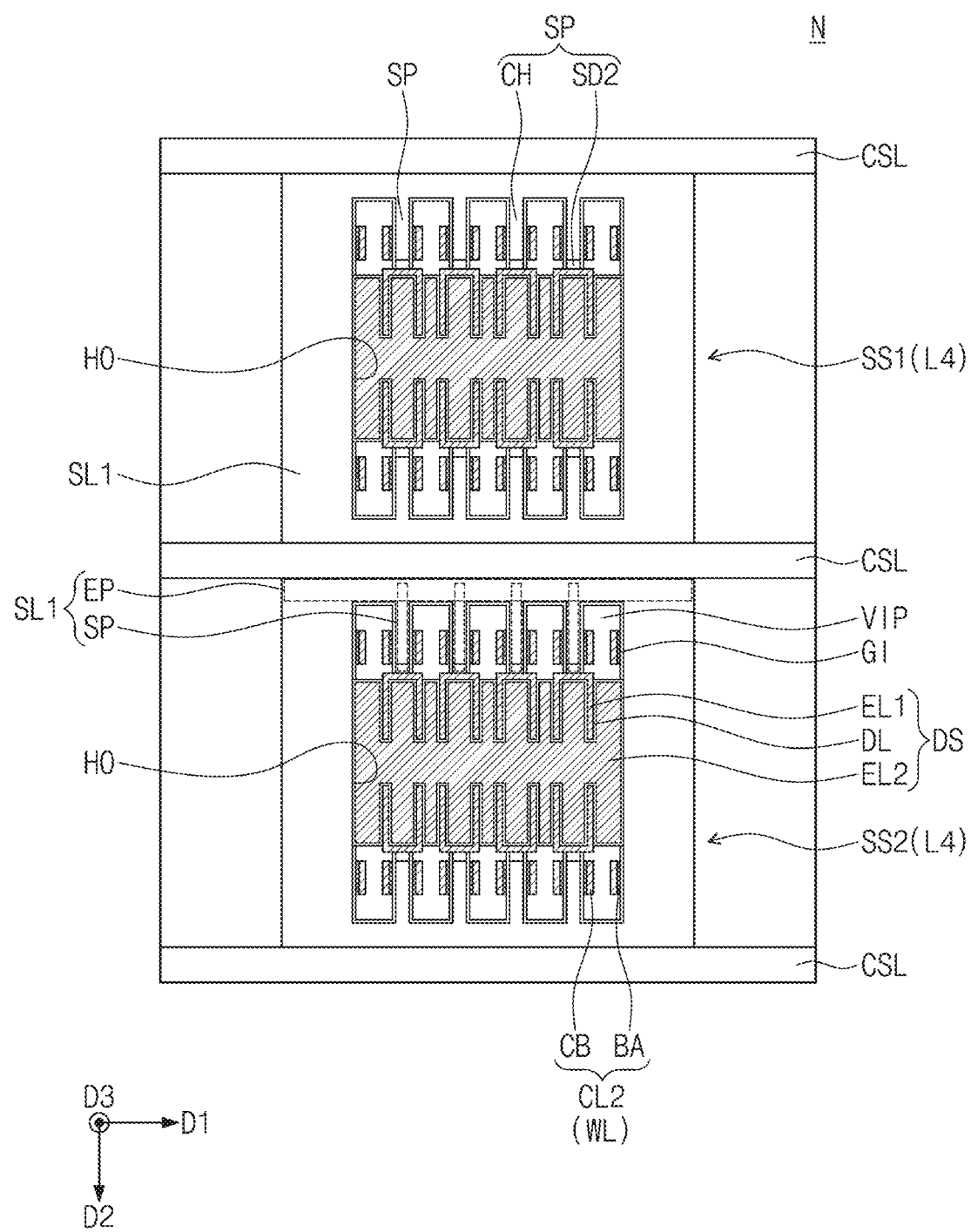
FIG. 11 illustrates a plan view taken along line N of FIG. 8.

FIG. 8 illustrates a perspective view showing a three-dimensional semiconductor memory device according to some example embodiments of the present inventive concepts. FIG. 9 illustrates a plan view showing the three-dimensional semiconductor memory device shown in FIG. 8. FIGS. 10A, 10B, 10C, 10D, and 10E illustrate cross-sectional views respectively taken along lines A-A', B-B', C-C', D-D', and E-E' of FIG. 9. FIG. 11 illustrates a plan view taken along line N of FIG. 8. In the embodiment that follows, a detailed description of technical features repetitive to those discussed above with reference to FIGS. 5, 6, and 7 will be omitted, and a difference thereof will be discussed in detail.

Referring to FIGS. 8, 9, 10A to 10E, and 11, a plurality of stack structures SS1 and SS2 may be provided on a substrate 100. The stack structures SS1 and SS2 may include a first stack structure SS1 and a second stack structure SS2. The first and second stack structures SS1 and SS2 may extend in a first direction D1. The first and second stack structures SS1 and SS2 may be arranged spaced apart from each other in a second direction D2.

Common source lines CSL may be provided on opposite sides of each of the first and second stack structures SS1 and SS2. One common source line CSL may be interposed between the first and second stack structures SS1 and SS2. The common source lines CSL may extend in the first direction D1 along the first and second stack structures SS1 and SS2. An oxidation material OM may be interposed between the common source line CSL and the substrate 100 and between the common source line CSL and a semiconductor pattern SP which will be discussed below.

Each of the first and second stack structures SS1 and SS2 may include first, second, third, and fourth layers L1, L2, L3, and L4 that are sequentially stacked on the substrate 100. Each of the first, second, third, and fourth layers L1, L2, L3, and L4 may include a first dielectric layer ILD1, a first semiconductor layer SL1, and a second dielectric layer ILD2. The first dielectric layer ILD1, the first semiconductor layer SL1, and the second dielectric layer ILD2 may be sequentially stacked. The first dielectric layer ILD1 and the second dielectric layer ILD2 may vertically separate the first semiconductor layer SL1 therebetween from other first semiconductor layers SL1.

Each of the first, second, third, and fourth layers L1, L2, L3, and L4 may further include a first conductive line CL1 extending in the first direction D1. For example, each of the first, second, third, and fourth layers L1, L2, L3, and L4 may include two first conductive lines CL1 spaced apart from each other in the second direction D2. The first conductive line CL1 may be located at the same level as that of the second dielectric layer ILD2. The second dielectric layer ILD2 may cover sidewalls of the first conductive line CL1. The first conductive line CL1 may be disposed on a top surface of the first semiconductor layer SL1. The first conductive line CL1 may be disposed adjacent to the common source line CSL. The first conductive lines CL1 may correspond to the bit lines BL discussed with reference to FIG. 5.

The first semiconductor layer SL1 may include a semiconductor material. The semiconductor material may be a single crystalline semiconductor material. For example, the first semiconductor layer SL1 may include single crystalline silicon, single crystalline germanium, or single crystalline silicon-germanium. The first and second dielectric layers ILD1 and ILD2 may include different dielectric materials from each other. Each of the first and second dielectric layers ILD1 and ILD2 may include a silicon oxide layer, a silicon nitride layer, a silicon oxynitride layer, a carbon-containing silicon oxide layer, a carbon-containing silicon nitride layer, or a carbon-containing silicon oxynitride layer. For example, the first dielectric layer ILD1 may be a carbon-containing silicon oxide layer (e.g., SiOC), and the second dielectric layer ILD2 may be a silicon nitride layer (e.g., SiN).

Each of the first and second stack structures SS1 and SS2 may be configured such that one end of each of the second and third layers L2 and L3 may protrude more in the first direction D1 than one end of the fourth layer L4. The one end of the second layer L2 and the one end of the third layer L3 may be vertically aligned with each other. The one end of the first layer L1 may protrude more in the first direction D1 than the one end of each of the second and third layers L2 and L3. Other end of each of the first and second layers L1 and L2 may protrude more in an opposite direction to the first direction D1 than other end of each of the third and fourth layers L3 and L4. The other end of the first layer L1 and the other end of the second layer L2 may be vertically aligned with each other. The other end of the third layer L3 and the other end of the fourth layer L4 may be vertically aligned with each other.

A hole HO may be provided to penetrate each of the first and second stack structures SS1 and SS2. Each of the first semiconductor layers SL1 may include semiconductor patterns SP defined by the hole HO. For example, each of the first semiconductor layers SL1 may include an extension part EP extending in the first direction D1 and also include the semiconductor patterns SP extending in the second direction D2 from the extension part EP (see FIG. 11). The hole HO may be positioned between the semiconductor patterns SP.

Each of the semiconductor patterns SP may include a channel region CH, a first impurity region SD1, and a second impurity region SD2. The channel region CH may be interposed between the first and second impurity regions SD1 and SD2. The extension part EP of each of the first semiconductor layers SL1 may be electrically connected to the common source line CSL. The first conductive line CL1 may be disposed on the extension part EP of the first semiconductor layer SL1. The first conductive line CL1 may be disposed on the first impurity regions SD1 of the semiconductor patterns SP.

Second conductive lines CL2 may be provided to extend in a vertical direction (e.g., a third direction D3) in the holes HO penetrating the first and second stack structures SS1 and SS2. Alternatively, the holes HO may be provided therein with the second conductive lines CL2 that extend at an angle other than perpendicular to a top surface of the substrate 100. For example, the second conductive lines CL2 may penetrate the first and second stack structures SS1 and SS2. A pair of the second conductive lines CL2 may be provided on opposite sides of each of the semiconductor patterns SP. For example, a pair of the second conductive lines CL2 may constitute one word line WL. For another example, one of the pair of the second conductive lines CL2 may be a word line WL, and the other of the pair of the second conductive lines CL2 may be a back gate.

Each of the second conductive lines CL2 may include a barrier pattern BA and a conductive body CB. The conductive body CB may have a linear shape extending in the third direction D3. The barrier pattern BA may cover one sidewall and a bottom surface of the conductive body CB. The conductive body CB may include metal (tungsten, titanium, tantalum, etc.), and the barrier pattern BA may include conductive metal nitride (titanium nitride, tantalum nitride, etc.). The barrier pattern BA may reduce or prevent a metallic material in the conductive body CB from diffusing into the semiconductor pattern SP.

A gate dielectric layer GI may be provided on an inner sidewall of each of the first and second stack structures SS1 and SS2, which inner sidewall is exposed the hole HO. Accordingly, the gate dielectric layer GI may be interposed between each of the semiconductor patterns SP and each of the second conductive lines CL2. The barrier pattern BA of each of the second conductive lines CL2 may be in direct contact with the gate dielectric layer GI.

Each of the holes HO may be provided therein with vertical dielectric patterns VIP covering the second conductive lines CL2. The vertical dielectric pattern VIP may be interposed between a pair of the second conductive lines CL2 adjacent to each other. The vertical dielectric pattern VIP may be interposed between a pair of the second conductive patterns SP adjacent to each other. The vertical dielectric pattern VIP may have a pillar shape extending in the third direction D3. For example, the vertical dielectric pattern VIP may include one or more of a silicon oxide layer, a silicon nitride layer, and a silicon oxynitride layer.

Each of the holes HO may be provided therein with data storage elements DS. The data storage elements DS may be provided in a remaining portion of the hole HO. The remaining portion of the hole HO may indicate a space that is not occupied by the gate dielectric layer GI, the second conductive lines CL2, and the vertical dielectric patterns VIP.

Each of the data storage elements DS may include a first electrode EL1, a dielectric layer DL, and a second electrode EL2. The data storage elements DS in one of the first and second stack structures SS1 and SS2 may share one dielectric layer DL and one second electrode EL2. For example, in one of the first and second stack structures SS1 and SS2, the first electrode EL1 may be provided in plural, and one dielectric layer DL may cover surfaces of the plurality of first electrodes EL1. One second electrode EL2 may be provided on one dielectric layer DL.

The data storage elements DS may be connected to corresponding second impurity regions SD2 of the semiconductor patterns SP. For example, the first electrodes EL1 may be connected to corresponding second impurity regions SD2 of the semiconductor patterns SP. The second electrode EL2 may have a top surface exposed to the hole HO.

An interlayer dielectric layer 110 may be provided to cover the first and second stack structures SS1 and SS2. For example, the interlayer dielectric layer 110 may include one or more of a silicon oxide layer, a silicon nitride layer, and a silicon oxynitride layer. A third dielectric layer IDL3 may be provided on each of the first and second stack structures SS1 and SS2. The interlayer dielectric layer 110, the third dielectric layers ILD3, the second conductive lines CL2, the second electrodes EL2, and the common source lines CSL may have their top surfaces that are coplanar with each other.

At least one first contact CNT1 may be provided to penetrate the interlayer dielectric layer 110 to come into connection with at least one first conductive line CL1. At least one second contact CNT2 may be provided to penetrate the interlayer dielectric layer 110 to come into connection with at least one second conductive line CL2. The first contact CNT1 may be disposed on the first conductive line CL1 exposed at an end of one of the first and second stack structures SS1 and SS2. The second contact CNT2 may be disposed on the second conductive line CL2 exposed at a top surface of one of the first and second stack structures SS1 and SS2.

Figure 29A:
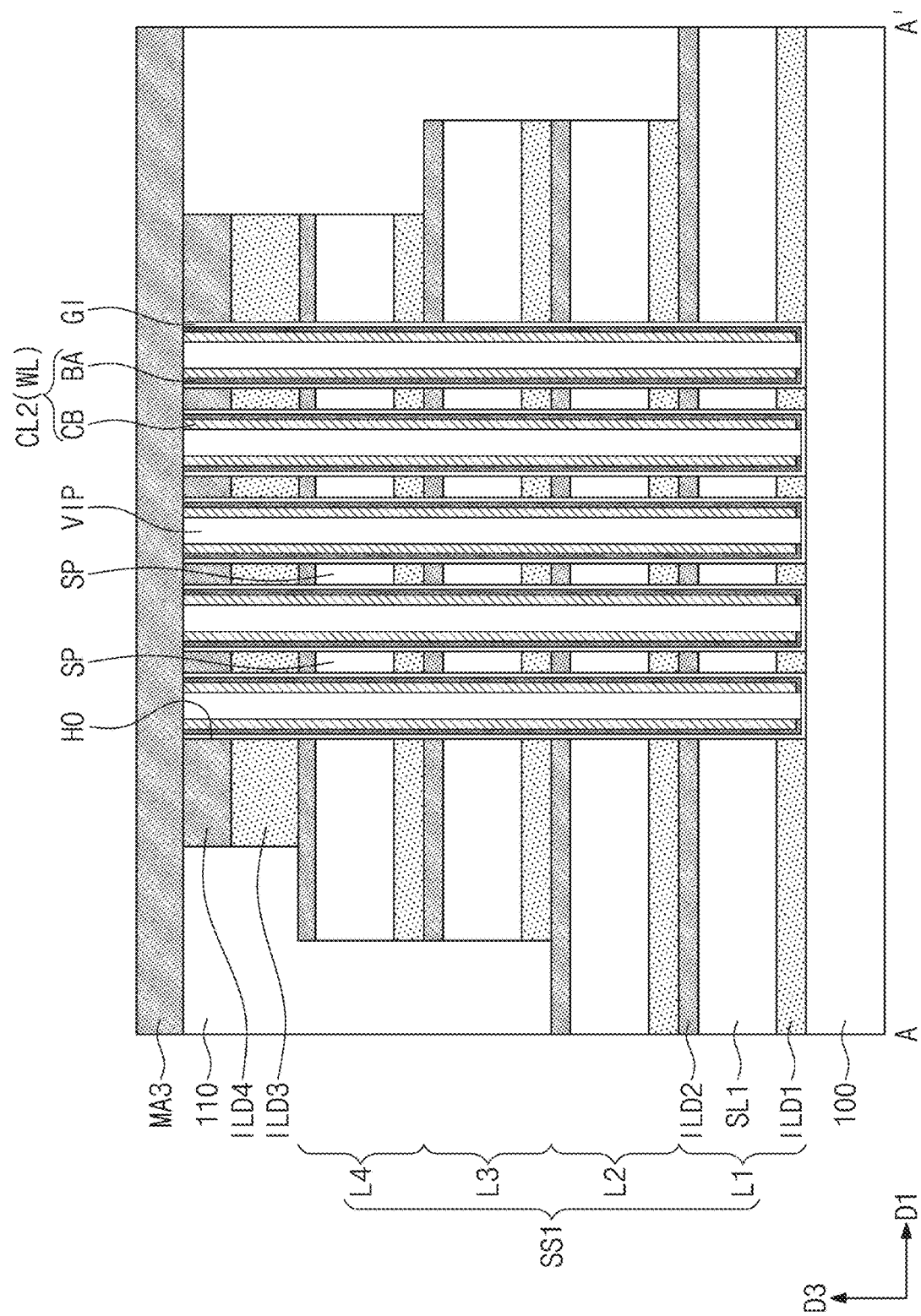
Figure 29B:
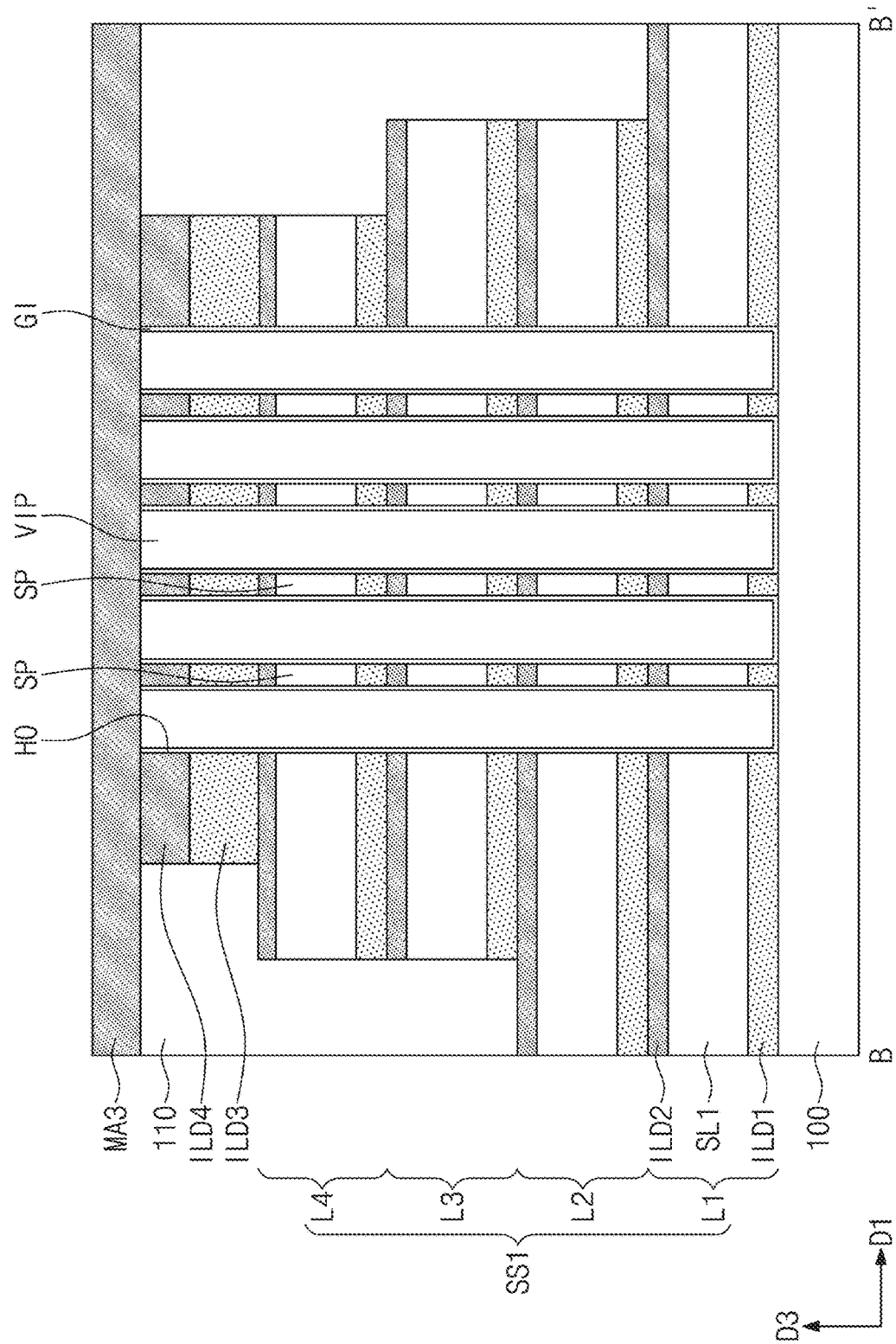
Figure 29C:
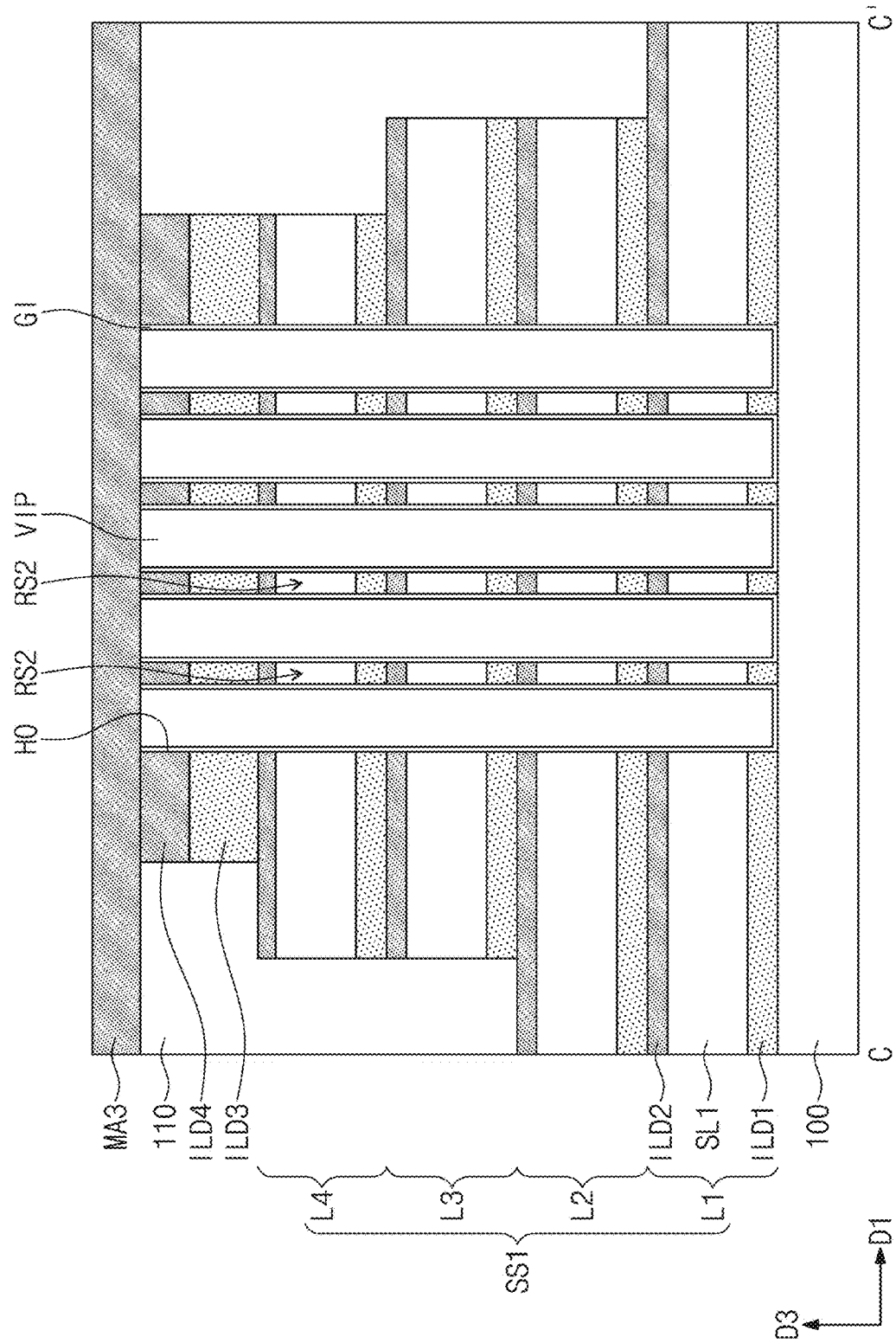
Figure 29D:
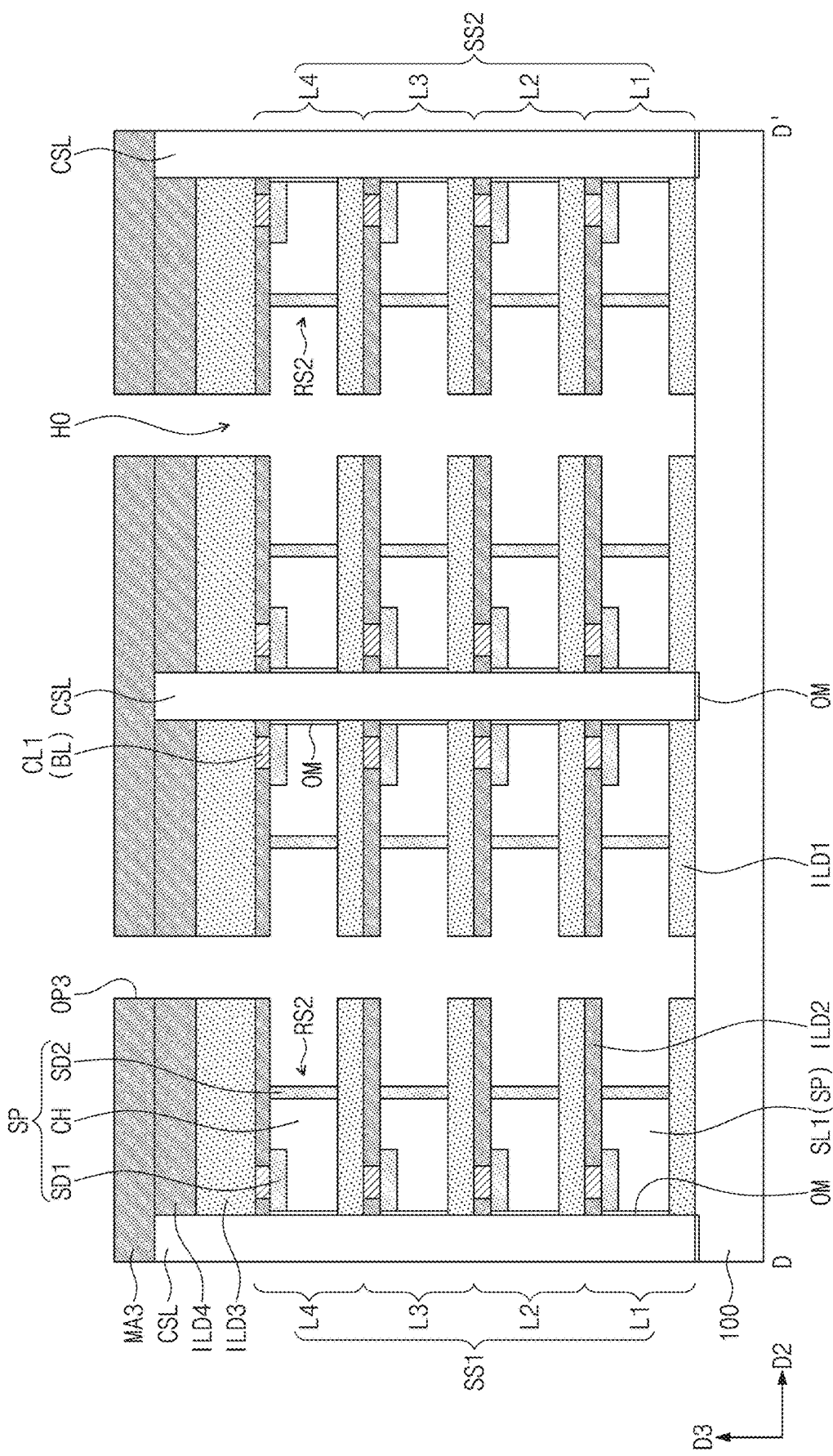
Figure 29E:
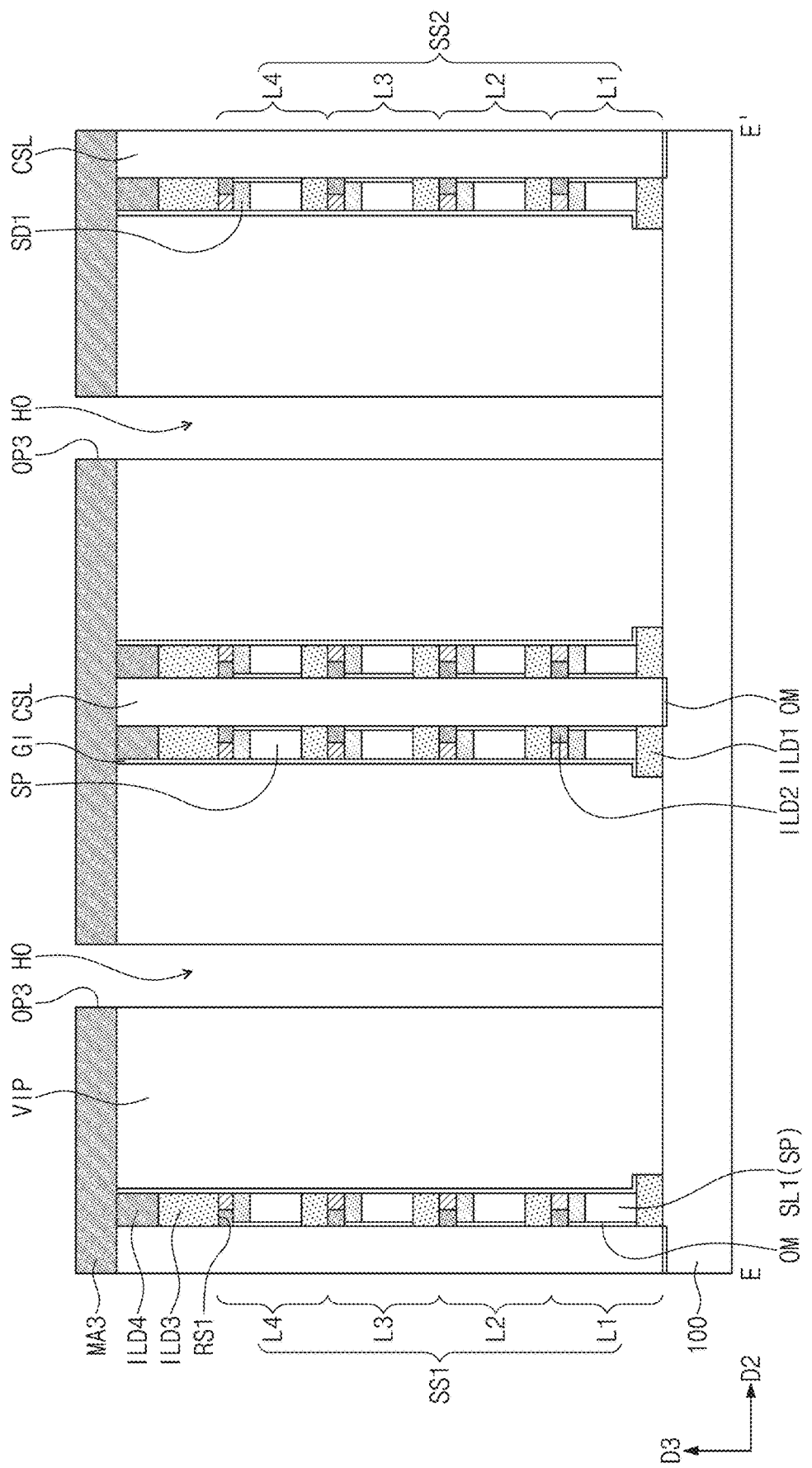
FIGS. 29E, 31E, and 33E illustrate cross-sectional views taken along line E-E' of FIGS. 28, 30, and 32, respectively.
Figure 30:
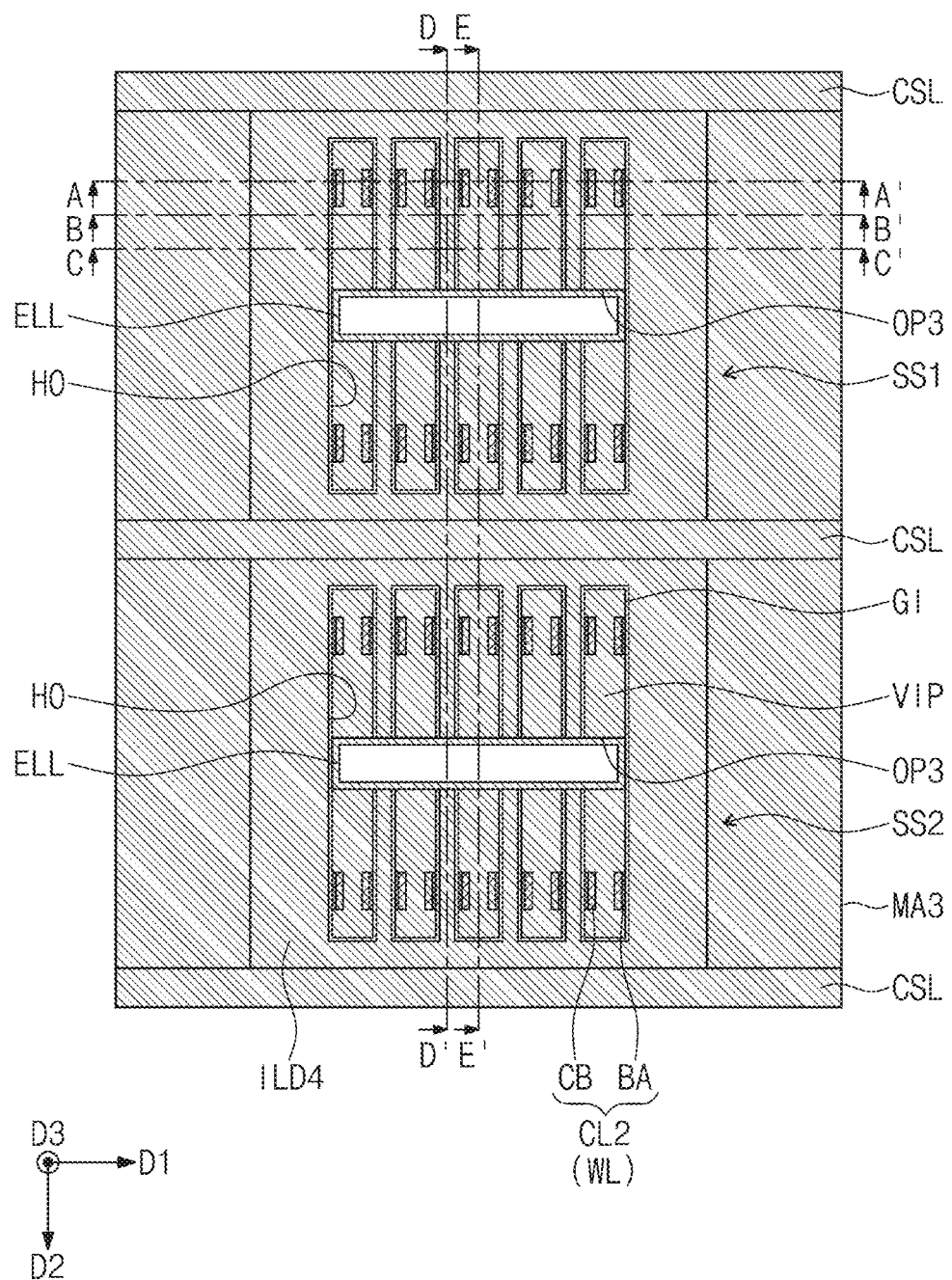
Figure 31A:
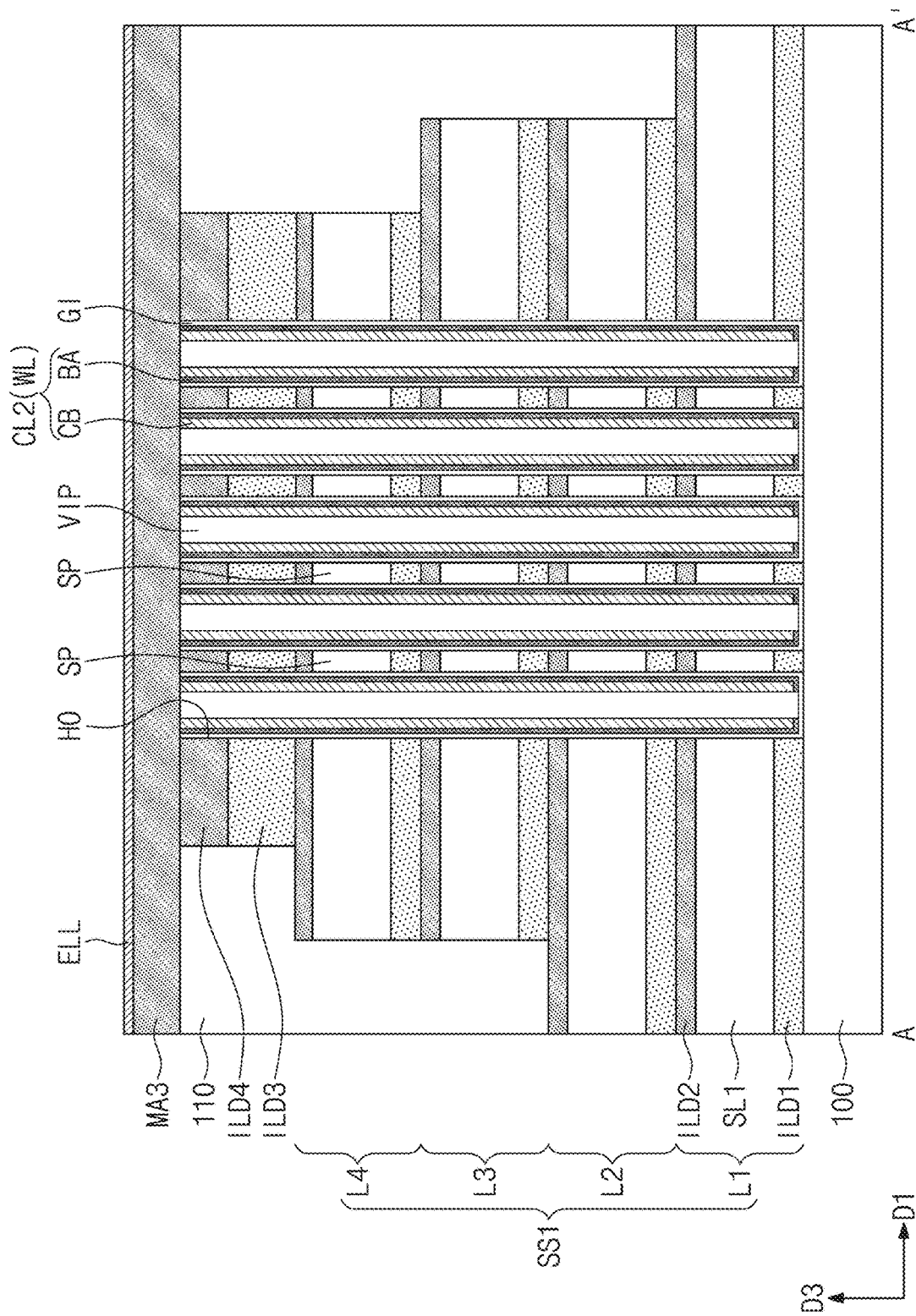
Figure 31B:
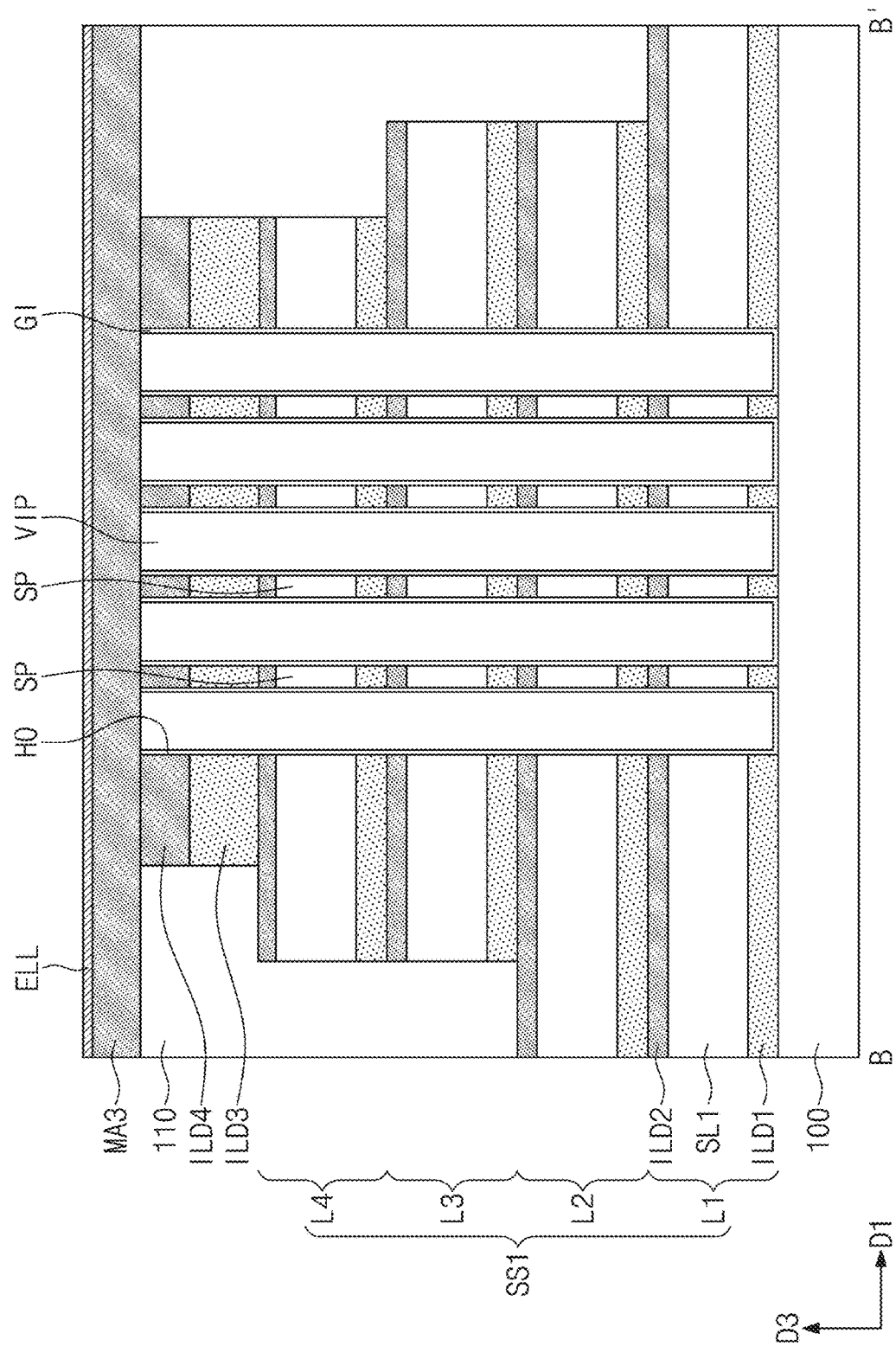
Figure 31C:
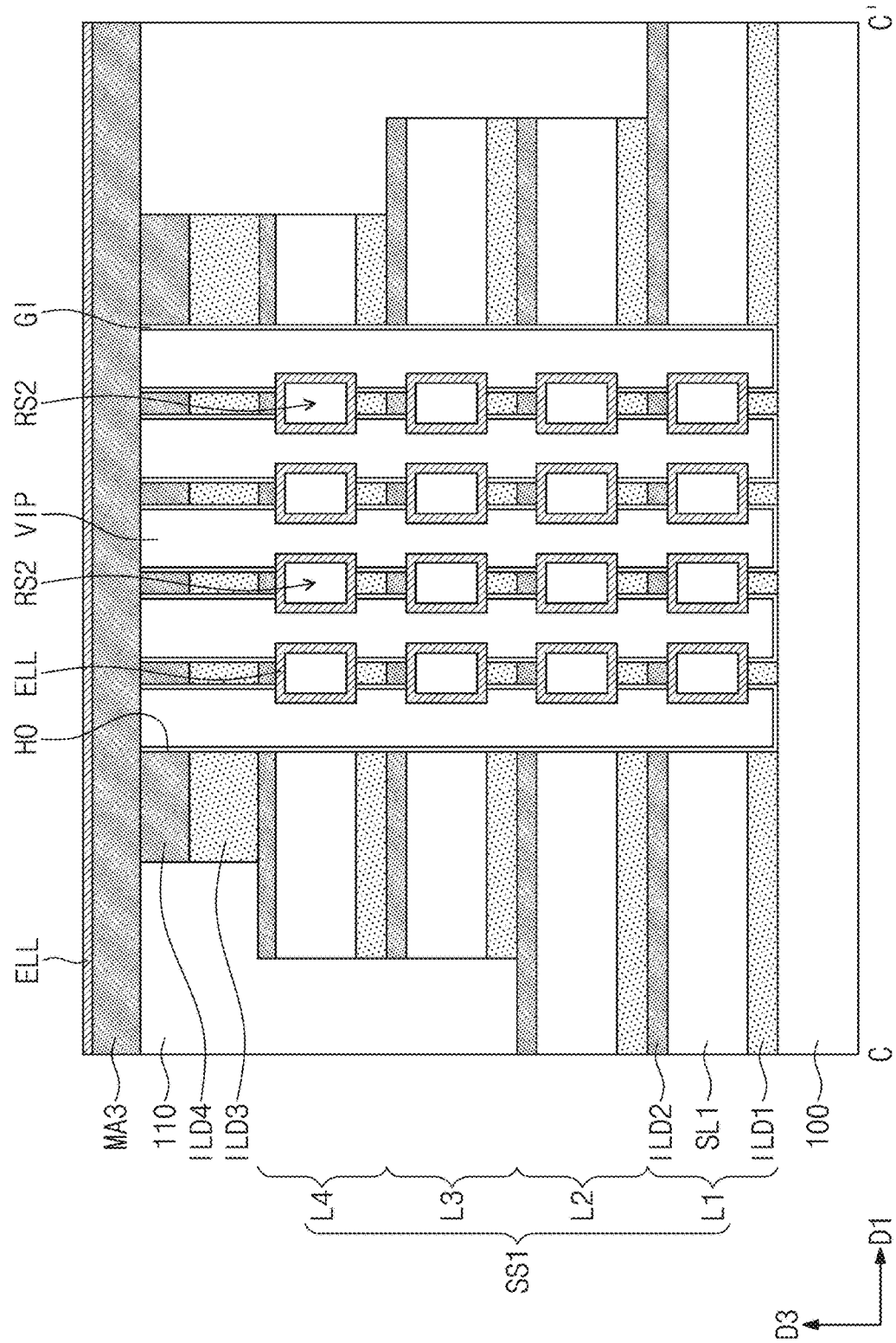
Figure 31D:
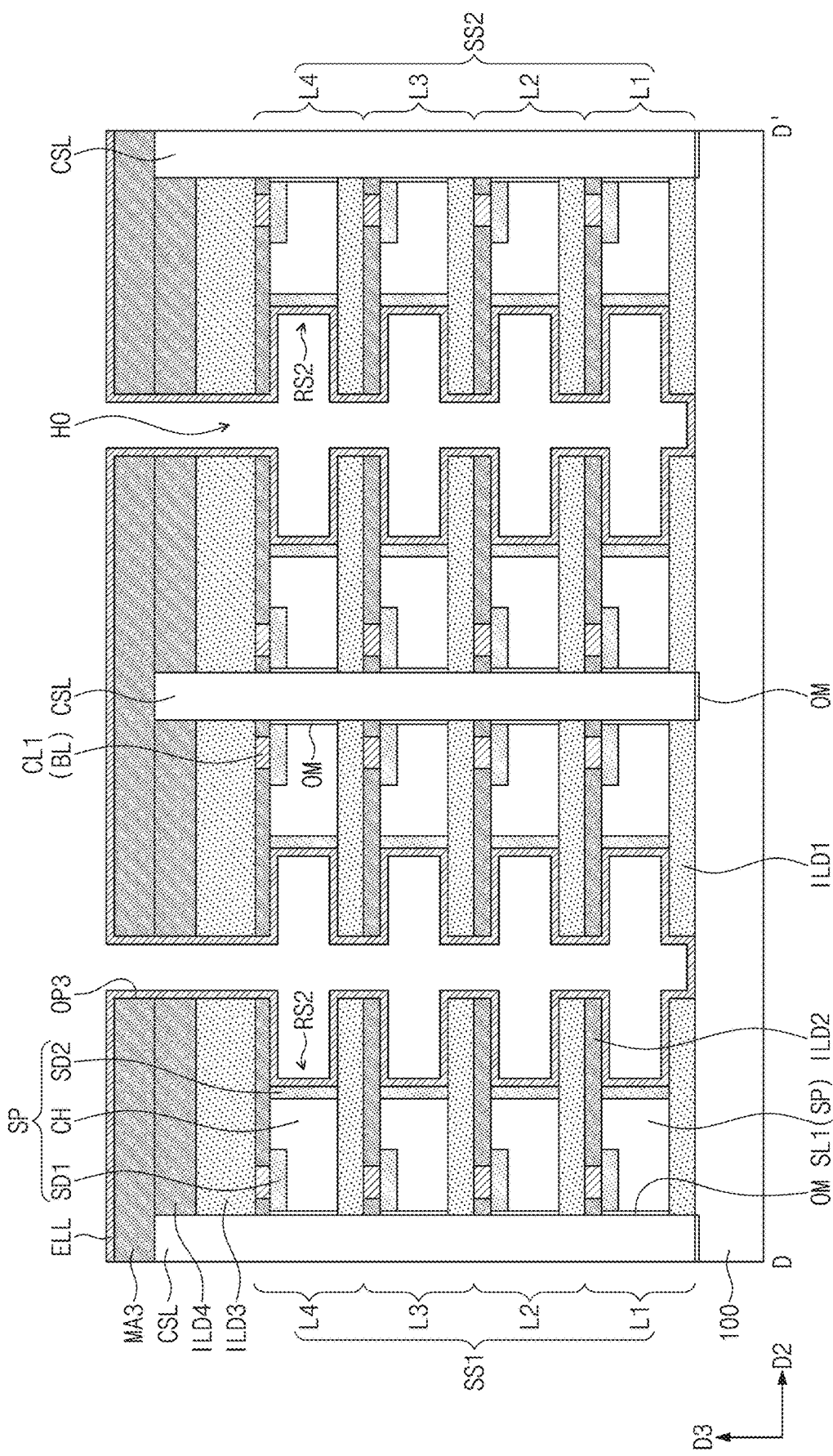
Figure 31E:
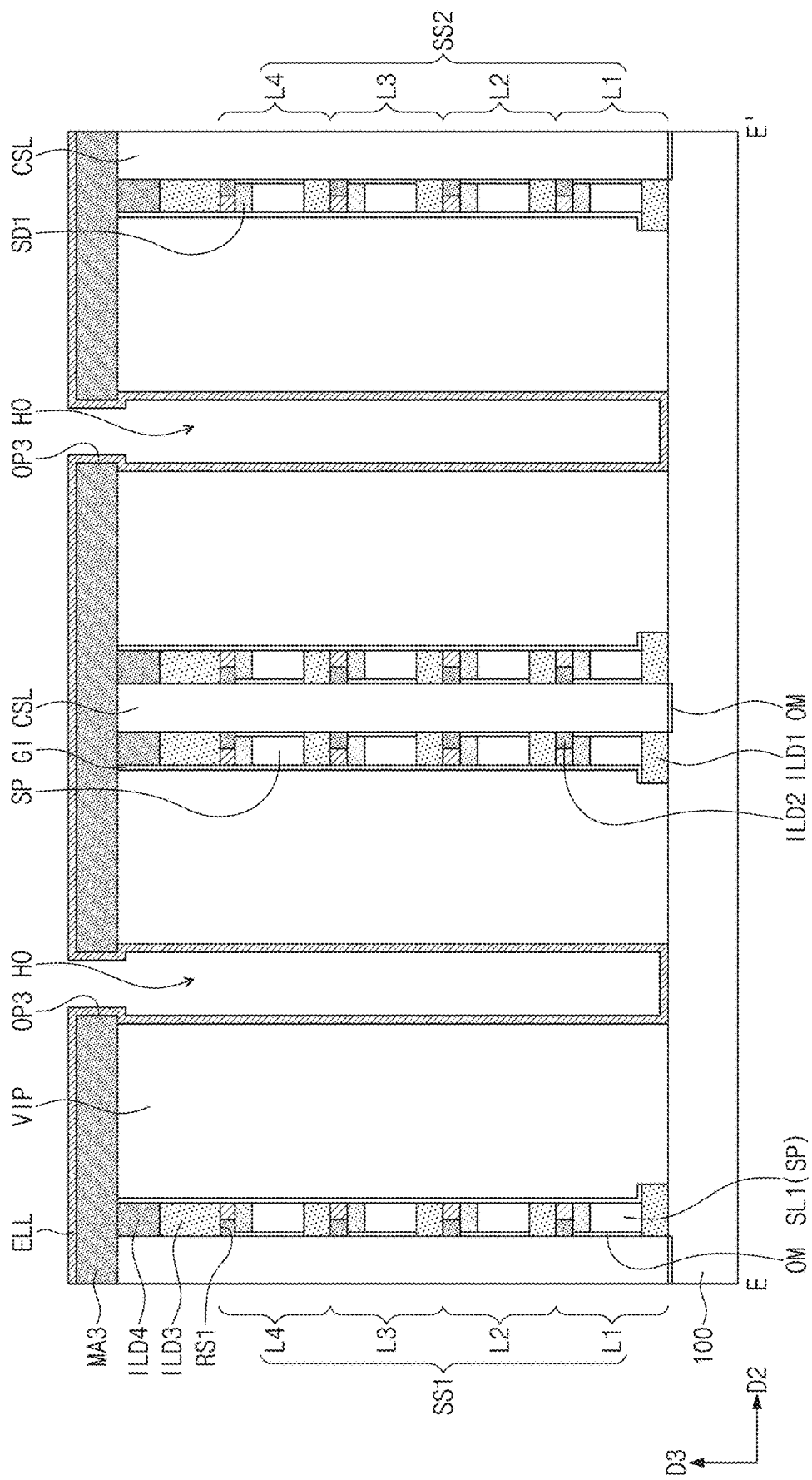
Figure 32:
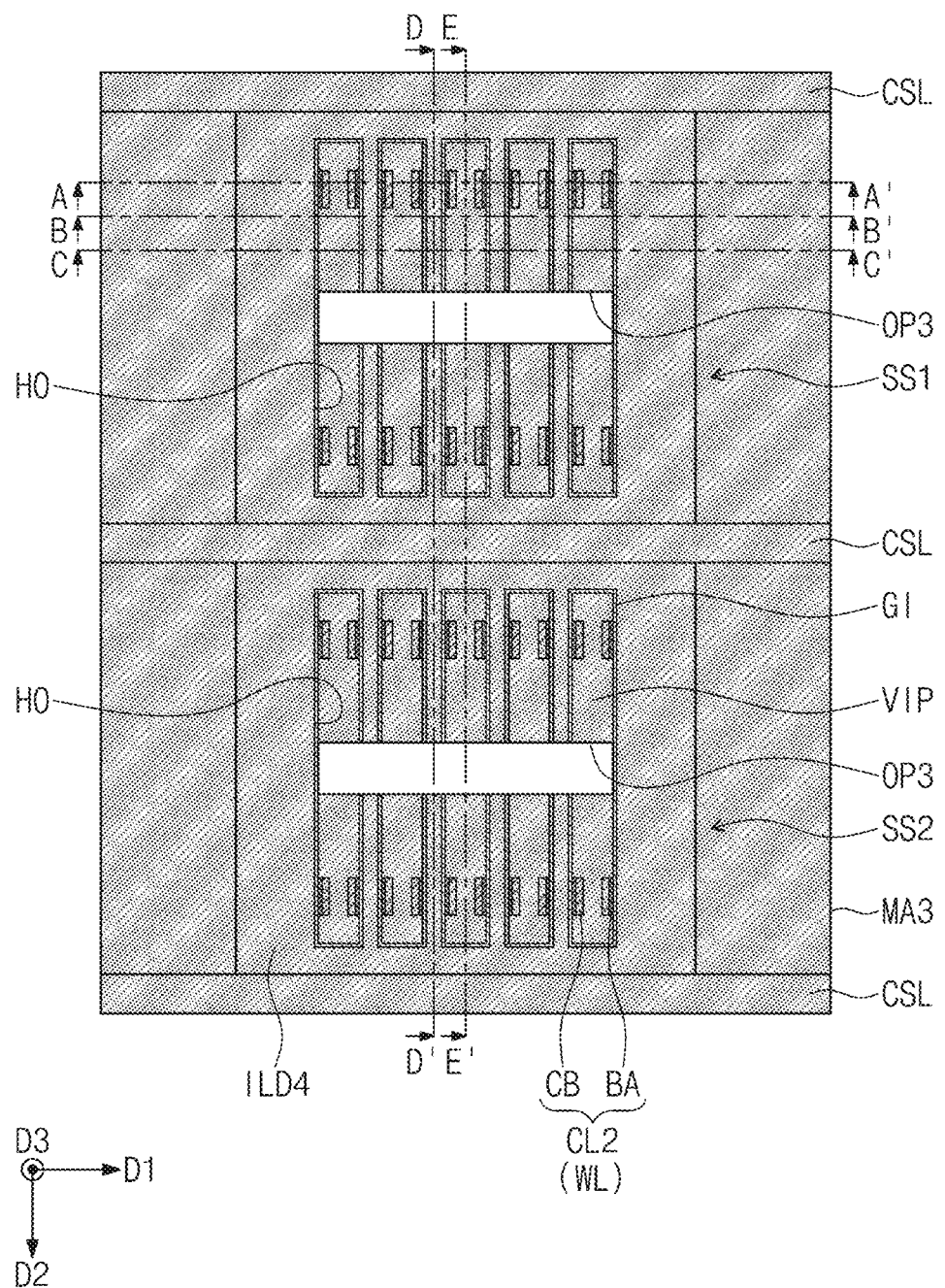
Figure 33B:
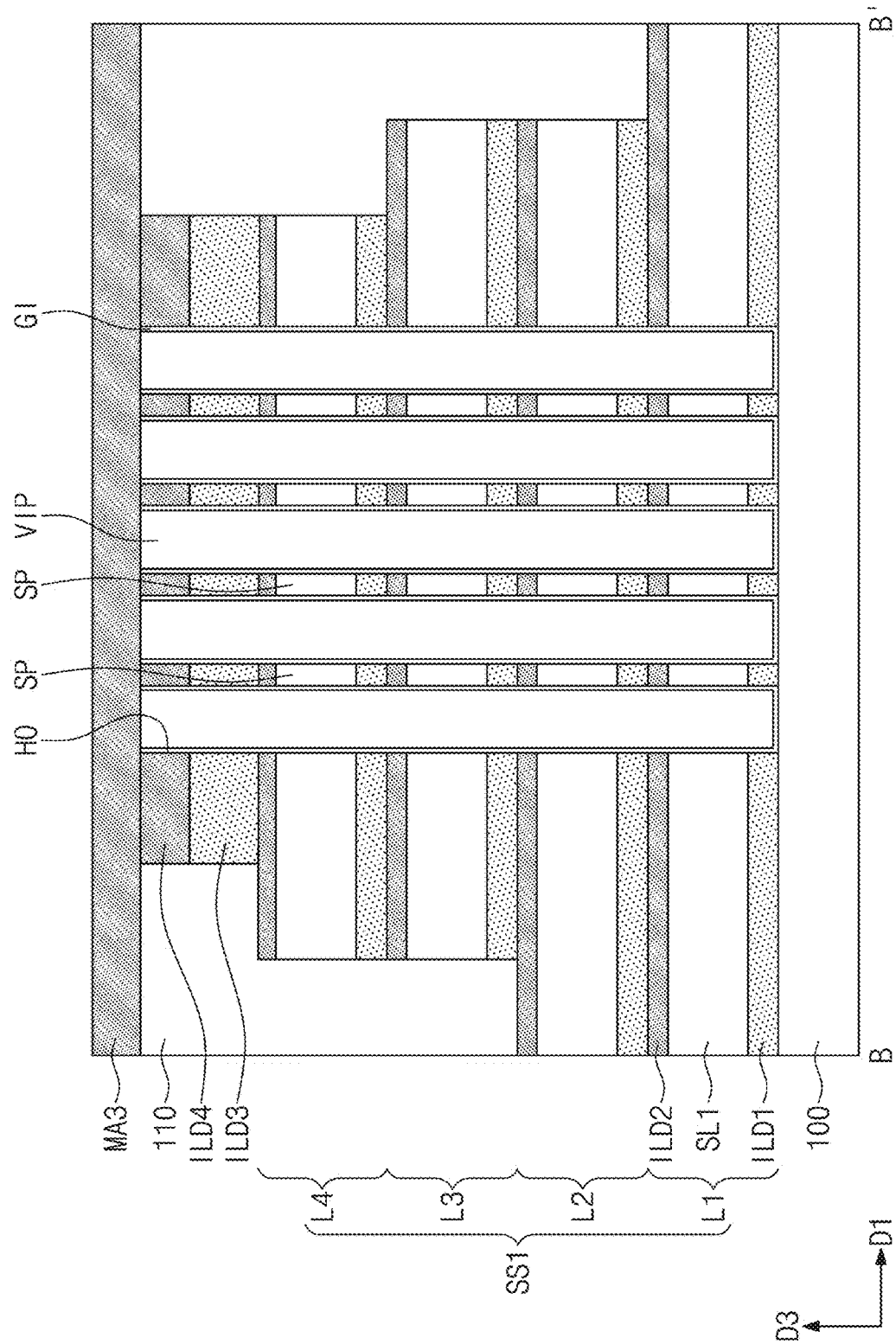
Figure 33C:
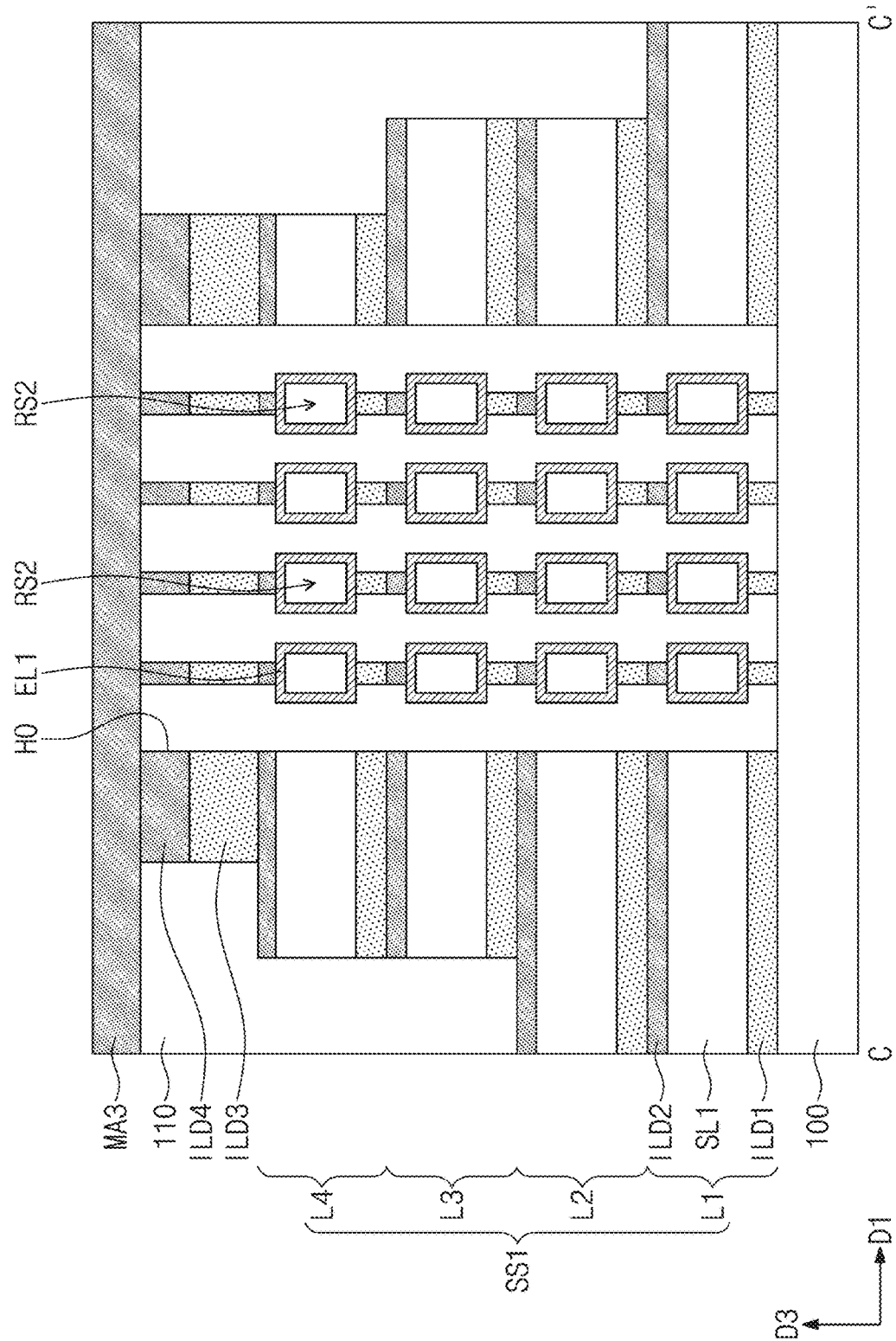
Figure 33D:
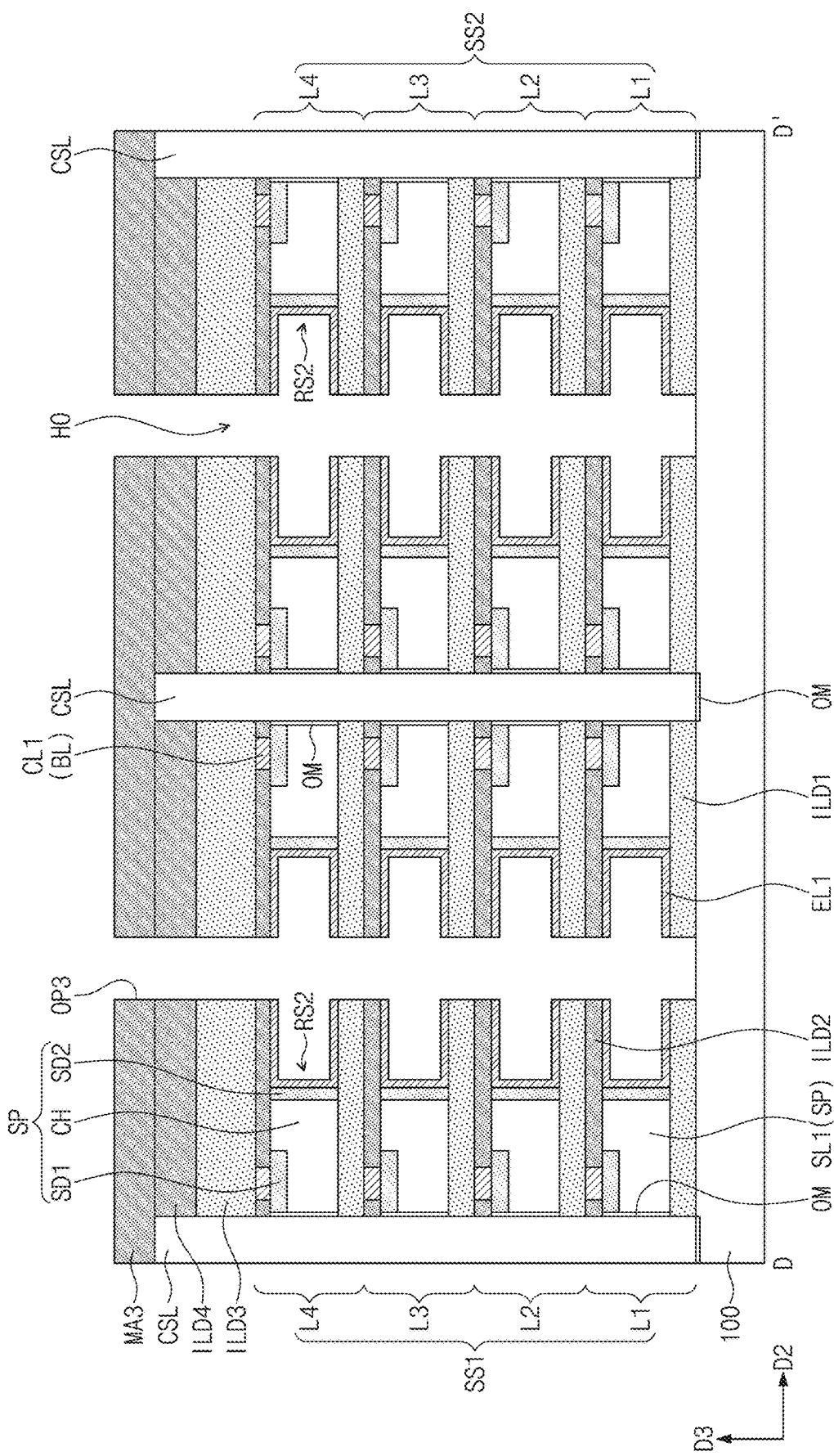
Figure 33E:
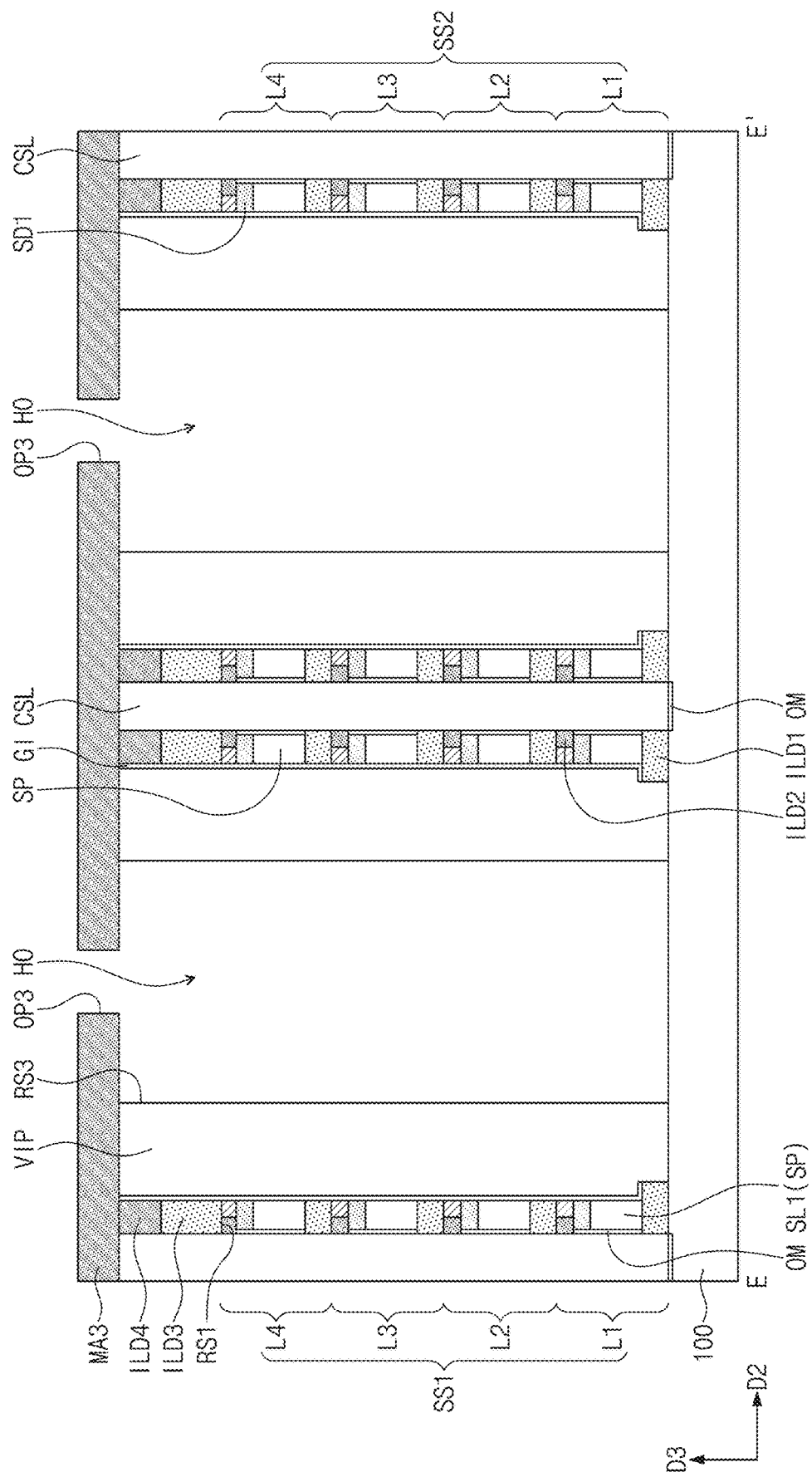

FIGS. 12, 14, 16, 18, 20, 22, 24, 26, 28, 30, and 32 illustrate plan views showing a method of manufacturing a three-dimensional semiconductor memory device according to some example embodiments of the present inventive concepts. FIGS. 13, 15, 17, 19, 21A, 23A, 25A, 27A, 29A, 31A, and 33A illustrate vertical cross-sectional views taken along line A-A' of FIGS. 12, 14, 16, 18, 20, 22, 24, 26, 28, 30, and 32, respectively. FIGS. 21B, 23B, 25B, 27B, 29B, 31B, and 33B illustrate vertical cross-sectional views taken along line B-B' of FIGS. 20, 22, 24, 26, 28, 30, and 32, respectively. FIGS. 25C, 27C, 29C, 31C, and 33C illustrate vertical cross-sectional views taken along line C-C' of FIGS. 24, 26, 28, 30, and 32, respectively. FIGS. 25D, 27D, 29D, 31D, and 33D illustrate vertical cross-sectional views taken along line D-D' of FIGS. 24, 26, 28, 30, and 32, respectively. FIGS. 29E, 31E, and 33E illustrate vertical cross-sectional views taken along line E-E' of FIGS. 28, 30, and 32, respectively.

Figure 12:
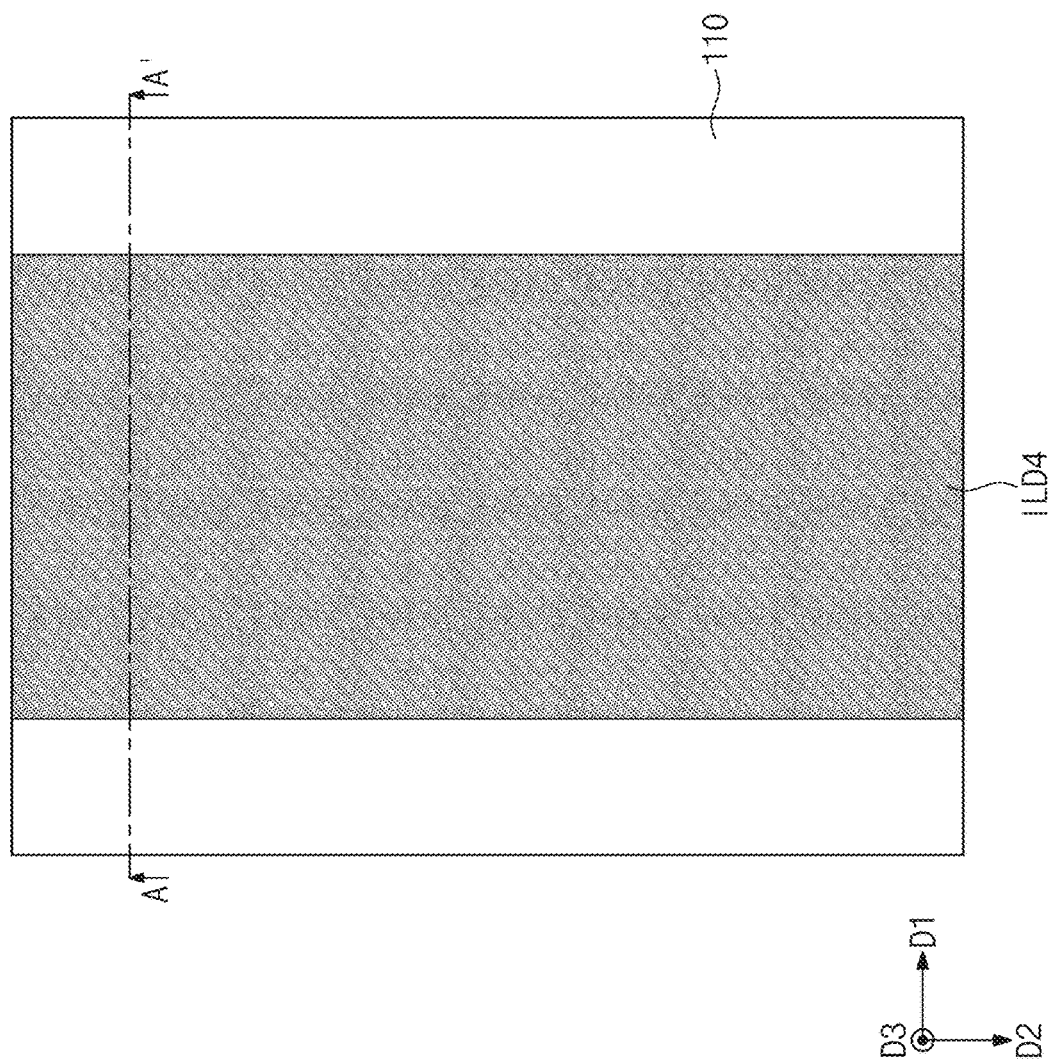
FIGS. 12, 14, 16, 18, 20, 22, 24, 26, 28, 30, and 32 illustrate plan views showing a method of manufacturing a three-dimensional semiconductor memory device according to some example embodiments of the present inventive concepts.
Figure 13:
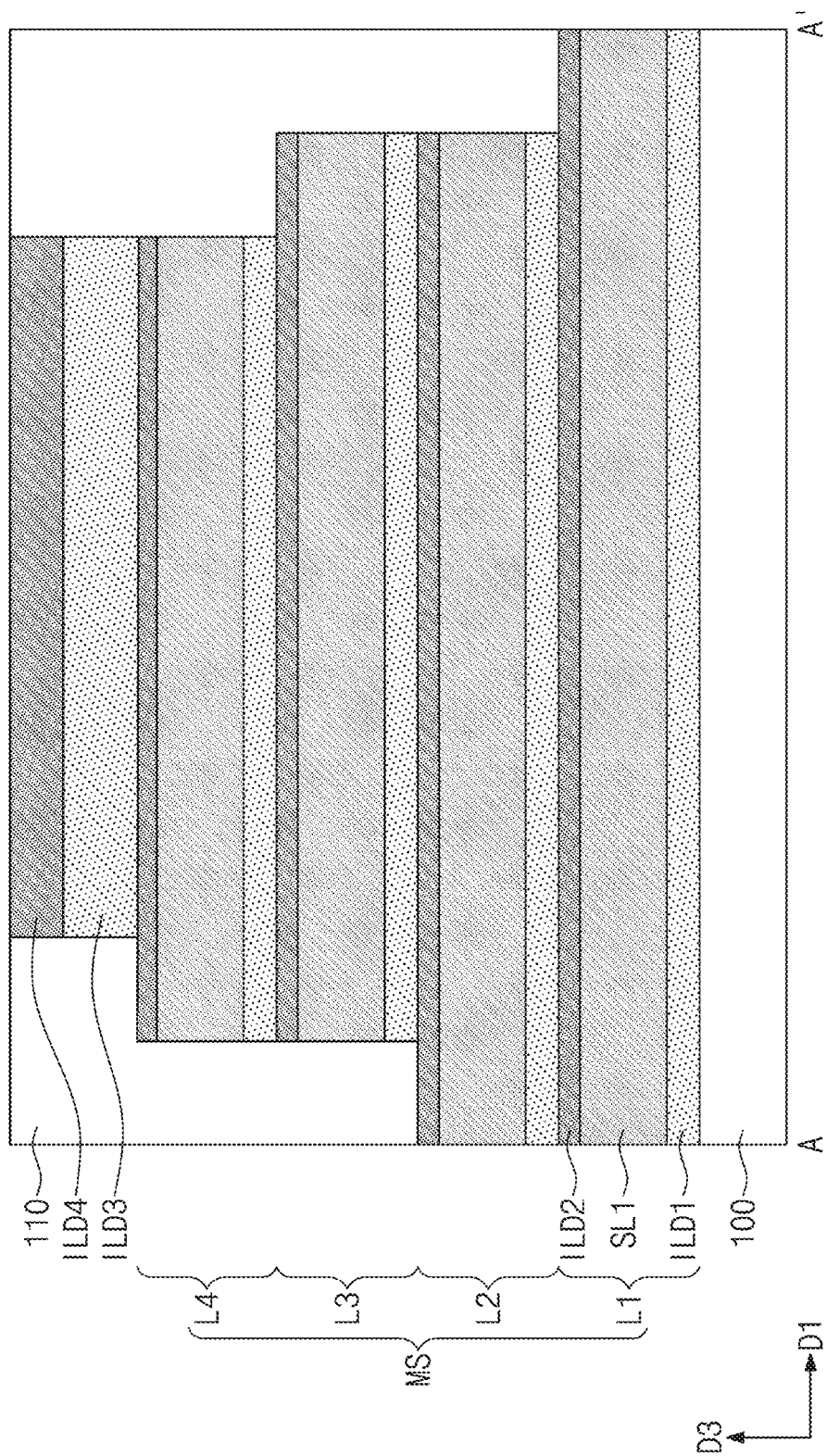

Referring to FIGS. 12 and 13, a mold structure MS may be formed on a substrate 100. The formation of the mold structure MS may include forming first, second, third, and fourth layers L1, L2, L3, and L4 that are sequentially stacked. The mold structure MS may be formed to have stepwise structures at its opposite ends.

The substrate 100 may include a semiconductor material. The semiconductor material may be a single crystalline semiconductor material. For example, the substrate 100 may include single crystalline silicon, single crystalline germanium, or single crystalline silicon-germanium. Each of the first, second, third, and fourth layers L1, L2, L3, and L4 may include a first dielectric layer ILD1, a first semiconductor layer SL1, and a second dielectric layer ILD2. The first dielectric layer ILD1, the first semiconductor layer SL1, and the second dielectric layer ILD2 may be sequentially formed. The first semiconductor layer SL1 may include a semiconductor material. The semiconductor material may be an amorphous semiconductor material or a polycrystalline semiconductor material. The amorphous semiconductor material may be one of amorphous silicon, amorphous germanium, and amorphous silicon-germanium. The polycrystalline semiconductor material may be one of polycrystalline silicon, polycrystalline germanium, and polycrystalline silicon-germanium. The first and second dielectric layers ILD1 and ILD2 may include different dielectric materials from each other. One of the first and second dielectric layers ILD1 and ILD2 may have an etch selectivity with respect to the other of the first and second dielectric layers ILD1 and ILD2. Each of the first and second dielectric layers ILD1 and ILD2 may include a silicon oxide layer, a silicon nitride layer, a silicon oxynitride layer, a carbon-containing silicon oxide layer, a carbon-containing silicon nitride layer, or a carbon-containing silicon oxynitride layer. For example, the first dielectric layer ILD1 may be formed of a carbon-containing silicon oxide layer (e.g., SiOC), and the second dielectric layer ILD2 may be formed of a silicon nitride layer (e.g., SiN). The first semiconductor layer SL1 and the substrate 100 may have the same composition and different crystal structures. For example, when the substrate 100 includes single crystalline silicon, the first semiconductor layer SL1 may include amorphous silicon. For another example, when the substrate 100 includes single crystalline silicon, the first semiconductor layer SL1 may include polycrystalline silicon.

A third dielectric layer ILD3 and a fourth dielectric layer ILD4 may be formed on the mold structure MS. One of the third and fourth dielectric layers ILD3 and ILD4 may have an etch selectivity with respect to the other of the third and fourth dielectric layers ILD3 and ILD4. An interlayer dielectric layer 110 may be formed to cover the mold structure MS. The interlayer dielectric layer 110 may have a top surface coplanar with that of the fourth dielectric layer ILD4. The interlayer dielectric layer 110 may be formed using one or more of a silicon oxide layer, a silicon nitride layer, and a silicon oxynitride layer.

Figure 14:
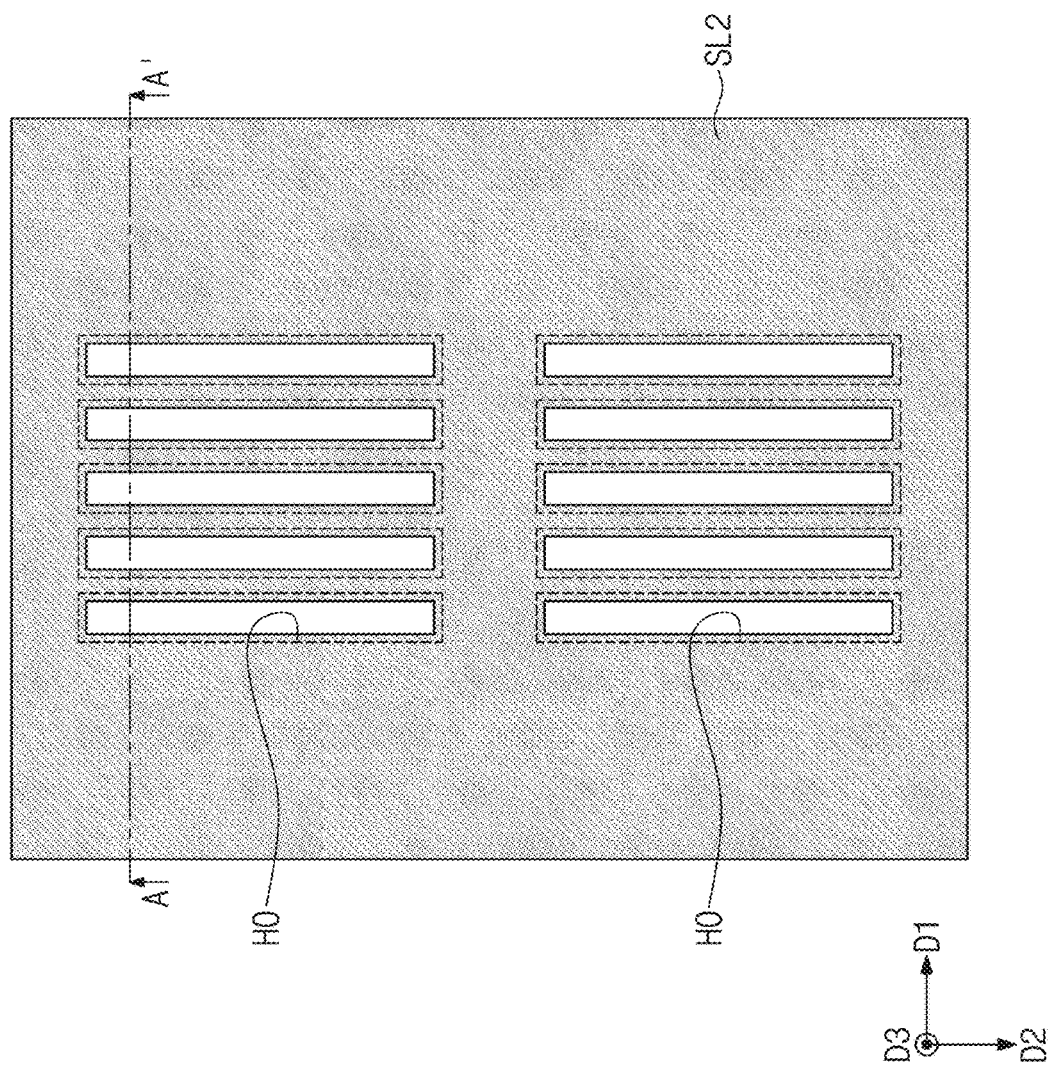
Figure 15:
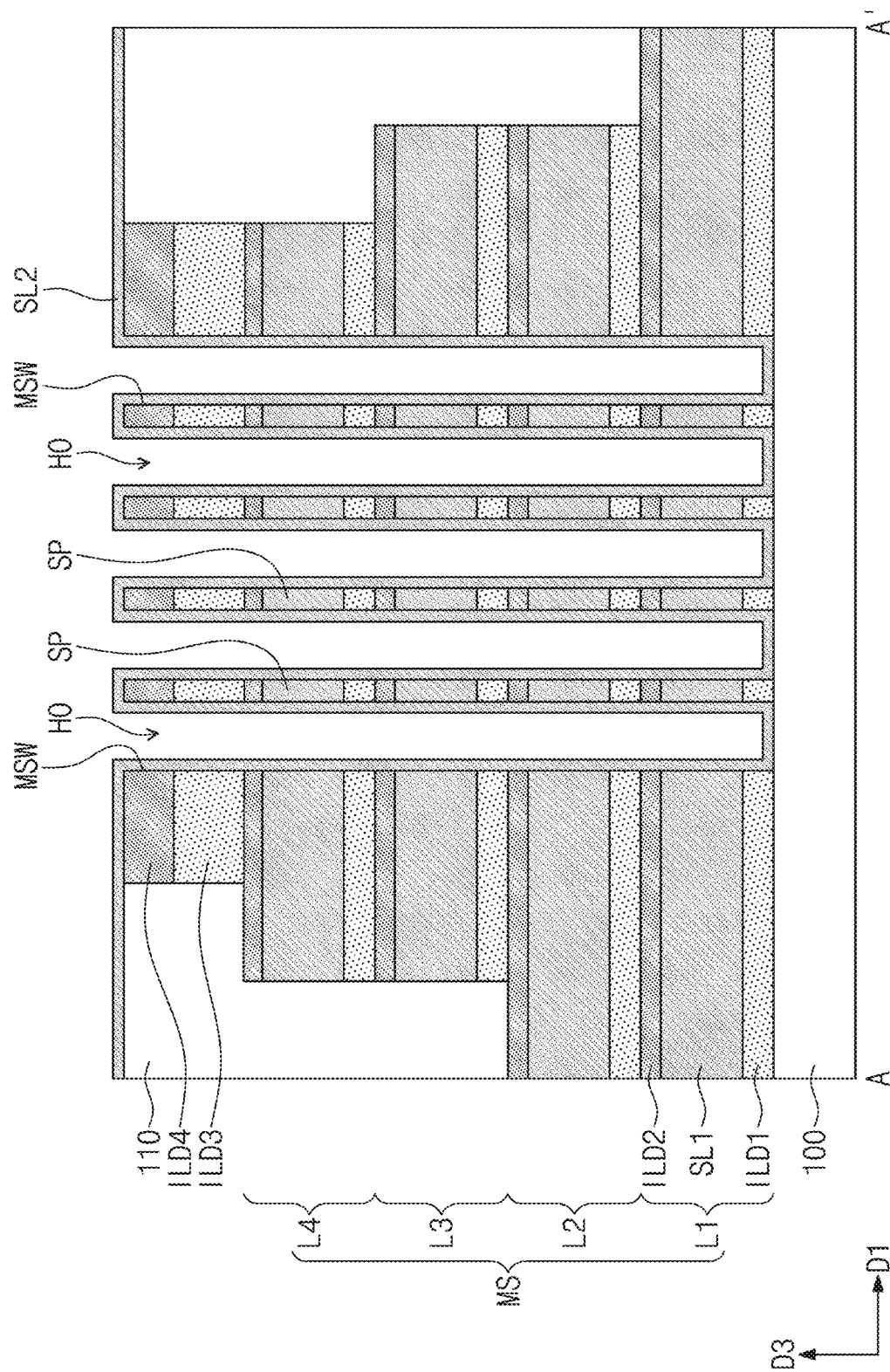

Referring to FIGS. 14 and 15, the mold structure MS may be patterned to form holes HO that penetrate the first, second, third, and fourth layers L1, L2, L3, and L4. The holes HO may expose a top surface of the substrate 100. Each of the holes HO may have a linear or bar shape extending in a second direction D2. The holes HO may be arranged spaced apart from each other along a first direction D1. The holes HO may extend in a third direction D3 and penetrate the first, second, third, and fourth layers L1, L2, L3, and L4.

The holes HO may define sidewalls MSW of the mold structure MS. The sidewalls MSW of the mold structure MS may have a slope relative to the top surface of the substrate 100. For example, the sidewalls MSW of the mold structure MS may be at an angle less than 90° with the top surface of the substrate 100. For another example, the sidewalls MSW of the mold structure MS may be substantially perpendicular to the top surface of the substrate 100.

Each of the first semiconductor layer SL1 may have semiconductor patterns SP defined by the holes HO. For example, the semiconductor pattern SP may be defined by a pair of the holes HO adjacent to each other.

A second semiconductor layer SL2 may be conformally formed on an entire surface of the substrate 100. The second semiconductor layer SL2 may partially fill the holes HO. The second semiconductor layer SL2 may include a semiconductor material. The semiconductor material may be an amorphous semiconductor material or a polycrystalline semiconductor material. The amorphous semiconductor material may be one of amorphous silicon, amorphous germanium, and amorphous silicon-germanium. The polycrystalline semiconductor material may be one of polycrystalline silicon, polycrystalline germanium, and polycrystalline silicon-germanium. The first and second semiconductor layers SL1 and SL2 may have the same composition and crystal structure. For example, the first and second semiconductor layers SL1 and SL2 may include amorphous silicon. For another example, the first and second semiconductor layers SL1 and SL2 may include polycrystalline silicon.

An annealing process may be performed on the first semiconductor layers SL1 and the second semiconductor layer SL2. The annealing of the first semiconductor layers SL1 and the second semiconductor layer SL2 may include irradiating a laser beam (see L of FIG. 3B) onto the second semiconductor layer SL2. The laser beam L may increase temperature of the second semiconductor layer SL2. The second semiconductor layer SL2 may deliver heat to the first semiconductor layers SL1 connected to the second semiconductor layer SL2, and as a result, the first semiconductor layers SL1 may increase in temperature.

The first and second semiconductor layers SL1 and SL2 may be single-crystallized due to their temperature increases. The single crystallization of the first semiconductor layers SL1 and the second semiconductor layer SL2 may include that the second semiconductor layer SL2 is single-crystallized along crystallinity of the substrate 100, and that the first semiconductor layers SL1 are single-crystallized along crystallinity of the second semiconductor layer SL2 that has been single-crystallized. The single crystallization of the first semiconductor layers SL1 and the second semiconductor layer SL2 may give a single crystalline structure to the substrate 100, the first semiconductor layers SL1, and the second semiconductor layer SL2. For example, when the substrate 100 includes single crystalline silicon, the substrate 100, the first semiconductor layers SL1, and the second semiconductor layer SL2 may be single-crystallized into a single crystalline silicon.

Figure 16:
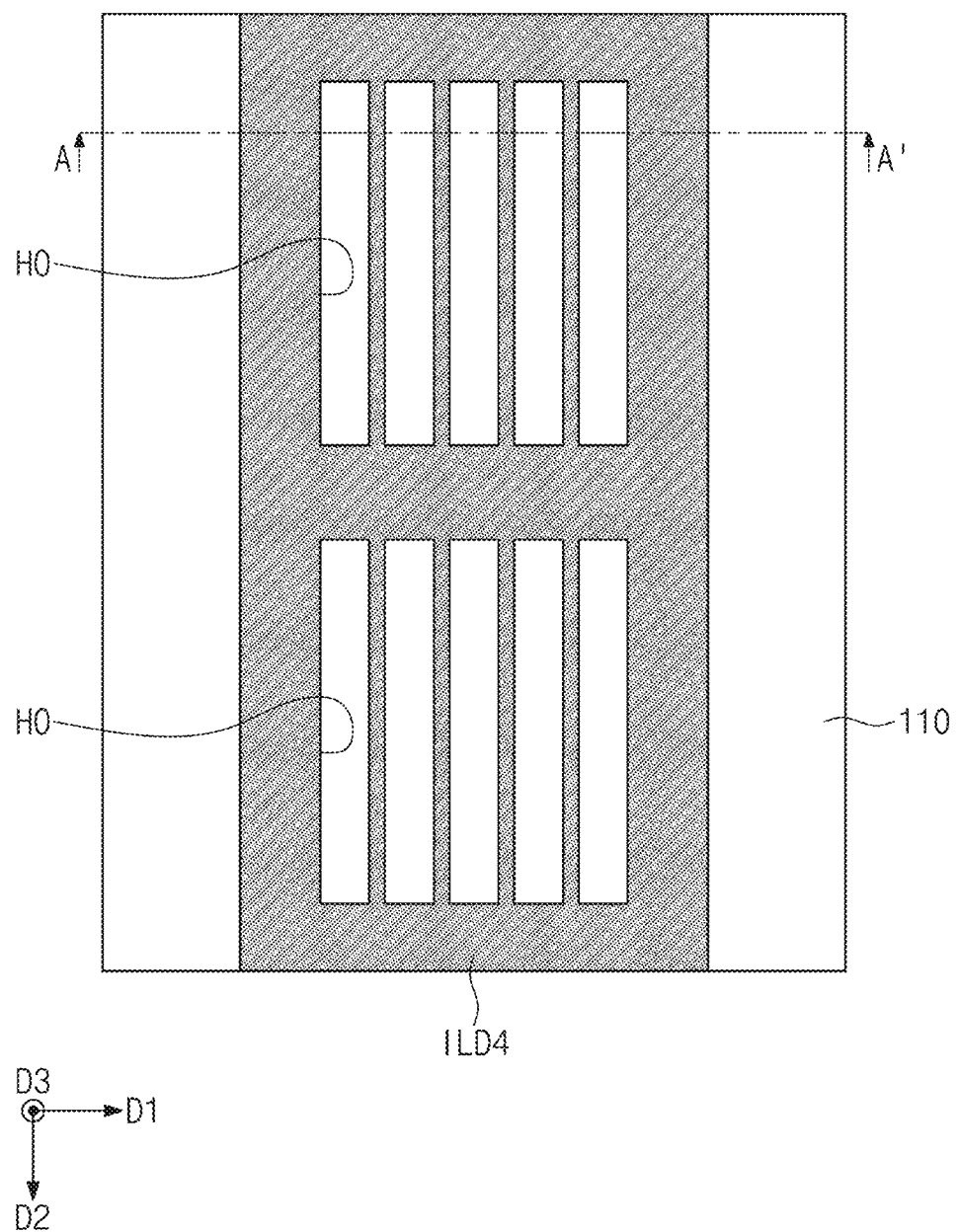
Figure 17:
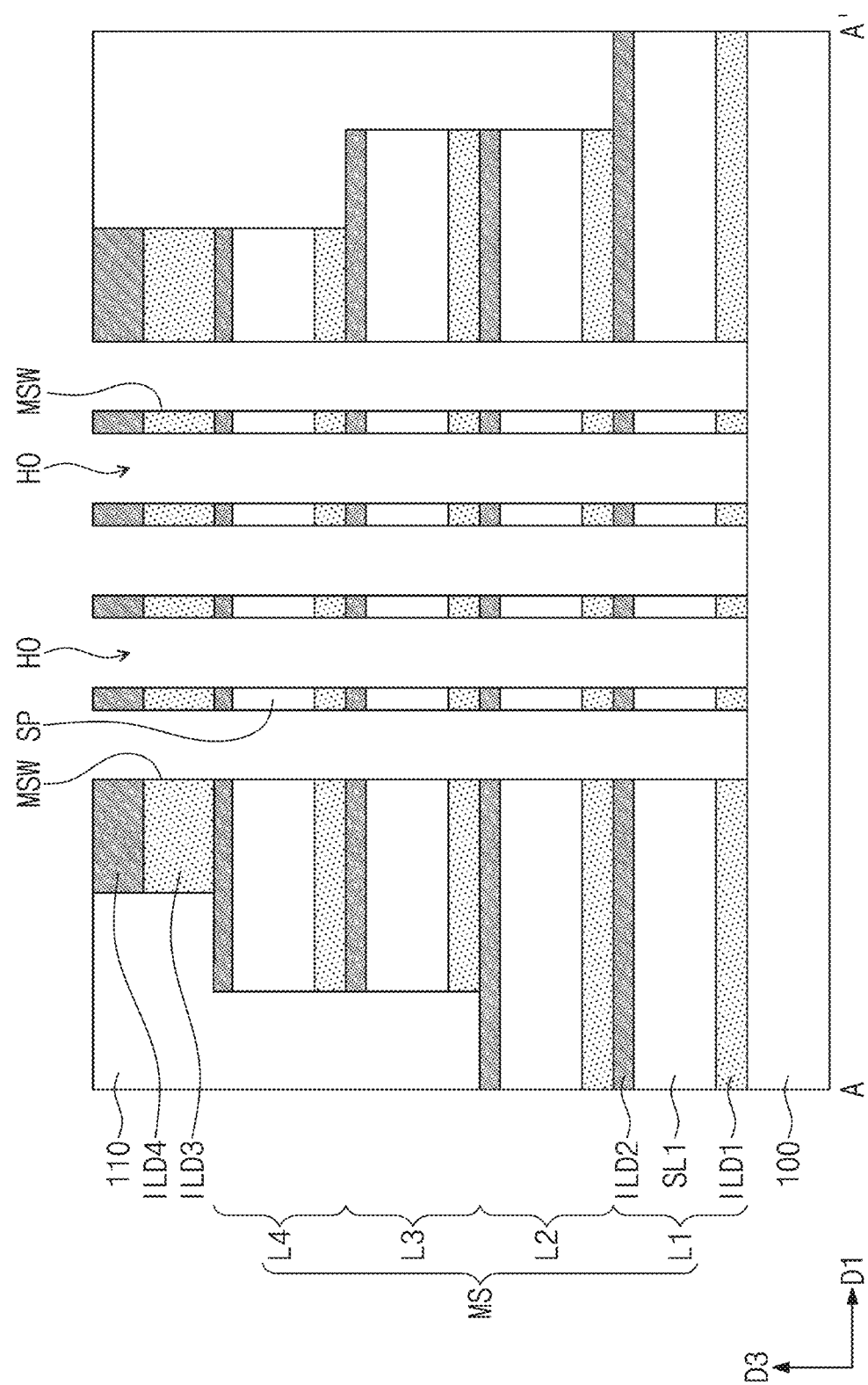

Referring to FIGS. 16 and 17, a wet etching process may be performed to remove the second semiconductor layer SL2. The removal of the second semiconductor layer SL2 may expose the sidewalls MSW of the mold structure MS and the top surface of the substrate 100.

Figure 18:
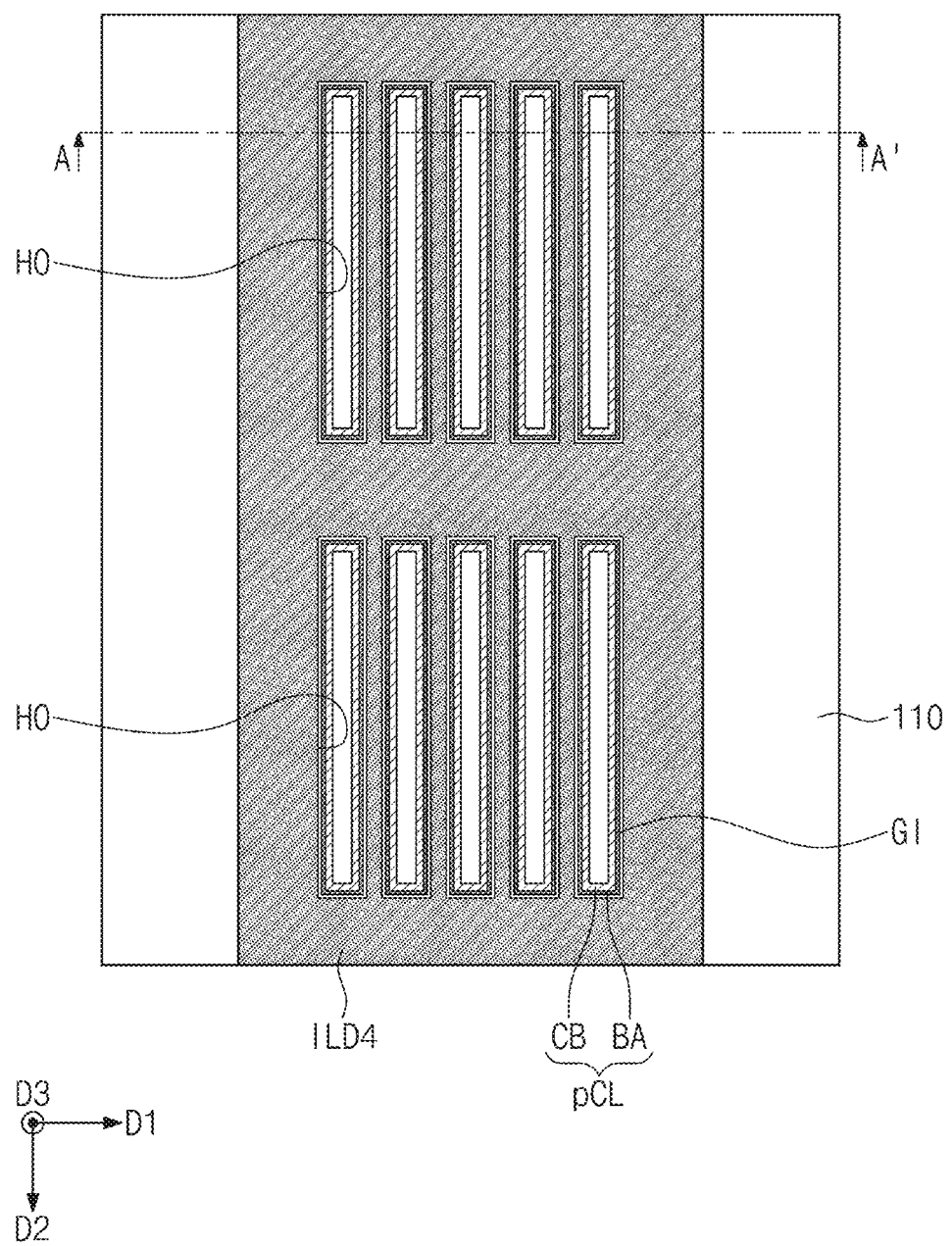
Figure 19:
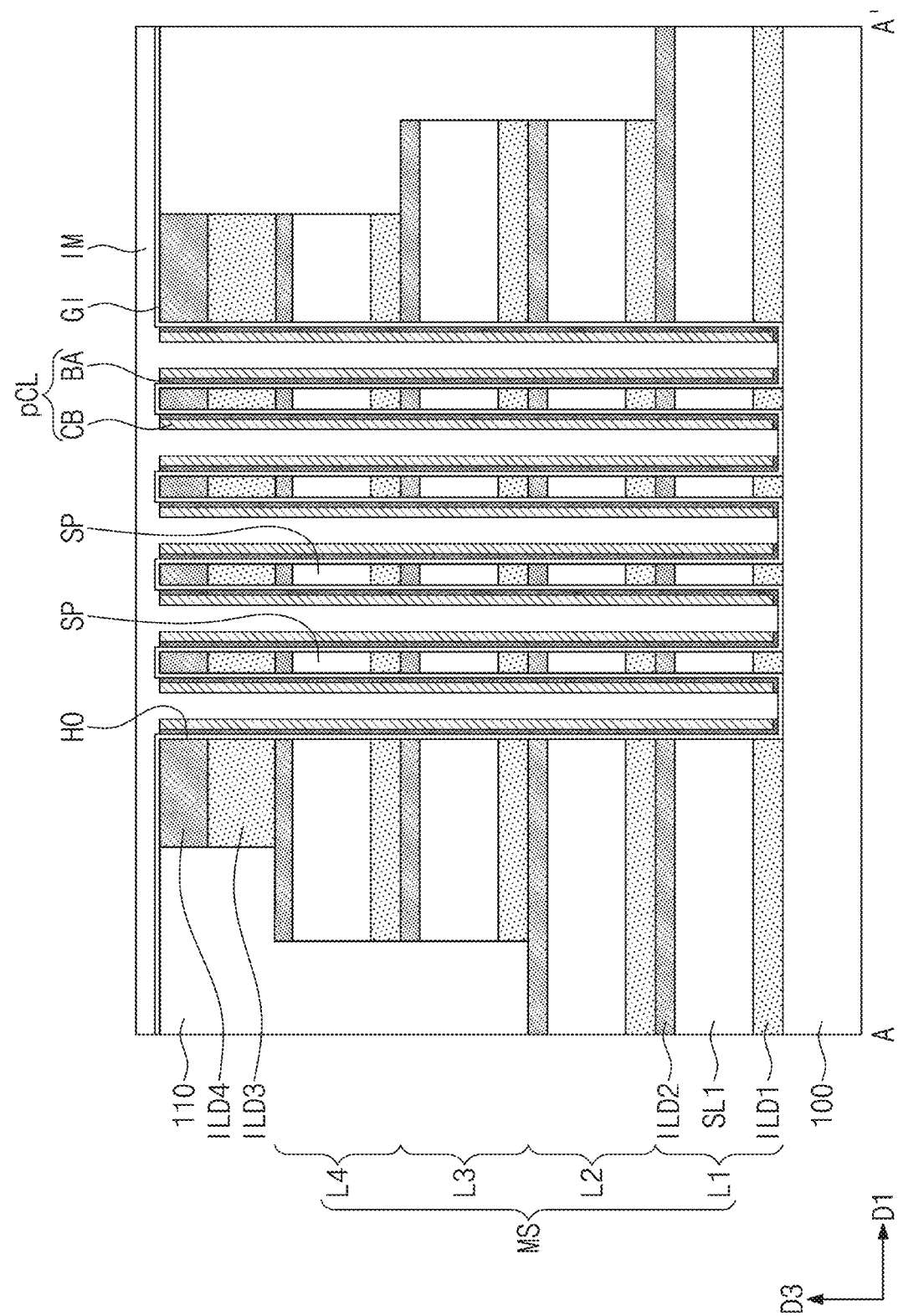

Referring to FIGS. 18 and 19, a gate dielectric layer GI may be conformally formed on the sidewalls MSW of the mold structure MS that are exposed to the holes HO. For example, a high-k dielectric material may be used to conformally form the gate dielectric layer GI.

Preliminary conductive lines pCL may be formed to partially fill the holes HO. The preliminary conductive lines pCL may be formed on the sidewalls MSW of the mold structure MS that are exposed to the holes HO. The formation of the preliminary conductive lines pCL may include conformally forming a barrier layer on the gate dielectric layer GI, conformally forming a conductive layer on the barrier layer, and anisotropically etching the barrier layer and the conductive layer to form a barrier pattern BA and a conductive body CB. The barrier layer may be formed using conductive metal nitride (titanium nitride, tantalum nitride, etc.), and the conductive layer may be formed using metal (tungsten, titanium, tantalum, etc.).

After the preliminary conductive lines pCL are formed, a dielectric material IM may be deposited. The dielectric material IM may be formed to completely fill the holes HO. The dielectric material IM may include one or more of silicon oxide, silicon nitride, and silicon oxynitride.

Figure 20:
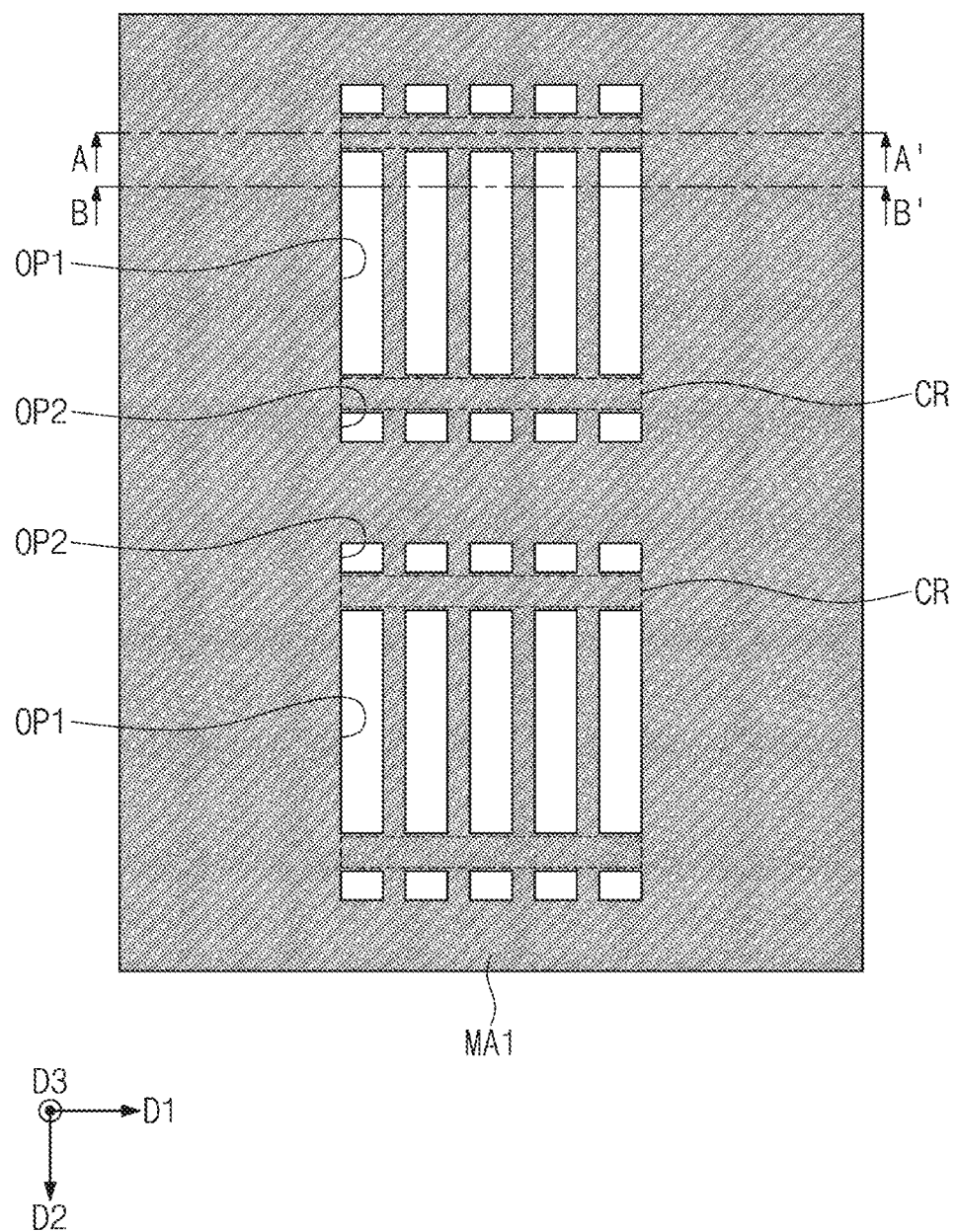
Figure 21A:
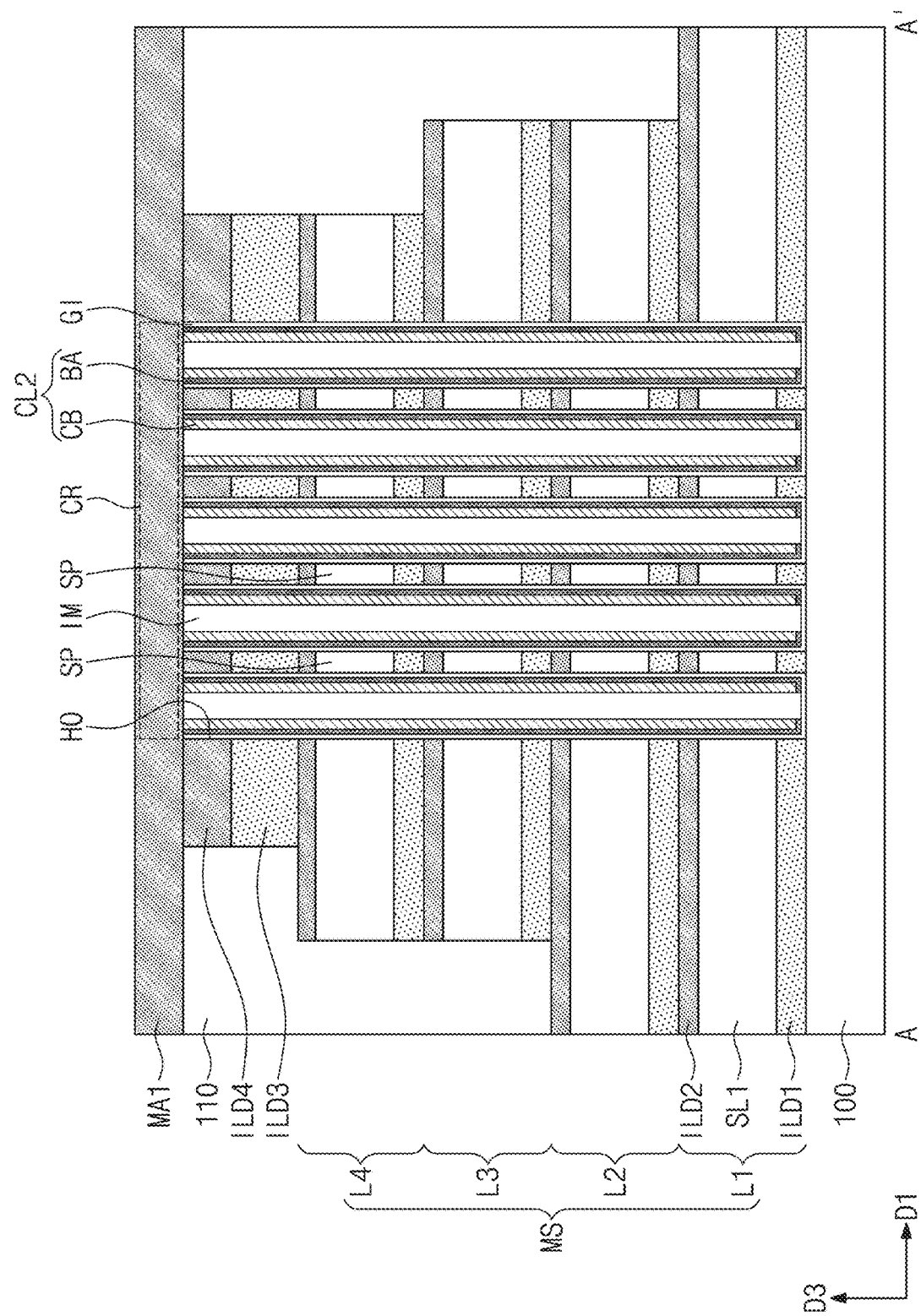
Figure 21B:
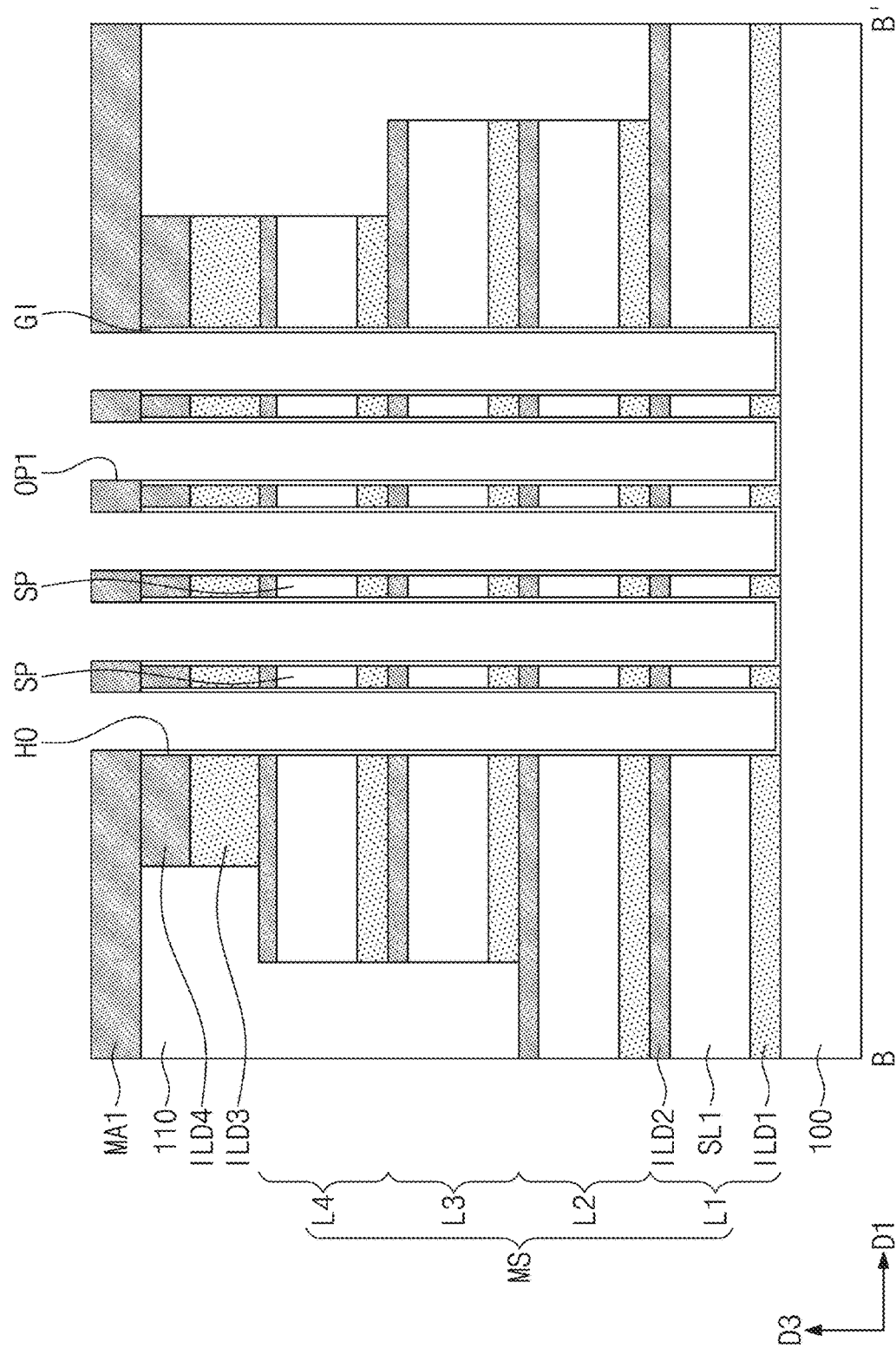
FIGS. 21B, 23B, 25B, 27B, 29B, 31B, and 33B illustrate cross-sectional views taken along line B-B' of FIGS. 20, 22, 24, 26, 28, 30, and 32, respectively.

Referring to FIGS. 20, 21A, and 21B, a planarization process may be performed on the dielectric material IM and the gate dielectric layer GI until the top surfaces of the interlayer dielectric layer 110 and the fourth dielectric layer ILD4 are exposed.

A first mask pattern MA1 including first openings OP1 and second openings OP2 may be formed on the interlayer dielectric layer 110 and the fourth dielectric layer ILD4. When viewed in plan, the first openings OP1 and the second openings OP2 may overlap the holes HO. Each of the first openings OP1 may have a linear or bar shape extending in the second direction D2. The first openings OP1 may be arranged spaced apart from each other along the first direction D1. The second openings OP2 may be arranged spaced apart from each other along the first direction D1. Each of the second openings OP2 may be spaced apart from its adjacent first opening OP1 in the second direction D2 or in an opposite direction to the second direction D2.

The first mask pattern MA1 may include closed regions CR. Each of the closed regions CR may be a portion between the first opening OP1 and the second opening OP2 adjacent to each other. Each of the closed regions CR may extend in the first direction D1. The closed regions CR may define positions where second conductive lines CL2 are formed as discussed below.

A removal process may be performed on the dielectric material IM exposed to the first and second openings OP1 and OP2. The dielectric material IM may be removed by an anisotropic etching process. Accordingly, the dielectric material IM may not be completely removed but may remain below the closed portions CR of the first mask pattern MA1.

The preliminary conductive lines pCL exposed to the first and second openings OP1 and OP2 may be removed to form second conductive lines CL2. The preliminary conductive lines pCL may be removed by an anisotropic etching process. Accordingly, the preliminary conductive lines pCL may not be completely removed but may remain below the closed portions CR of the first mask pattern MA1. The remaining preliminary conductive lines pCL may constitute the second conductive lines CL2. The second conductive lines CL2 may be formed spaced apart from each other by the anisotropic etching process. Each of the second conductive lines CL2 may have a linear shape extending in a vertical direction (e.g., the third direction D3). Alternatively, each of the second conductive lines CL2 may have a linear shape that extends at an angle other than perpendicular to the top surface of the substrate 100. The remaining dielectric material IM may be interposed between a pair of the second conductive lines CL2 adjacent to each other.

Figure 22:
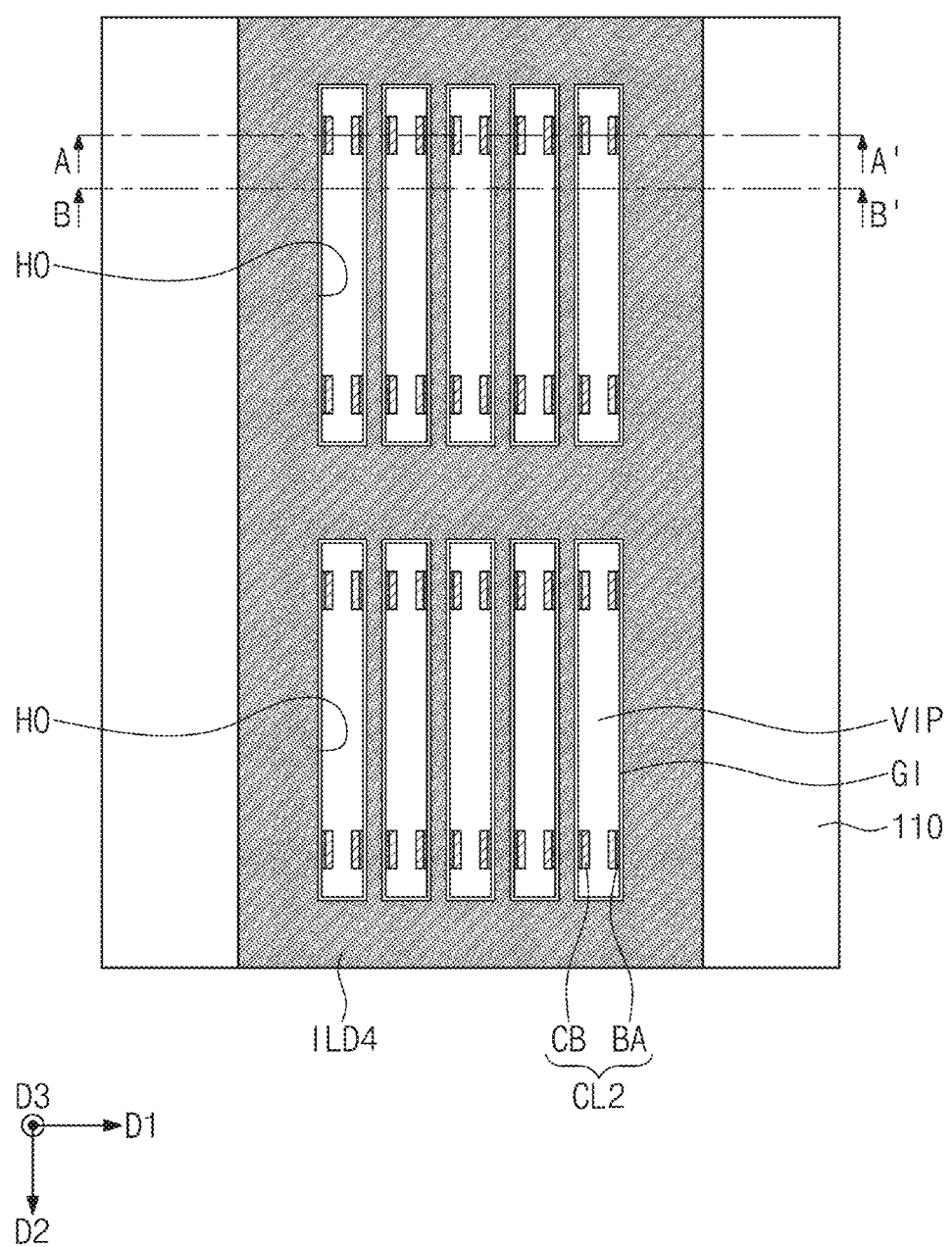
Figure 23A:
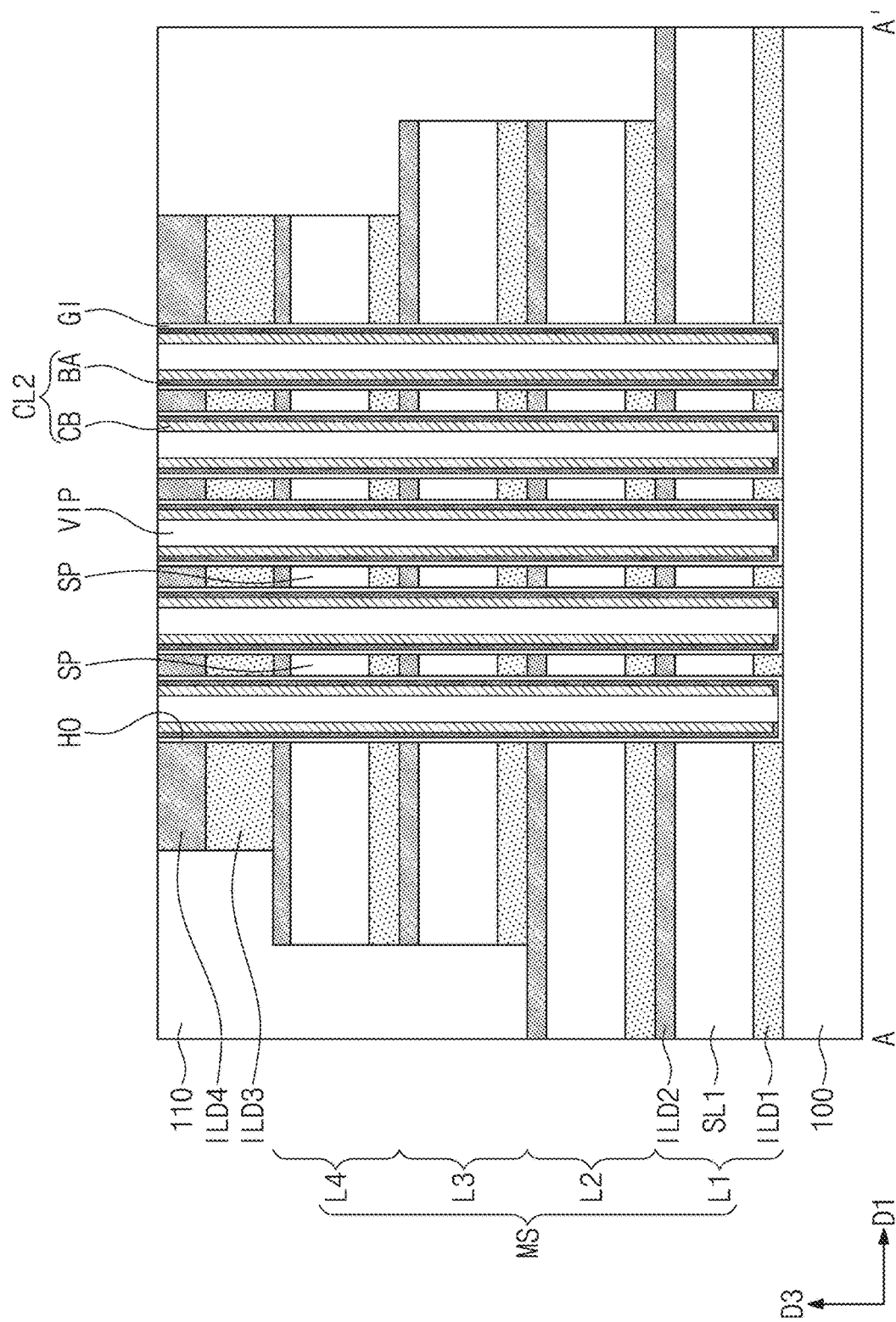
Figure 23B:
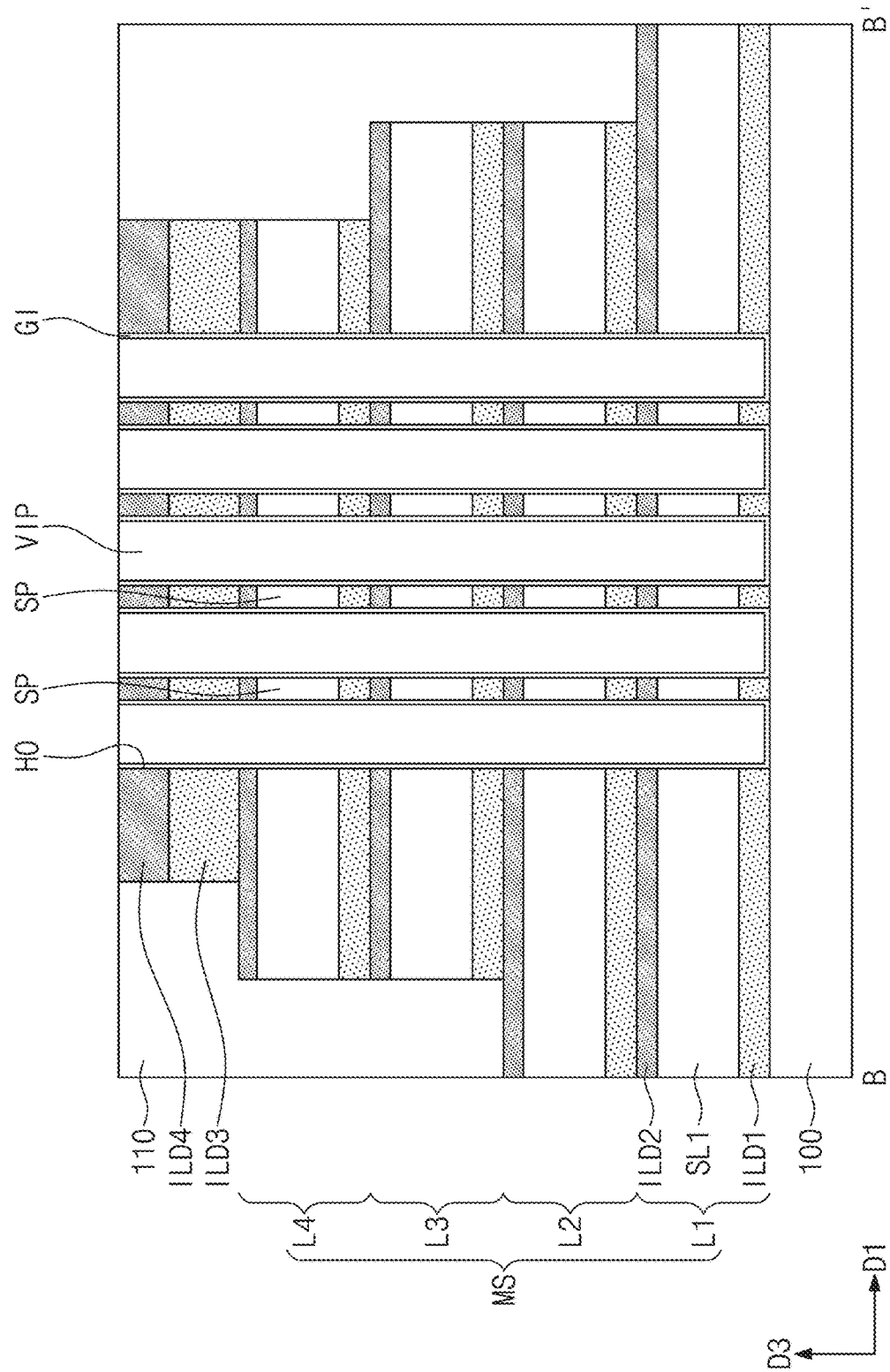
Figure 24:
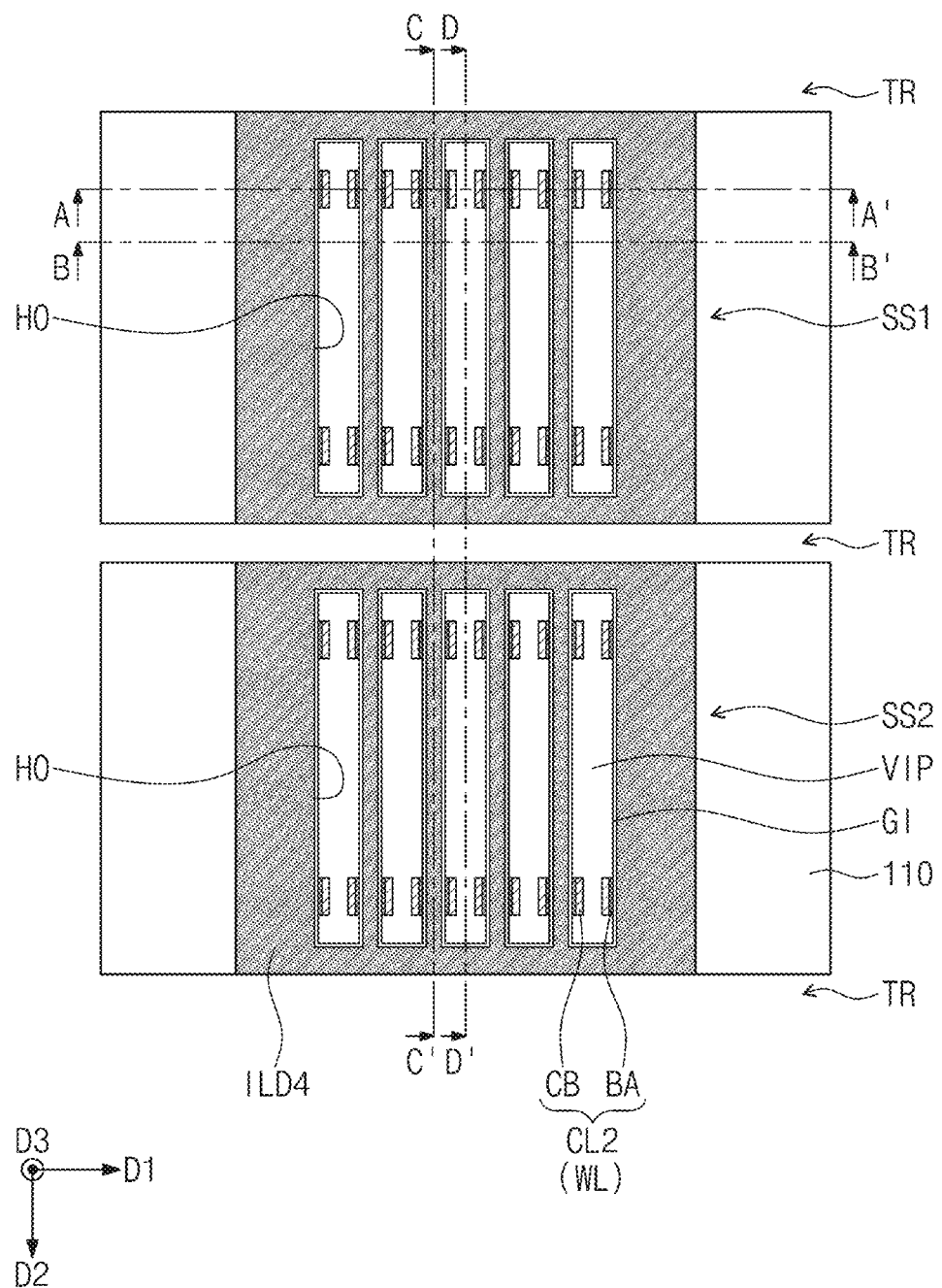
Figure 25B:
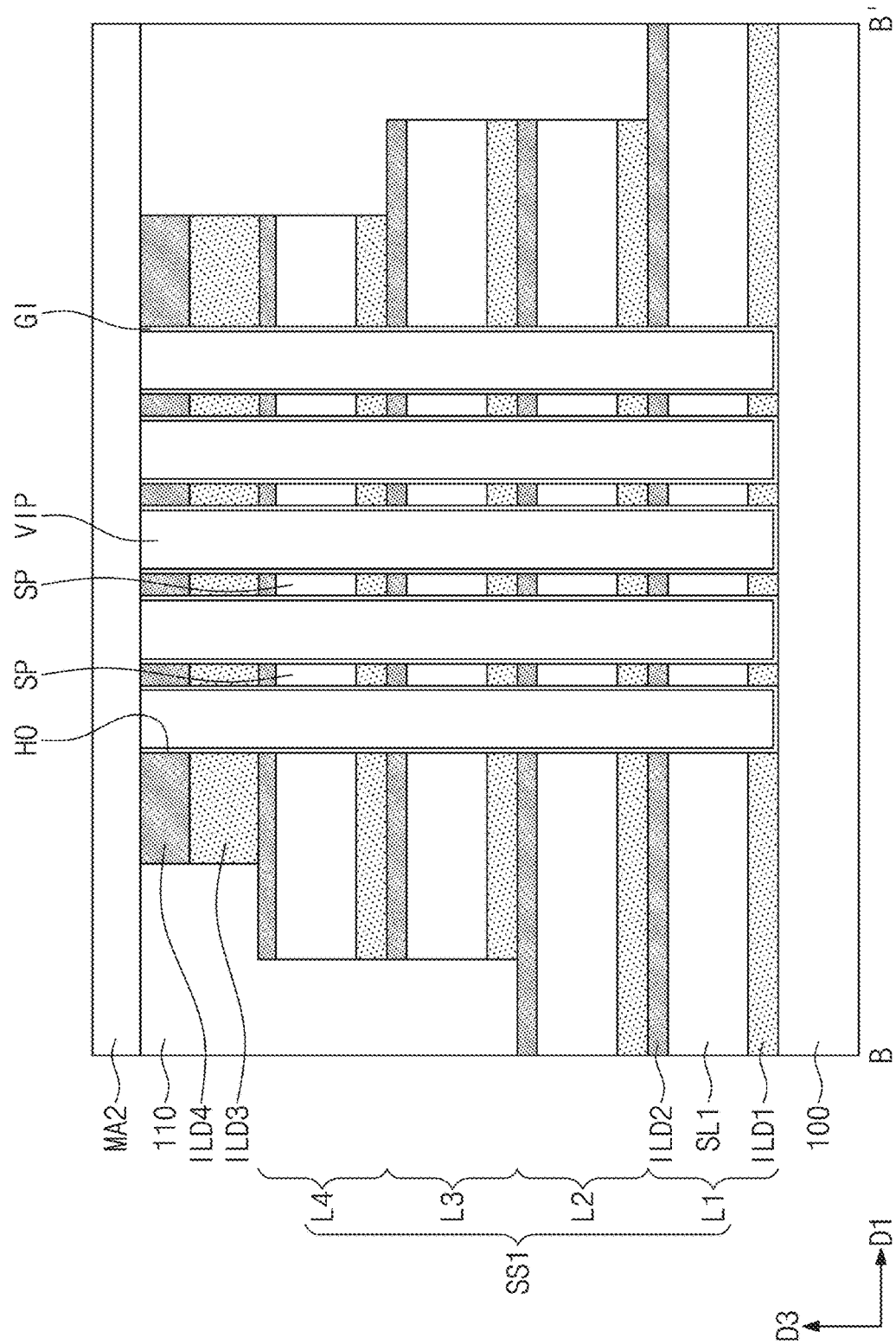
Figure 25D:
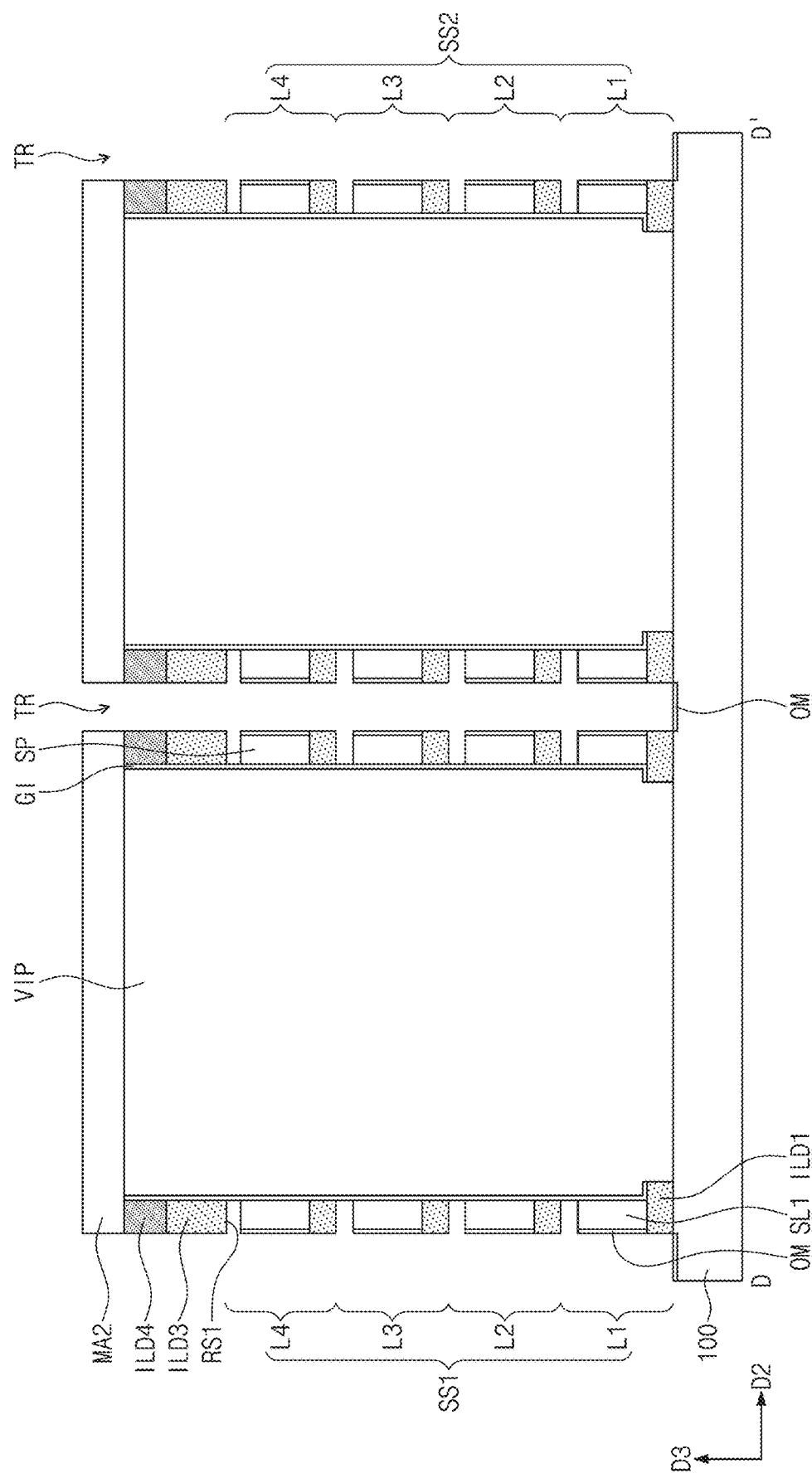
FIGS. 25D, 27D, 29D, 31D, and 33D illustrate cross-sectional views taken along line D-D' of FIGS. 24, 26, 28, 30, and 32, respectively.
Figure 26:
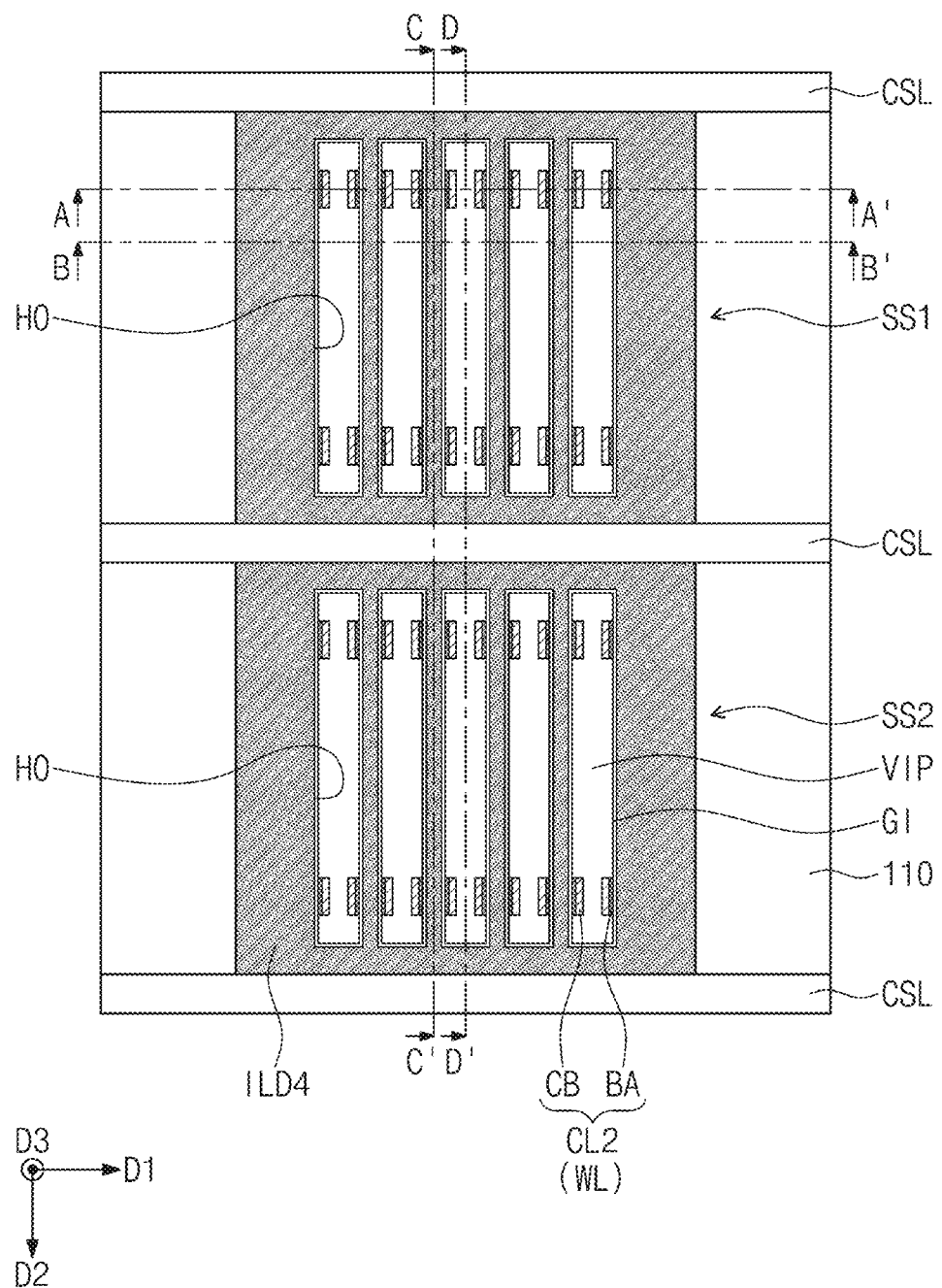
Figure 27A:
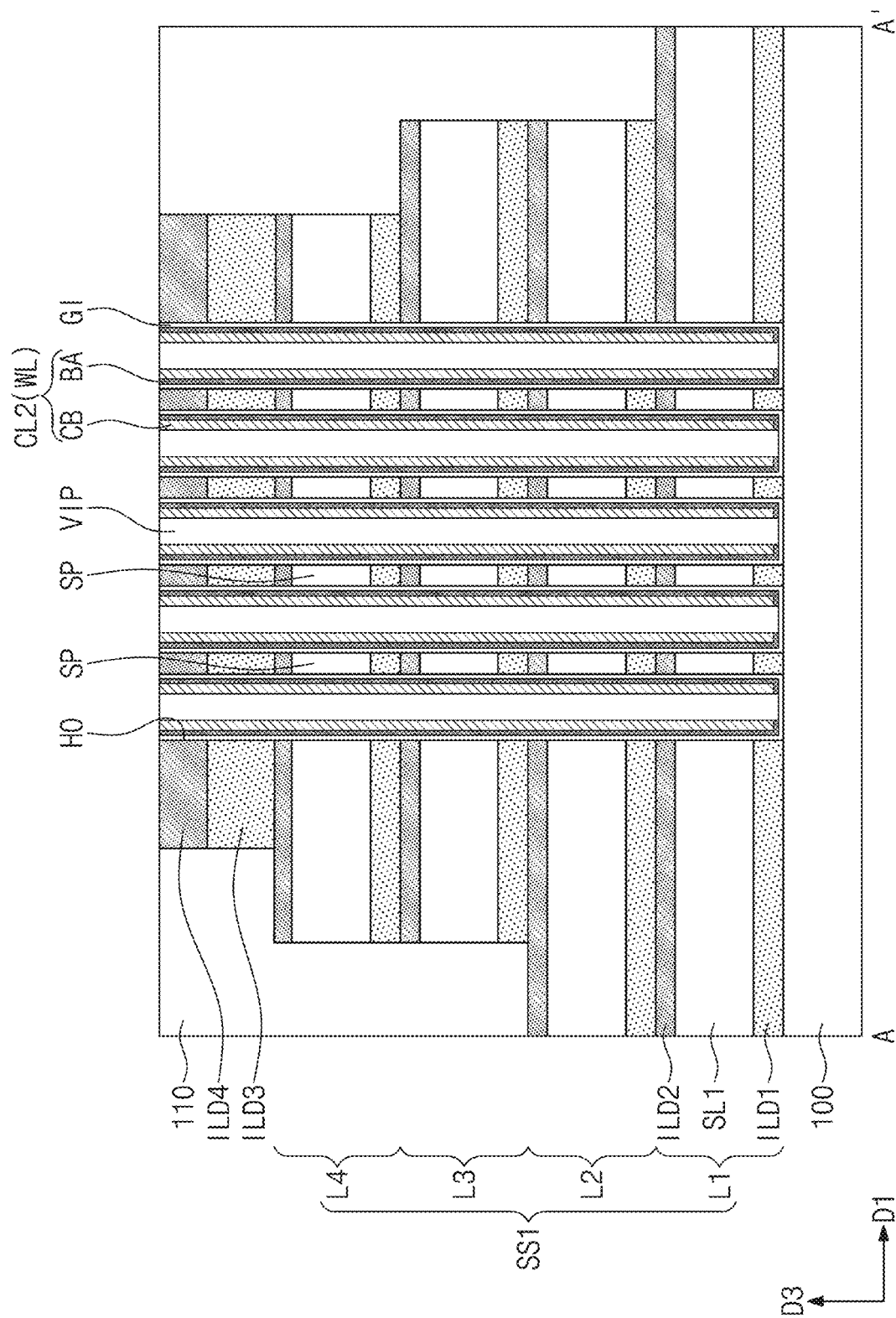
Figure 27B:
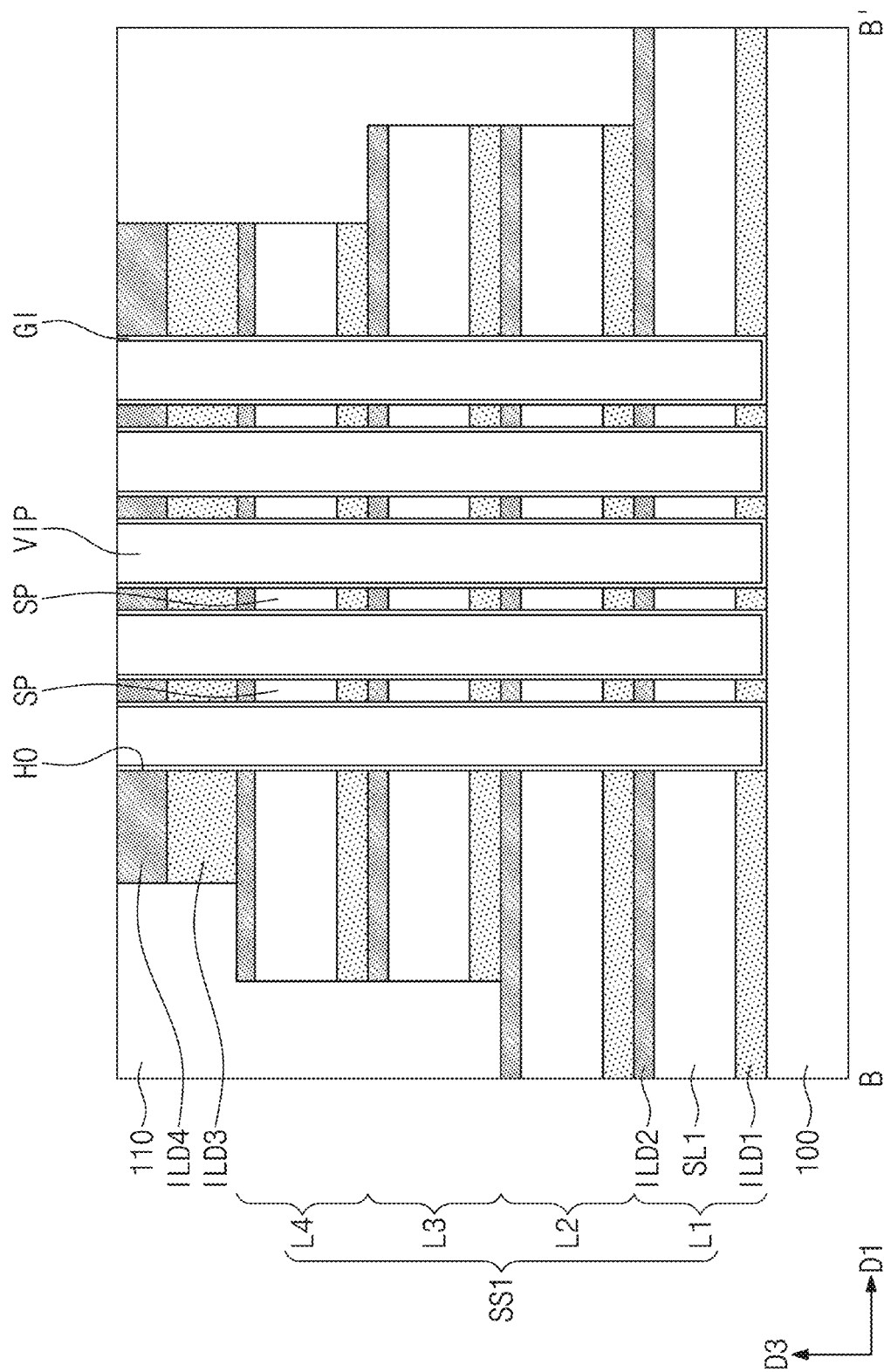
Figure 27C:
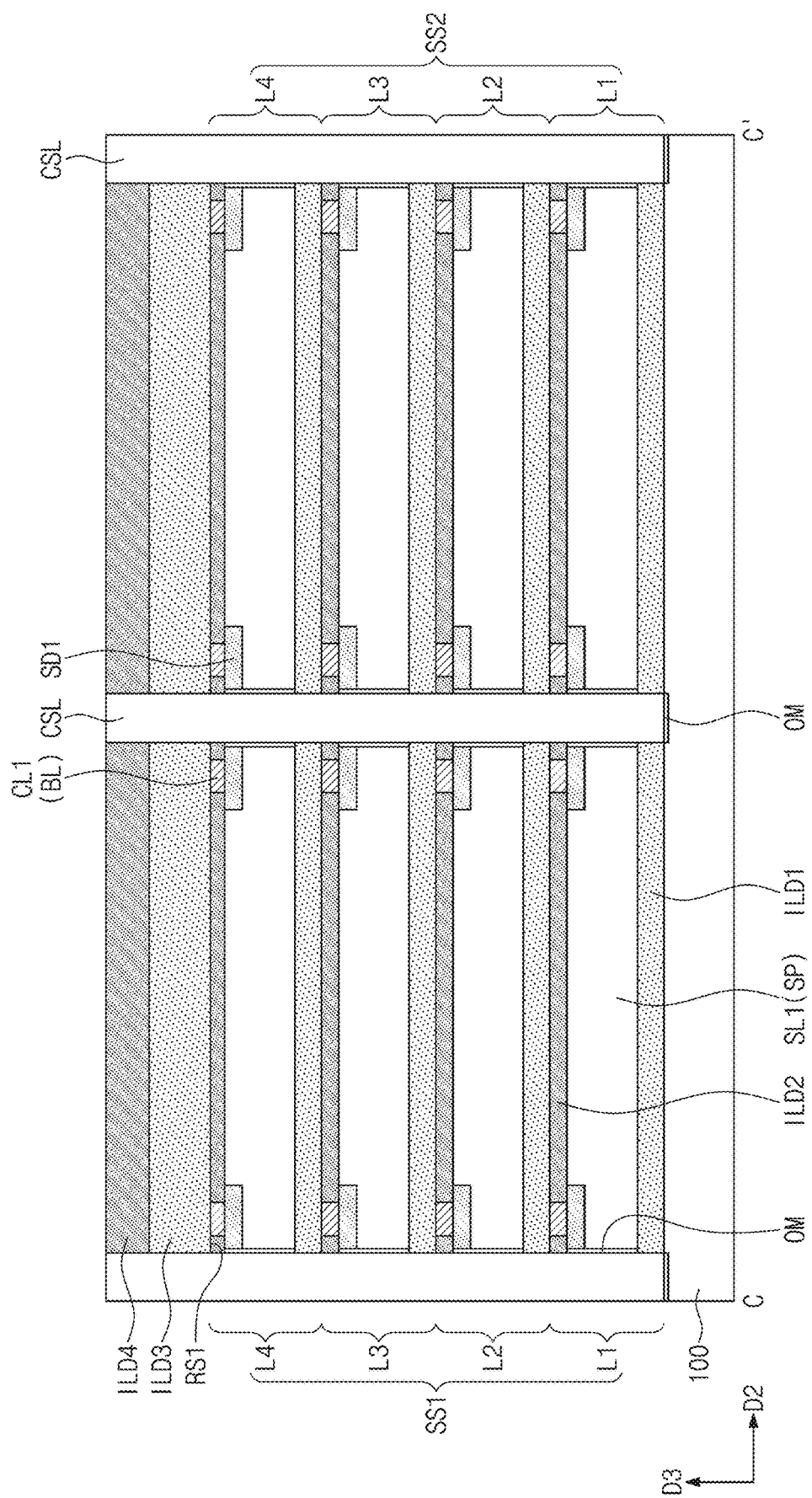
Figure 27D:
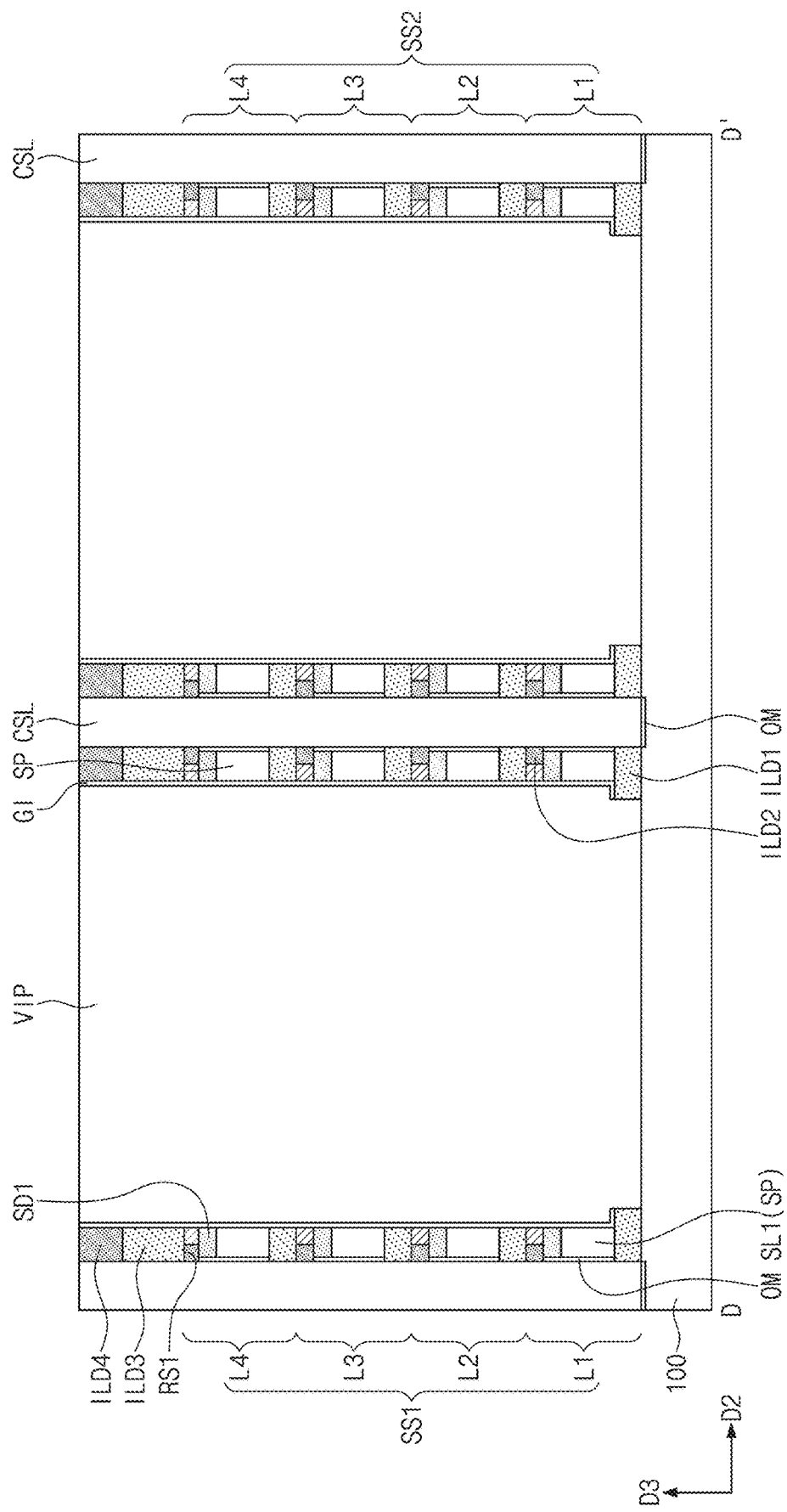
Figure 28:
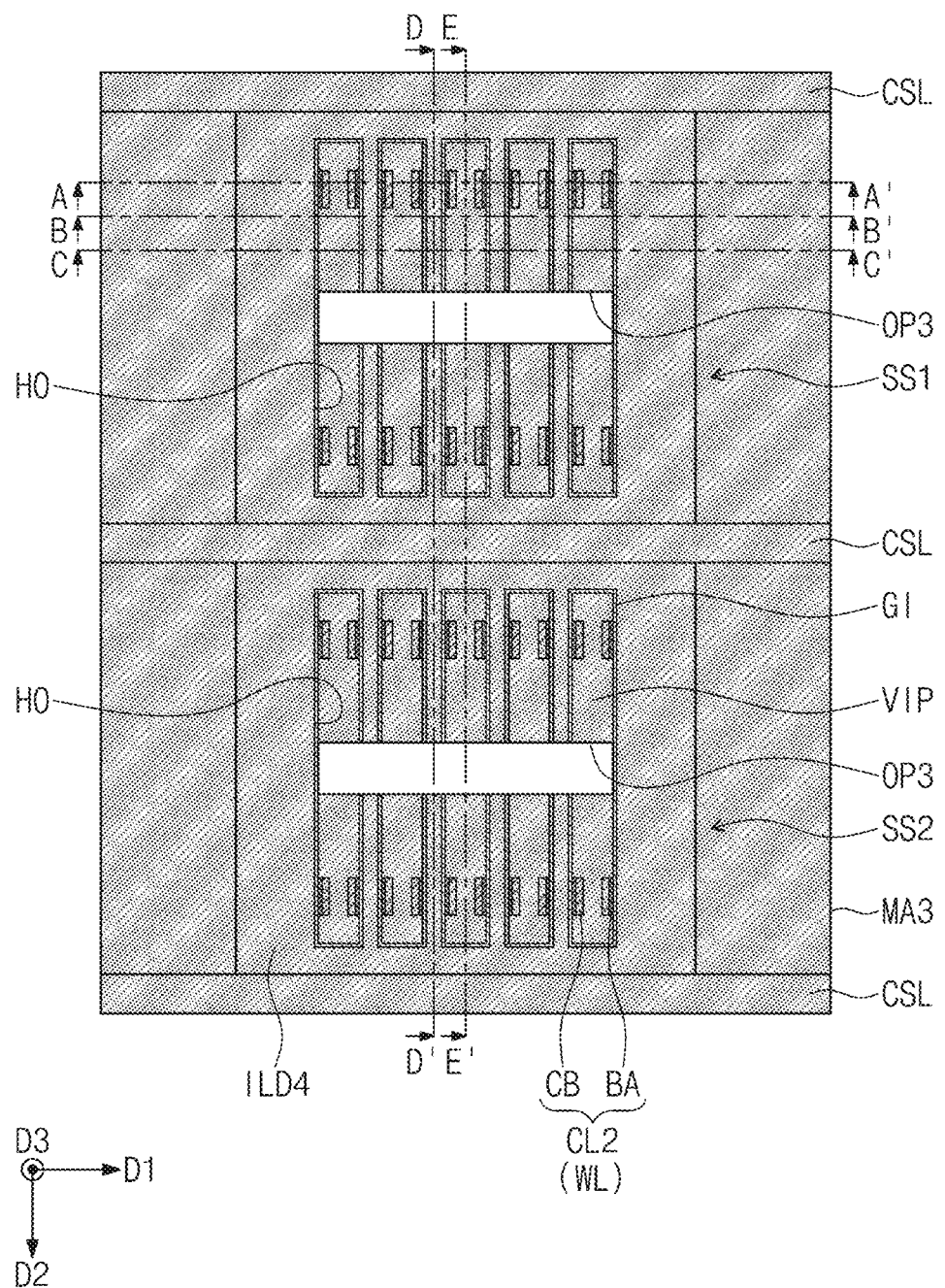

Referring to FIGS. 22, 23A, and 23B, the first mask pattern MA1 may be removed. A dielectric material may be additionally deposited in an empty space of each of the holes HO, such that a vertical dielectric pattern VIP may be formed to fill each of the holes HO. A planarization process may be performed to remove the dielectric material deposited on the interlayer dielectric layer 110 and the fourth dielectric layer ILD4. The additionally deposited dielectric material may include, for example, the same material as that of the remaining dielectric material IM. For another example, the additionally deposited dielectric material may include a different material from that of the remaining dielectric material IM, but the present inventive concepts are not limited thereto.

The vertical dielectric pattern VIP may be interposed between a pair of the semiconductor patterns SP adjacent to each other. The vertical dielectric pattern VIP may be interposed between a pair of the second conductive lines CL2 adjacent to each other.

Referring to FIGS. 24 and 25A to 25D, a second mask pattern MA2 may be formed on the mold structure MS. The second mask pattern MA2 may include linear openings that extend along the first direction D1.

The second mask pattern MA2 may be used as an etching mask to pattern the mold structure MS, which may form a plurality of stack structures SS1 and SS2. For example, the mold structure MS may be patterned to form a first stack structure SS1 and a second stack structure SS2. The patterning process may result in defining trenches TR between the first and second stack structures SS1 and SS2. Each of the trenches TR may partially expose the top surface of the substrate 100. When viewed in plan, each of the trenches TR may have a linear shape extending in the first direction D1.

The trenches TR may expose sidewalls of the first and second stack structures SS1 and SS2. An oxidation process may be performed on the exposed top surface of the substrate 100 and the exposed sidewalls of the first and second stack structures SS1 and SS2, which may form oxidation materials OM. For example, the oxidation materials OM may be partially formed on the semiconductor patterns SP and the substrate 100 that are exposed to the trenches TR.

The second dielectric layers ILD2 exposed to the trenches TR may be selectively etched to form first recesses RS1. The second dielectric layers ILD2 may be etched by an isotropic etching process using an etchant that can selectively etch the second dielectric layers ILD2. The isotropic etching process may cause each of the second dielectric layers ILD2 to have a reduced width in the second direction D2. Each of the first recesses RS1 may be defined by a bottom surface of the first dielectric layer ILD1, a sidewall of the second dielectric layer ILD2, and a top surface of the semiconductor pattern SP.

Referring to FIGS. 26 and 27A to 27D, the semiconductor patterns SP may have upper portions exposed to the trenches TR and the first recesses RS1, and the exposed upper portions of the semiconductor patterns SP may be doped with impurities to form first impurity regions SD1.

First conductive lines CL1 may be formed in the first recesses RS1. Each of the first conductive lines CL1 may be formed to partially fill a corresponding one of the first recesses RS1. The first conductive lines CL1 may be formed on top surfaces of the first impurity regions SD1. Each of the first conductive lines CL1 may have a linear shape extending in the first direction D1. For example, the formation of the first conductive lines CL1 may include forming a conductive layer (e.g., metal) to fill the first recesses RS1, and performing an isotropic etching process to selectively etch the conductive layer.

A dielectric material may be deposited to completely fill the first recesses RS1. The deposited dielectric material may constitute the second dielectric layer ILD2. The second dielectric layer ILD2 may cover opposite sidewalls of the first conductive line CL1.

Common source lines CSL may be formed to fill the trenches TR. The common source line CSL may be interposed between the first and second stack structures SS1 and SS2. Each of the common source lines CSL may have a linear shape extending in the first direction D1.

Referring to FIGS. 28 and 29A to 29E, a third mask pattern MA3 including third openings OP3 may be formed on the first and second stack structures SS1 and SS2. Each of the third openings OP3 may have a linear or bar shape extending in the first direction D1. When viewed in plan, the third openings OP3 may run across the holes HO penetrating the first and second stack structures SS1 and SS2.

The third mask pattern MA3 may be used as an etching mask to etch the first and second stack structures SS1 and SS2. The etching process may result in a plurality of the holes HO penetrating one of the first and second stack structures SS1 and SS2 being brought together into a single hole HO. The hole HO formed by the etching process may expose sidewalls of the semiconductor patterns SP. The hole HO formed by the etching process may expose sidewalls of the vertical dielectric patterns VIP.

The semiconductor patterns SP exposed to the hole HO may be selectively etched to form second recesses RS2. The semiconductor patterns SP may be etched by an isotropic etching process using an etchant that can selectively etch the semiconductor patterns SP. The isotropic etching process may cause each of the semiconductor patterns SP to have a reduced width in the second direction D2. Each of the second recesses RS2 may be defined by a bottom surface of the second dielectric layer ILD2, a sidewall of the semiconductor pattern SP, and a top surface of the first dielectric layer ILD1. The second recess RS2 may lie between a pair of the vertical dielectric patterns VIP adjacent to each other (see FIG. 29C).

The sidewalls of the semiconductor patterns SP exposed to the hole HO and the second recesses RS2 may be doped with impurities to form second impurity regions SD2. In each of the semiconductor patterns SP, a channel region CH may be defined between the first impurity region SD1 and the second impurity region SD2.

Referring to FIGS. 30 and 31A to 31E, a partial etching may be performed on the vertical dielectric patterns VIP and the gate dielectric layers GI exposed to the hole HO and the second recesses RS2. The vertical dielectric patterns VIP and the gate dielectric layers GI may be etched by an isotropic etching process using an etchant that can selectively etch the vertical dielectric patterns VIP and the gate dielectric layers GI. As the vertical dielectric patterns VIP and the gate dielectric layers GI are partially etched, the second recesses RS2 may expand. For example, the second recess RS2 between a pair of neighboring vertical dielectric patterns VIP may have an increased width in the first direction D1 (see FIG. 31C).

A first electrode layer ELL may be conformally formed on the entire surface of the substrate 100. The first electrode layer ELL may partially fill the second recesses RS2. The first electrode layer ELL may directly cover the second impurity regions SD2.

Referring to FIGS. 32 and 33A to 33E, the first electrode layer ELL may be patterned to form first electrodes EL1 filling the second recesses RS2. For example, the formation of the first electrodes EL1 may include forming dielectric patterns to fill the second recesses RS2 and using the dielectric patterns as an etching mask to remove portions of the first electrode layer ELL that are not covered with the dielectric patterns.

An isotropic etching process may be performed on the vertical dielectric patterns VIP and the gate dielectric layers GI exposed to the hole HO, which may form third recesses RS3. The isotropic etching process may continue until the vertical dielectric patterns VIP and the gate dielectric layers GI are removed from between the first electrodes EL1. The isotropic etching process may cause each of the vertical dielectric patterns VIP to have a reduced width in the second direction D2.

Referring back to FIGS. 8, 9, and 10A to 10E, a dielectric layer DL may be conformally formed on the first electrodes EL1. A second electrode EL2 may be formed on the dielectric layer DL such that the hole HO may be completely filled with the second electrode EL2. A planarization process may be performed until a top surface of the third dielectric layer ILD3 is exposed. First and second contacts CNT1 and CNT2 may be formed to be respectively connected to the first and second conductive lines CL1 and CL2.

According to some example embodiments of the present inventive concepts, a three-dimensional semiconductor memory device may include memory cell transistors and data storage elements (e.g., capacitors) that are three-dimensionally stacked on a substrate. This configuration may increase integration of memory devices. A three-dimensional semiconductor memory device according to some example embodiments of the present inventive concepts may be applicable to cryogenic computing performed at a temperature below about 100K.

Although example embodiments of inventive concepts have been discussed with reference to accompanying figures, it will be understood that various changes in form and details may be made therein without departing from the spirit and scope of inventive concepts. It therefore will be understood that the some example embodiments described above are just illustrative but not limitative in all aspects.

What is claimed is:

1. A method of manufacturing a semiconductor device, the method comprising:
   alternately stacking a plurality of dielectric layers and a plurality of first semiconductor layers to form a mold structure on a substrate;
   forming a hole penetrating the mold structure;
   conformally forming on the substrate a second semiconductor layer filling the hole; and
   irradiating a laser onto the second semiconductor layer,
   wherein a sidewall of the mold structure being defined by the hole,
   wherein the sidewall has a slope relative to a top surface of the substrate,
   wherein forming the second semiconductor layer comprises
      forming on the substrate a first segment of the second semiconductor layer, and
      forming on the sidewall of the mold structure a second segment of the second semiconductor layer, and
   wherein the second segment has a slope relative to the top surface of the substrate.

2. The method of claim 1, wherein forming the hole exposes the top surface of the substrate.

3. The method of claim 1, wherein the irradiating the laser comprises:
   single-crystallizing the second semiconductor layer along crystallinity of the substrate; and
   single-crystallizing the first semiconductor layers along crystallinity of the second semiconductor layer that has been single-crystallized.

4. The method of claim 3, wherein
   the single-crystallizing the second semiconductor layer comprises converting the second semiconductor layer from amorphous into single crystalline, and
   the single-crystallizing the first semiconductor layers comprises converting the first semiconductor layer from amorphous into single crystalline.

5. The method of claim 4, wherein the substrate includes a single crystalline semiconductor material.

6. The method of claim 1, wherein irradiating the laser comprises:
   causing the laser to increase temperature of the second semiconductor layer; and
   providing the first semiconductor layers with heat from the second semiconductor layer.

7. The method of claim 1, wherein forming the second semiconductor layer comprises allowing the second semiconductor layer to cover the sidewall of the mold structure.

8. A method of manufacturing a semiconductor device, the method comprising:
   forming on a substrate a mold structure including a dielectric layer and a first semiconductor layer;
   forming a hole penetrating the mold structure;
   conformally forming on the substrate a second semiconductor layer filling the hole; and
   irradiating a laser onto the second semiconductor layer,
   wherein forming the hole comprises exposing a top surface of the substrate,
   wherein a sidewall of the mold structure being defined by the hole,
   wherein the sidewall has a slope relative to the top surface of the substrate,
   wherein forming the second semiconductor layer comprises
      forming on the substrate a first segment of the second semiconductor layer, and
      forming on the sidewall of the mold structure a second segment of the second semiconductor layer, and
   wherein the second segment has a slope relative to the top surface of the substrate.

9. The method of claim 8, further comprising removing the second semiconductor layer.

10. The method of claim 9, wherein removing the second semiconductor layer comprises performing a wet etching process to remove the second semiconductor layer.

11. The method of claim 8, wherein irradiating the laser comprises:
    causing the laser to increase temperature of the second semiconductor layer; and
    providing the first semiconductor layer with heat from the second semiconductor layer.

12. A method of manufacturing a semiconductor device, the method comprising:
    stacking a plurality of dielectric layers and a plurality of first semiconductor layers to form a mold structure on a substrate;
    forming a hole penetrating the mold structure, wherein forming the hole comprises
       forming a sidewall of the mold structure, the sidewall being defined by the hole, and
       forming a semiconductor pattern on each of the first semiconductor layers,
    the semiconductor pattern extending in a first direction;
    forming on the substrate a second semiconductor layer filling the hole;
    irradiating a laser onto the second semiconductor layer;
    forming a first conductive line on the sidewall of the mold structure;
    forming on the semiconductor pattern a second conductive line that extends in a second direction intersecting the first direction; and
    forming a data storage element connected to the semiconductor pattern.

13. The method of claim 12, wherein the semiconductor pattern comprises:
    a first impurity region connected to the second conductive line; and
    a second impurity region connected to the data storage element.

14. The method of claim 12, wherein forming the first conductive line comprises:
    forming a preliminary conductive line on the sidewall of the mold structure;
    forming on the mold structure a mask pattern including an opening; and
    removing the preliminary conductive line exposed to the opening.

15. The method of claim 14, wherein forming the preliminary conductive line comprises:
    conformally forming a barrier layer on the sidewall of the mold structure;

conformally forming a conductive layer on the barrier layer; and etching the barrier layer and the conductive layer.

16. The method of claim 12, further comprising forming a second dielectric layer completely filling the hole.

17. The method of claim 16, further comprising performing a wet etching process to remove the second semiconductor layer and the second dielectric layer.

18. The method of claim 16, wherein irradiating the laser comprises liquefying the second semiconductor layer.

* * * * *